United States Patent [19]
Abramovitch et al.

[11] Patent Number: 5,909,661
[45] Date of Patent: Jun. 1, 1999

[54] METHOD AND APPARATUS FOR DECOMPOSING DRIVE ERROR SIGNAL NOISE SOURCES

[75] Inventors: Daniel Y. Abramovitch, Palo Alto; Terril N. Hurst, Fremont; Richard H. Henze, San Carlos, all of Calif.

[73] Assignee: Hewlett-Packard Company, Palo Alto, Calif.

[21] Appl. No.: 08/866,367

[22] Filed: May 30, 1997

[51] Int. Cl.[6] .................................................. G06F 15/00
[52] U.S. Cl. ...................... 702/191; 702/190; 369/44.27; 360/77.04
[58] Field of Search .................................... 364/572, 148, 364/574; 369/44.29–35; 702/190, 191; 360/77.04

[56] References Cited

U.S. PATENT DOCUMENTS 5,663,847  9/1997  Abramovitch ........................ 360/77.02

OTHER PUBLICATIONS

Alexei H. Sacks, Marc Bodson and William Messner, "Advanced Methods for Repeatable Runout Compensation", IEEE Transactions on Magnetics, vol. 31, No. 2, Mar. 1995, pp. 1031–1036.

Marc Bodson, Alexei Sacks, and Pradeep Khosla, "Harmonic Generation in Adaptive Feedforward Cancellation Schemes", IEEE Transactions on Automatic Control, vol. 39, No. 9, Sep., 1994, pp. 1939–1944.

Jeffrey S. McAllister, "The Effect of Disk Platter Resonances on Track Misregistration in 3.5 inch Disk Drives", IEEE Transactions on Magnetics, vol. 32, No. 3, May, 1996.

Jeffrey S. McAllister, "Characterization of Disk Vibrations on Aluminum and Alternate Substrates", Hewlett Packard Company, Technical Reports. No date.

Jeffrey McAllister, "Disk Flutter: Causes and Potential Cures", Data Storage, May/Jun., 1997, pp. 29–34.

Daniel Y. Abramovitch, "Rejecting Rotational Disturbances on Small Disk Drives Using Rotational Accelerometers", Proceedings of the 1996 IFAC World Congress in San Francisco, Jul., 1996, pp. 1–6.

Daniel Y. Abramovitch, Feei Wang, Gene Franklin, "Dis Drive Pivot Nonelinearity Modeling Part I: Frequency Domain". No date.

Feei Wang, Terril Hurst, Daniel Abramovitch, Gene Franklin, Disk Drive Pivot Nonlinearity Modeling Part II: Time Domain. No date.

(List continued on next page.)

*Primary Examiner*—John Barlow
*Assistant Examiner*—Kamini S. Shah

[57] ABSTRACT

A process and apparatus is described to break down the Position Error Signal (PES) of a magnetic or optical disk or tape drive to its contributing components. (In the case of the optical disk drive, the method is actually two different PESs, Focus Error Signal (FES) and Tracking Error Signal (TES).) This method is based on three concepts: an understanding of how Bode's Integral Theorem ties into noise measurements, a measurement methodology that allows for the isolation of individual noise sources, and a system model that allows these sources to be recombined to form the drive's Position Error Signal. The method measures frequency response functions and output power spectra of each servo system element. Each input noise spectrum can then be inferred and applied to the closed loop model to determine its effect on the PES uncertainty. The method allows the user to identify and rank the most critical noise sources in the positioning mechanism of a drive. This allows for optimization of the drive positioning control loop(s) by suitable design choices. Such choices may include—but are not limited to—optimization of the position encoding on the data storage surface (such as groove dimensions in an optical drive), optimization of the position signal detection method (such as the demodulation method on a magnetic disk or tape drive), and optimization of the actuator design. Such optimization is far more difficult without this invention because it is very difficult to identify which improvements are most helpful.

16 Claims, 47 Drawing Sheets

OTHER PUBLICATIONS

Stephen Boyd and C. A. Desoer, "Subharmonic Functions and Performance Bounds on Linear Time–Invariant Feedback Systems", IMA Journal of Mathematicl Control and Information (1985) 2, pp. 153–170.

C. Mohtadi, "Bode's Integral Theorem for Discrete–Time systems", IEEE Proceedings, vol. 137, Pt. D, No. 2, Mar. 1990, pp. 57–66.

G. James, R. C. James and D. Van Nostrand Co., "Random Prcesses and Stochastic Systems", Kalman Filtering Theory and Practice, pp. 55–97. No date.

William A. Gardner, Introduction to Random Processes With Applications to Signals and Systems (Spectral Density), pp. 199–279. No date.

Julius S. Bendat, Allan G. Peirsol, Measurement and analysis of Random Data, Chapter 3–Mathematical Theory for Analyzing Random Data, pp. 57–105. No date.

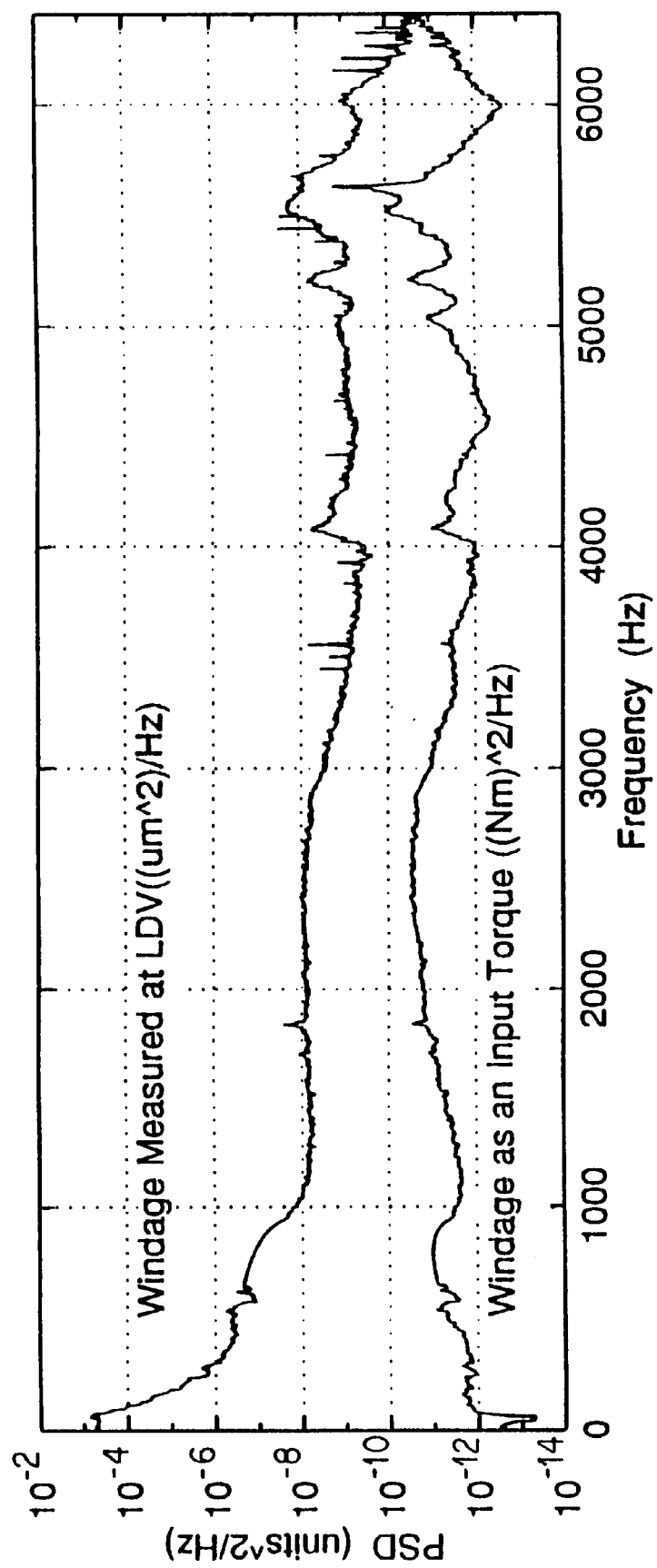

METHOD AND APPARATUS FOR DECOMPOSING DRIVE ERROR SIGNAL NOISE SOURCES

BACKGROUND OF THE INVENTION

1. Field of the Invention

The present invention relates to data storage devices and, more particularly, to identifying, isolating and reducing noise sources therein.

2. Description of the Related Art

Modern data storage devices (e.g., magnetic or optical disk or tape drives) are sophisticated devices having many possible sources of error signal noise sources. As data storage densities increase, it is becoming increasingly difficult to measure noise generated by these sources. Yet these measurements are important to make because they can be used to rank the noise sources and thereby prioritize design areas that would be most fruitful in the quest to design new generations of even greater density storage devices.

In general, dynamic system measurements can be performed in both time and frequency domains. Frequency domain measurements have proven to be particularly suited to this task.

There is a considerable literature describing making frequency domain measurements of dynamic systems. Good reference texts include: J. S. Bendat and A. G. Piersol, Random Data: Analysis and Measurement Procedures, New York, N.Y., John Wiley & Sons, second ed., 1986; A. V. Oppenheim and R. W. Schafer, Digital Signal Processing, Englewood Cliffs, N.J., Prentice Hall, 1970 (pages 532–574); L. Ljung, System Identification: Theory for the User, Prentice-Hall Information and System Sciences Series, Englewood Cliffs, N.J. 07632, Prentice-Hall, 1987 (pages 141–168); and G. F. Franklin, J. D. Powell, and M. L. Workman, Digital Control of Dynamic Systems, Menlo Park, Calif., Addison-Wesley, second ed., 1990 (pages 353–366, 805–816); as well as papers by P. L. Lin and Y. C. Wu, "Identification of Multi-input Multi Output Linear Systems from Frequency Response Data," Transactions of the ASME: Journal of Dynamic Systems, Measurements and Control, vol. 104, pp. 58–64, March 1982. The techniques are common enough so that they are in various products including instruments made by such companies as Hewlett-Packard (see, R. C. Blackham, J. A. Vasil, E. S. Atkinson, and R. W. Potter, "Measurement Modes and Digital Demodulation for a Low-frequency Analyzer," Hewlett-Packard Journal, vol. 38, pp. 17–25, January 1987; J. S. Epstein, G. R. Engel, D. R. Hiller, J. Glen L. Purdy, B. C. Hoog, and E. J. Wicklund, "Hardware Design for a Dynamic Signal Analyzer," Hewlett-Packard Journal, vol. 35, pp. 12–17, December 1984; Hewlett-Packard, Control System Development Using Dynamic Signal Analyzers: Application Note 243-2, 1984; Hewlett-Packard, HP 3563A Control Systems Analyzer, 1990; and Bruel & Kjaer, Multichannel Analysis System Type 3550, 1991) and software packages such as Matlab from the Mathworks (see L. Ljung, System Identification Toolbox for Use with Matlab, The Mathworks, Inc., 24 Prime Park Way, Natick, Mass. 01760, May 1995, 3rd Printing) or C-code included with textbooks such as P. M. Embree, C Algorithms for Real-Time DSP, Upper Saddle River, N.J. 07458, Prentice Hall PTR, 1995 (pages 186–193).

Furthermore, the filtering of stochastic processes is a well known art in both the fields of control and signal processing. This understanding forms the basis for all of the techniques which minimize the mean squared error of signals. It is commonly found in software such as Matlab from the Mathworks (see The Mathworks, Inc., 24 Prime Park Way, Natick, Mass. 01760, Matlab: Signal Processing Toolbox Users Guide, version 4 ed., December 1996 (pages 3–5–3–24) and such textbooks as M. S. Grewal and A. P. Andrews, Kalman Filtering: Theory and Practice, Prentice Hall Information and System Sciences Series, Englewood Cliffs, N.J. 07632, Prentice Hall, 1993 (pages 55–105). Some useful tutorials on these very simple concepts are in W. A. Gardner, Introduction to Random Processes with Applications to Signals and Systems, New York, N.Y., MacMillan Publishing Company, 1986 (pages 198–226 and 260–279) and in J. S. Bendat and A. G. Piersol, Random Data: Analysis and Measurement Procedures, New York, N.Y., John Wiley & Sons, second ed., 1986 (pages 56–105).

To briefly summarize, much of the useful work done in filtering makes use of special properties of Gaussian random processes. They have the property that if a signal, x, is filtered by a linear system, H, as shown in FIG. 2, then the output, y is also a Gaussian random process. If the process also has a property known as stationarity, then the Fourier Transform of the processes autocorrelation function exists. This is critical for filtering analyses because, in the Fourier transform domain, the Power Spectral Density (PSD) of y is given by $$S_y = |H|^2 S_x \qquad (1)$$

The fact that one PSD can be obtained by filtering another PSD through some magnitude squared filter becomes invaluable for noise analysis, because noises can often be characterized and measured in terms of their PSDs. See, W. A. Gardner, Introduction to Random Processes with Applications to Signals and Systems, New York, N.Y., MacMillan Publishing Company, 1986; J. S. Bendat and A. G. Piersol, Random Data: Analysis and Measurement Procedures, New York, N.Y., John Wiley & Sons, second ed., 1986.

Bode's Integral Theorem (W. Bode, Network Analysis and Feedback Amplifier Design New York, Van Nostrand, 1945) is known to the art of electronic circuits and to the art of feedback control. The rest of the analysis of noise signals in storage devices is largely ad hoc. Also, as most of these signal processing algorithms are more concerned with optimizing a loop given a certain amount of noise than in actually decomposing the noise sources, there is no literature on a systematic method for the latter.

What is missing in the prior art is a unification of all these concepts, that takes the measurement process, the filtering process, and the understanding of Bode's Integral Theorem to yield a unified method of decomposing noise sources in a feedback control loop.

Thus, it can be seen that inadequate noise measurement techniques impose data storage density limits upon data storage devices, and hinder the use of these devices in many applications.

Therefore, there is an unresolved need for a noise measurement technique that can improve the design of data storage devices by identifying sources of noise within a device, and hence identify design areas to emphasize to increase storage density.

SUMMARY OF THE INVENTION

A noise measurement process and apparatus is described that can improve the design of data storage devices by identifying sources of noise within a device, and hence identify design areas to emphasize to increase storage density. The Pareto (decoupling) method described is a technique to perform a measurement and therefore a tool used to build an instrument or a product. Also described is a device that carries out the Pareto method. Carrying out this method allows one to build better devices such as magnetic and optical disk or tape drives. The invention integrates several ideas:

a) An understanding that noise is neither created nor eliminated in a control loop. Instead, the action of the loop is to amplify and attenuate various frequency components of the noise. Bode's Integral Theorem goes further to show that (for at least one measure) the area of disturbance attenuation in a loop can be no greater than the area of disturbance amplification. Note that there are still other ways to optimize the noise performance of the loop.

b) An understanding of how to isolate various noise sources through a series of measurements with different loop conditions.

c) A method of filtering these isolated noise measurements backwards through the control loop to the point where they are an input to the system.

d) A method of filtering these inputs forward through the control loop to the point where they are quantified. In the most common case, this is the Position Error Signal (PES) on a magnetic disk or the Focus Error Signal (FES) and Tracking Error Signal (TES) for an optical disk.

The concepts presented synergistically combine to form an important measurement and analysis tool. Together, they allow several possibilities:

By forward filtering the individual noise sources to the position error signal(s) (PES, FES, or TES) strata of noise sources are generated which, viewed cumulatively, clearly indicate the most significant sources.

By having backwards filtered the isolated measurements to the point where the noise source enters the loop, we have the ability to extrapolate the effects of individual optimizations. Thus, for example, the beneficial effects of designing a higher resolution analog to digital converter (ADC) or a cleaner power amplifier can be modeled in isolation, holding all other loop noises at zero or their nominal values.

Other modeling methods can be used which show the projected size of an individual noise component. This new projected size can then be fed from the noise injection point around the loop to give a projected measure of the position error signal.

The Pareto tool allows intelligent choices to be made between different designs. In the case of magnetic drives, an awareness that Windage and Position Sensing Noise (PSN) were the key components to PES have identified the benefit to be obtained by design efforts to clean up the air flow in the drive and to improve the servo demodulation. In the optical world, such a method can allow for focus error signal and tracking error signal measurements across a variety of laser, lens, media, and groove designs. As this area of design is currently in considerable flux, such a systematic tool can allow companies, consortia, and standards committees to find improved optical disk design solutions.

BRIEF DESCRIPTION OF THE DRAWINGS

The invention will be readily understood by the following detailed description in conjunction with the accompanying drawings, wherein like reference numerals designate like structural elements, and in which:

FIGS. 25A, 25B and 25C together illustrate a windage PSD;

DETAILED DESCRIPTION OF THE INVENTION

Figure 1:
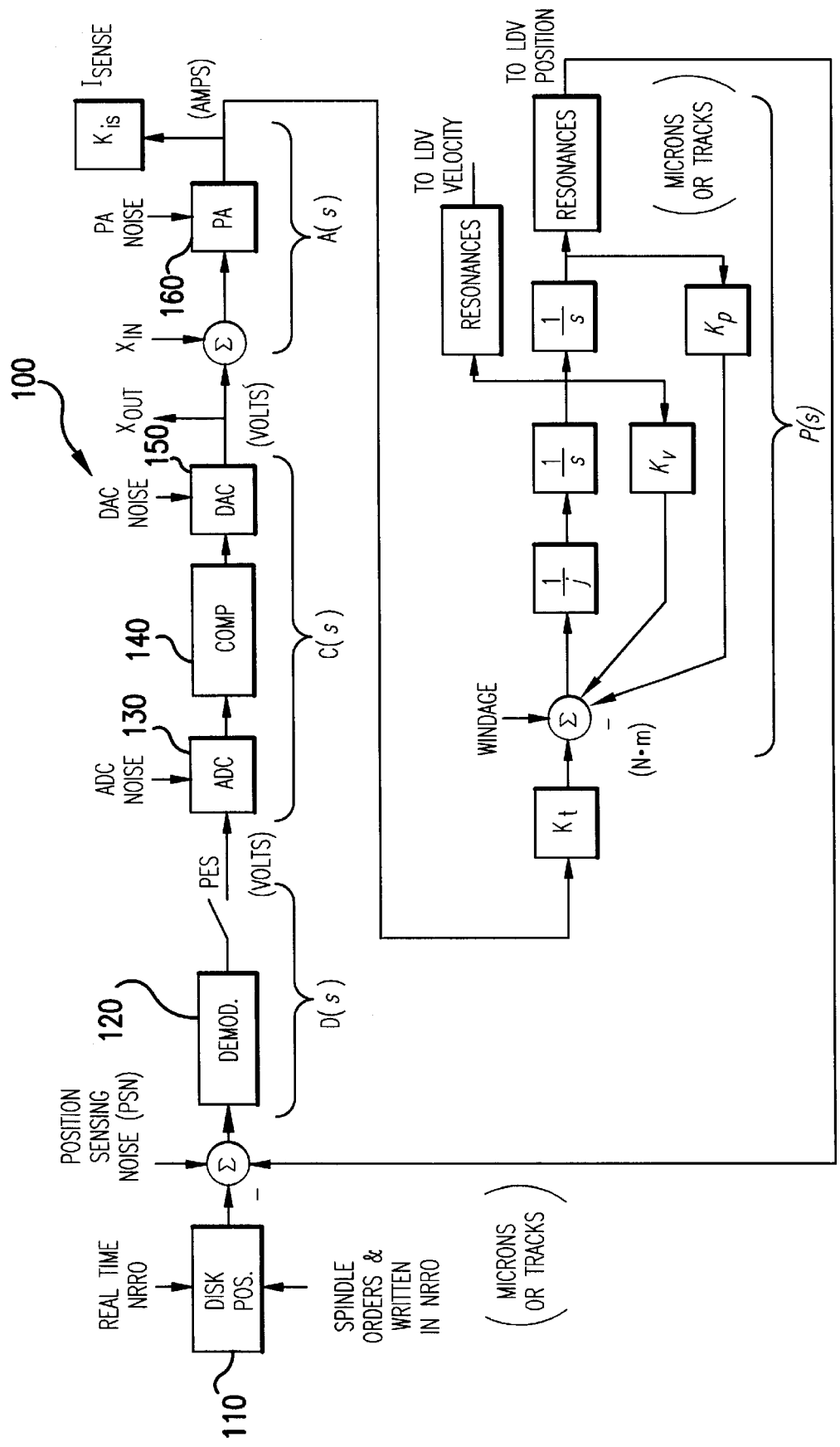
FIG. 1 is a generalized view of a track following model suitable for use when practicing the present invention.
Figure 2:
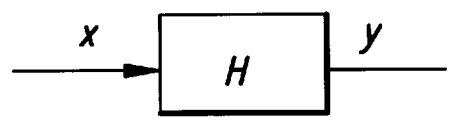
FIG. 2 is a block diagram of a Single Input, Single Output System.

Embodiments of the invention are discussed below with reference to FIGS. 1–37. Those skilled in the art will readily appreciate that the detailed description given herein with respect to these figures is for explanatory purposes, however, because the invention extends beyond these limited embodiments.

Glossary of Terms: The following terms are useful in an understanding of this invention.

Closed-Loop: A control loop which employs some sort of a feedback mechanism.

Feedback: A methodology where a portion of the sensed signal is "fed back" into the system to affect the dynamic response of the system.

Feedforward: Typically a term used to describe the injection of a signal independent from the sensed signal into a control loop.

Frequency response function (FRF): a set of ordered pairs of numbers where the first member of the pair denotes a frequency value and the second member is a complex number denoting a system's response when stimulated at that particular frequency.

FES: Focus Error Signal. Deviation of the sensed vertical position of the optical transducer in an optical drive versus the disk recording surface.

Linear Spectrum: the Fourier Transform of a signal.

MIMO: Multi-Input, Multi-Output system. A system that is MIMO has multiple points for injection of signal (Multi-Input) and multiple points for measurement of the signal (Multi-Output).

MISO: Multi-Input, Single-Output system. A system that is MISO has multiple points for injection of signal (Multi-Input) and a single point for measurement of the signal (Single Output).

Open-Loop: A control loop in which the feedback path has been cut or opened up.

Pareto: a decomposition that identifies the critical few components and trivial many components of some measure. In the current invention, it refers to a decomposition of some amalgamated signal into its component pieces so that the critical few and the trivial many can be determined. For example, in the case described in this invention, Windage and PSN were the critical few contributers to PES.

PES: Position Error Signal. Deviation of sensed position of the magnetic transducer relative to the true track center.

Power Spectral Density (PSD): the Fourier Transform of a signal's autocorrelation function.

Power Spectrum: The integral (across frequency) of the PSD.

PSD: Power Spectral Density.

PSN: Position Sensing Noise. Deviation of the sensed position of the magnetic transducer (relative to the track center) from the true position of the transducer (relative to track center).

SIMO: Single-Input, Multi-Output system. A system that is SISO has but a single point for injection of signal (Single Input) and multiple points for measurement of the signal (Multi-Output).

SISO: Single-Input, Single-Output system. A system that is SISO has but a single point for injection of signal (Single Input) and a single point for measurement of the signal (Single Output).

Spectrum: when used as a noun in this field it typically denotes an ordered pair of numbers with the first member of the pair being a frequency and the second number in the pair denoting some value corresponding to that frequency.

TES: Track(ing) Error Signal. Deviation of the sensed radial position of the optical transducer in an optical drive relative to the true track center.

Transfer function (TF): rational function representation of a system in the frequency domain. When a transfer function model is evaluated at an ordered set of frequencies, a frequency response function is generated. (Transfer function is also commonly used in places where frequency response function would be more appropriate.)

Windage: Movement of the transducer due to air flow. The air flow is typically caused by the spinning of the disk(s).

Pareto (Decoupling) Method and Apparatus

"When you have eliminated the impossible, whatever remains, however improbable must be the truth."—Sherlock Holmes (S. A. C. Doyle, The Sign of Four, 1890).

The above quotation holds in it a key philosophy of the Pareto Method: eliminate all the impossible, observe what is left, and from there determine the true sources of noise in a disk drive (e.g., in the drive's Position Error Signal (PES)). The method involves three distinct steps:

isolate measurement of each noise source ("common mode reject");

filter each measurement backwards to obtain the PSD of the noise source; and filter each source PSD forwards to obtain the effect of the particular noise on the PES PSD. One can then compare each these PSDs at PES to each other and add them to cumulative PES PSD.

Application Example: In the following discussion the method is used to decompose the Position Error Signal (PES) of a Lynx II hard disk drive manufactured by Hewlett-Packard. In this particular hard disk drive, the method will show that the two most significant sources of baseline noise at the disk's position error signal are the turbulent wind flow generated by the spinning disks (Windage) and the noise involved in the actual readback of the Position Error Signal (Position Sensing Noise).

A hard disk drive's Position Error Signal (PES) can be decomposed in the frequency domain into three components:

Synchronous or Repeatable Excitations are due to the rotation of the spindle and therefore synchronous with it or one of the spindle orders. Although synchronous excitations may be large, standard practice in the disk drive industry includes using feedforward cancelers to reduce the effects of synchronous excitations. See, Sacks, M. Bodson, and W. Messner, "Advanced Methods for Repeatable Runout Compensation (Disc Drives)," IEEE Transactions on Magnetics, vol. 31, August 1994; M. Bodson, A. Sacks, and P. Khosla, "Harmonic Generation in Adaptive Feedforward Cancellation Schemes," IEEE Transactions on Automatic Control, vol. 39, September 1994.

Non-synchronous or Non-repeatable Excitations include sharp spectral peaks due to spindle bearing cage orders and structural resonances (which are less sharp but still narrow band). Recent work suggests that disturbances due to resonances or cage orders can be considerably reduced by the use of damped disk substrates and fluid bearing spindles. See, J. S. McAllister, "The Effect of Disk Platter Resonances on Track Misregistration in 3.5 Inch Disk Drives," IEEE Transactions on Magnetics, vol. 32, pp. 1762–1766, May 1996; J. S. McAllister, "Characterization of Disk Vibrations on Aluminum and Alternate Substrates," IEEE Transactions on Magnetics, vol. 33, p. 968, May 1996; J. S. McAllister, "Disk Flutter: Causes and Potential Cures," Data Storage, vol. 4, pp. 29–34, May/June 1997.

Broadband or Baseline Noise is what remains when all of the narrow band components have been removed. Of the three categories, it is the hardest to dissect and therefore the hardest one to for which to find solutions.

In order to increase track densities, all sources of PES uncertainty should be reduced. There is prior work to indicate that the first two categories have been well studied, and that reasonable engineering solutions are available. This is not true for the baseline noise; therefore, of the three categories, it is the one singled out as the focus of this method. The Pareto Method and the measurement techniques for noise source isolation to isolate the building blocks of the PES baseline were used. The reasoning was that understanding the building blocks of the baseline noise, would allow solutions that worked on those building blocks.

This section will describe a method of breaking down the Position Error Signal (PES) of a magnetic disk drive to its contributing components. Once these components are identified, they can be ranked in terms of their overall effect on PES and thus the most critical ones can be worked on first. In order to perform a practical analysis of the contributors to PES, the fundamental question that must be answered is: What can be measured? Although this may seem whimsical at first, it should be noted that in any real system, we will not have access to all the measurement points that we desire. Furthermore, although many different analysis tools might theoretically be available, they are useless to us if they cannot make use of the actual laboratory measurements available to us.

In order to guide our measurements and our modeling, it is useful to have a map of the system. The block diagram in FIG. 1 will serve as the map for our tour of noises in the system 100. Starting at the left of this diagram, the reference position that the actuator arm must follow is the position 110 of the magnetic track written on a disk, turning on a spindle. Only the position error—the difference between the reference track position and the readback head position—is sensed by the readback head, and this error signal is sent to the demodulator 120. The demodulator 120 outputs a set of numbers at the system sample rate, and these are combined electronically to form PES. This PES signal is then converted to a digital format via an analog to digital converter 130 (ADC), filtered by the compensator 140 and then sent back out to the power amplifier 160 via a digital to analog converter 150 (DAC). The power amp 160 converts the desired voltage into a current to drive the voice coil actuator (with torque constant $K_t$). The actuator itself has rigid body behavior as well as resonances. Through this, the head position is set. The position error is then sensed by the head. Absolute head position is not generally known from what is read off of the disk surface, but can be obtained in the laboratory by shining a laser spot from a Laser Doppler Vibrometer (LDV) off of the side of the head. Although this nominally measures velocities, the result can be accurately integrated in time (for the frequencies we are concerned with) to obtain position.

There are several measurement points that can be accessed around the loop: $X_{out}$, $I_{sense}$, PES, and head velocity (and position) via the LDV. In general test signals can be injected into the loop only at $X_{in}$.

There are several likely noise input points on a disk drive. First of all, there are the noises associated with the moving disk and the readback process. These all enter the loop at the same point, but have different root causes. The noise due to the motion of the disk attached to a ball bearing spindle creates both Repeatable Run Out (RRO) (typically at orders of the spindle rotational frequency) and Non-Repeatable Run Out (NRRO). One of the interesting properties of servowritten disks is that one pass of the NRRO is usually locked into the servo position information when it is written. Thus, this written in NRRO is repeated at every revolution of the disk. The other noise source that enters at this point is the noise from the readback process of position information, called Position Sensing Noise (PSN). This noise can be due to the magnetic domains on the disk, the behavior of the magnetic readback head, the interaction of these two, or the action of the demodulator. (We lump demodulator noise into PSN for our current analysis.) Downstream in the loop, there are potential noise sources at the ADC and DAC (due to quantization), noise at the power amp, and finally windage. Windage is caused by the air flow generated as the disk spins. This air flows over, under, around, and into the actuator arms and the readback head, disturbing the head position. Given all these potential noise sources, there is a fundamental need to identify which of these—if any—are the most significant contributors to PES. With this information, the effort to reduce the noise in PES can be concentrated on the critical few.

It is worth noting that, we purposely ignore external shock and vibration in this analysis for two reasons. First of all, external shock and vibration is heavily influenced by the drive's operating environment although the above noises are a function primarily of the drive. The second is that prior work in this area (D. Abramovitch, "Rejecting Rotational Disturbances on Small Disk Drives Using Rotational Accelerometers," in Proceedings of the 1996 IFAC World Congress, San Francisco, Calif., pp. 483–488, Volume O, IFAC, IEEE, July 1996) gives us some confidence that we already have a reasonable engineering solution to many types of external shock and vibration. Thus, this discussion will focus on internal noises. Alternately, external shock and vibration can be included in the analysis.

The tools available to us are a set of laboratory instruments that can make both time and frequency domain measurements. In particular, Digital Storage Oscilloscopes (DSO) can record time domain data as can certain spectrum analyzers. The spectrum analyzers are most useful, though, for measuring linear spectra, power spectra, power spectral densities (PSDs), and frequency response functions of systems. In particular, the spectrum analyzers that we use are the HP 3563A Control Systems Analyzer and the HP 3567A Multi-Channel Analyzer. The latter instrument has the advantage of allowing more than two signals from the system to be measured at once.

For analysis, we have the standard set of matrix based tools. In particular, we are using Matlab and Simulink. We will use these terms generically, allowing the reader to substitute their favorite software package such X-Math and System Build for these names. As has been the practice in our laboratory for several years, the measurements are made with a conscious thought of transferring them into Matlab and Simulink for analysis (D. Y. Abramovitch, "The Banshee Multivariable Workstation: A tool for Disk Drive Research," in Advances in Information Storage Systems, Vol. 5, B. Bhushan, ed., pp. 59–72, ASME Press, 1993).

Given these tools, there are three types of measurements on which we could base our analysis. Their features are listed below:

PSDs and Power Spectra: These are easy to measure. It is straightforward to average PSDs. If the processes are independent, then the PSDs can be added. This allows us to decompose a PSD into its component parts. They contain no phase information, this implies that we cannot inverse FFT the PSD into a time signal to drive simulations (such as Simulink). We can do frequency response function filtering (in Matlab) using the following scheme:

Take the linear model and generate Bode plots at the same frequency points as PSD. Alternately (or in combination) measure the frequency response functions of the system. In either case, we get a frequency response function at the same frequencies as the PSDs. Call it H for now.

Multiply H times its complex conjugate to get $\|H\|^2$.

Multiply $\|H\|^2$ times the power spectrum or PSD to get effect of the loop on noise.

Note that $\|H\|^2$ must be the appropriate units for filtering the PSDs. The resulting output is another power spectrum or PSD. We can use superposition to build up contributions from many sources. We need to do some "loop unwrapping" to extract proper input noise levels for model. This is limited to linear system models.

Linear Spectra: These are harder to measure: filtering and averaging of linear spectra is less straightforward on the HP 3567A. Linear spectra contain phase information: we can inverse FFT averaged linear spectra to get representative time domain input. We can drive Simulink with this. We can then use Simulink to generate PSDs from time domain data. This is limited to linear system models. Linear spectra cannot be added, therefore we cannot decompose noise component factors as with PSDs.

Time Domain Measurements: These are not limited to linear system models, i.e., we can measure responses of nonlinear phenomena. When averaging, we can make use of an index signal which is generated once per revolution of the disk. Without synchronizing to the index, using time domain averaging drives all the signals 0. With synchronizing to the index, using averaging removes the Non-Repeatable Run Out (NRRO) of the disk, leaving only the Repeatable Run Out (RRO). This type of measurement does generate data for time domain simulations, but without using averaging it is hard to know if the data is representative of general system behavior.

Looking over all of these features, Power Spectra/PSDs appear to be the most promising measurements. The chief restriction of doing so is that we will have to limit ourselves to linear models of the disk drive. However, by doing so we are able to actually add and subtract PSDs. In order to do so, we formally should require some knowledge that the noise sources are independent. It turns out that there is no way to verify this for all sources, but it is very likely true. Although any measured signal in the loop is correlated to several noise sources, each source arises from an independent physical phenomenon. Furthermore, without allowing for superposition of noise measurements, it would be next to impossible to analyze the noise of a measured system. Thus, it is a starting point we chose. As far as the linearity assumption goes, it is well known that quantizers (ADCs and DACs) are nonlinear, however Widrow was able to model them using uniformly distributed white noise into a linear system (G. F. Franklin, J. D. Powell, and M. L. Workman, Digital Control of Dynamic Systems, Menlo Park, Calif., Addison-Wesley, second ed., 1990). Furthermore although the actuator pivot friction is also nonlinear (see, G. F. Franklin, J. D. Powell, and M. L. Workman, Digital Control of Dynamic Systems, Menlo Park, Calif., Addison-Wesley, second ed., 1990; F. Wang, D. Abramovitch, and G. Franklin, "A Method for Verifying Measurements and Models of Linear and Nonlinear Systems," in Proceedings of the 1993 American Control Conference, San Francisco, Calif., pp. 9–97, AACC, IEEE, June 1993; D. Abramovitch, F. Wang, and G. Franklin, "Disk Drive Pivot Nonlinearity Modeling Part I: Frequency Domain," in Proceedings of the 1994 American Control Conference, Baltimore, Md., pp. 2600–2603, AACC, IEEE, June 1994; F. Wang, T. Hurst, D. Abramovitch, and G. Franklin, "Disk Drive Pivot Nonlinearity Modeling Part II: Time Domain," in Proceedings of the 1994 American Control Conference, Baltimore, Md., pp. 2604–2607, AACC, IEEE, June 1994; T. Hurst, F. Wang, and D. Henze, "Understanding Ball Bearing Pre-rolling Behavior Using the Restoring Force Surface Method," in Advances in Information Storage Systems, Vol. 7, B. Bhushan, ed., ASME Press, 1996 (Presented at the 1994 ASME Winter Annual Meeting), it has been shown (F. Wang, T. Hurst, D. Abramovitch, and G. Franklin, "Disk Drive Pivot Nonlinearity Modeling Part II: Time Domain," in Proceedings of the 1994 American Control Conference, Baltimore, Md., pp. 2604–2607, AACC, IEEE, June 1994) that the rotation of the spindle provides an operating point for the nonlinear system where the behavior can be modeled using linear components.

What remains to be seen is how all of these noise sources can affect the Position Error Signal. The fundamental concept that ties them together comes from what is known as Bode's Integral Theorem. The following will give a thumbnail sketch of Bode's Integral Theorem and discuss what its implications are for measurements of control loops.

Theorem on Sensitivity Functions: There is a theorem by Bode which deals with what he calls regeneration. It turns out that this theorem has some very interesting applications to control systems. This has only recently come to light as a tool for evaluating control systems (see, S. Boyd and C. A. Desoer, "Subharmonic Functions and Performance Bounds on Linear Time-invariant Feedback Systems," IMA J. of Mathematical Control and Information, vol. 2, pp. 153–170, 1985, also in Proc. 1984 Conf. on Decision and Control). However it is the starting point for design methodologies such as QFT (see, I. M. Horowitz, Quantitative Feedback Theory (QFT), 4470 Grinnell Ave., Boulder, Colo. 80303: QFT Publications, 1992). There is even a discrete time version of this theorem (see, C. Mohtadi, "Bode's Integral Theorem for Discrete-time Systems," Proceedings of the IEEE, vol. 137, pp. 57–66, March 1990) that gives some insight on how this theorem is affected by sample rates.

Sensitivity Functions: The block diagram for the following discussion is in FIG. 3. The closed loop transfer function from $u_1$ to $y_2$ is given by the standard form:

$$T = \frac{y_2}{u_1} = \frac{PC}{1+PC}. \tag{2}$$

The sensitivity function is also known as the disturbance rejection function. Designated S, it is given by:

$$S = \frac{e_1}{u_1} = \frac{1}{1+PC} = \frac{y_2}{d} = \frac{-e_1}{d}. \tag{3}$$

Note that $$S + T = \frac{1}{1+PC} + \frac{PC}{1+PC} \equiv 1, \tag{4}$$

hence T is commonly called the complementary sensitivity function. Note that $S=H_{yd}$ (=the transfer function from d to $y=y_2$).

The sensitivity function is important because it shows how disturbances, d, go through the system and show up at the output, y, or at the error signal e. For a unity feedback system $$S \Delta H_{yd} = -H_{e1\,d} = H_{e1\,u1} \tag{5}$$

Thus, the transfer function from disturbance, d, to the output, y is the same as the transfer function from the input $u_1$, to the error (PES), $e_1$, and the transfer function from disturbance, d, to error (PES), $e_1$. In other words it is very good gauge of how noise will be filtered through the system.

Bode's Integral Theorem: Although the mathematics used to prove both versions of Bode's theorem can be fairly complicated, the result is elegant and extremely powerful. We will leave the proofs to those references (W. Bode, Network Analysis and Feedback Amplifier Design, New York, Van Nostrand, 1945; S. Boyd and C. A. Desoer, "Subharmonic Functions and Performance Bounds on Linear Time-invariant Feedback Systems," IMA J. of Mathematical Control and Information, vol. 2, pp. 153–170, 1985, also in Proc. 1984 Conf. on Decision and Control; C. Mohtadi, "Bode's Integral Theorem for Discrete-time Systems," Proceedings of the IEEE, vol. 137, pp. 57–66, March 1990) and talk simply about the interpretation. Looking at FIG. 4 it says simply that:

$$\begin{matrix} \text{the area of} \\ \text{disturbance} \\ \text{amplification} \end{matrix} = \begin{matrix} \text{the area of} \\ \text{disturbance} \\ \text{rejection} \end{matrix} + \begin{matrix} \text{a non-} \\ \text{negative} \\ \text{constant.} \end{matrix} \quad (6)$$

Figure 5:
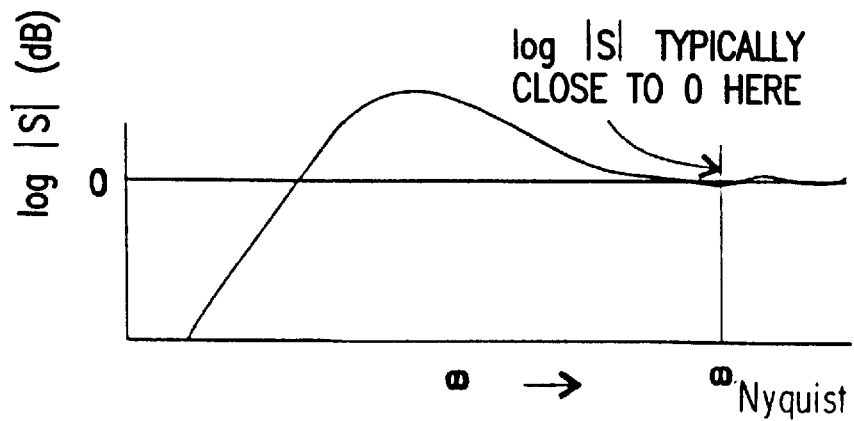
FIG. 5 illustrates a sensitivity function in discrete time.
Figure 6:
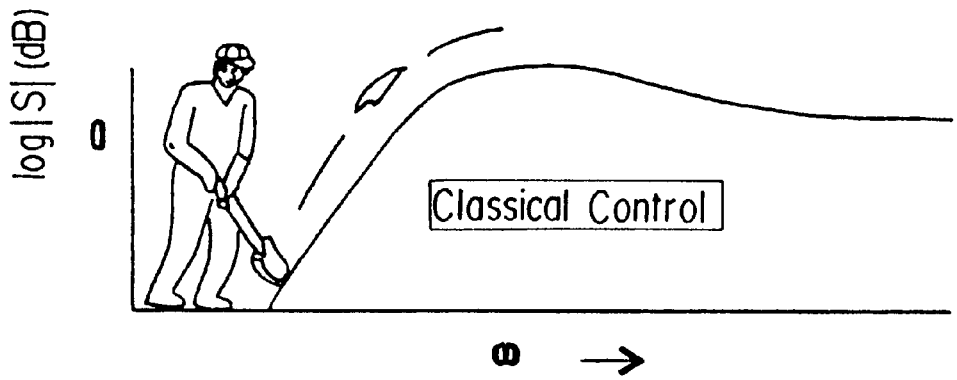
FIG. 6 illustrates Stein's depiction of classical control.
Figure 7:
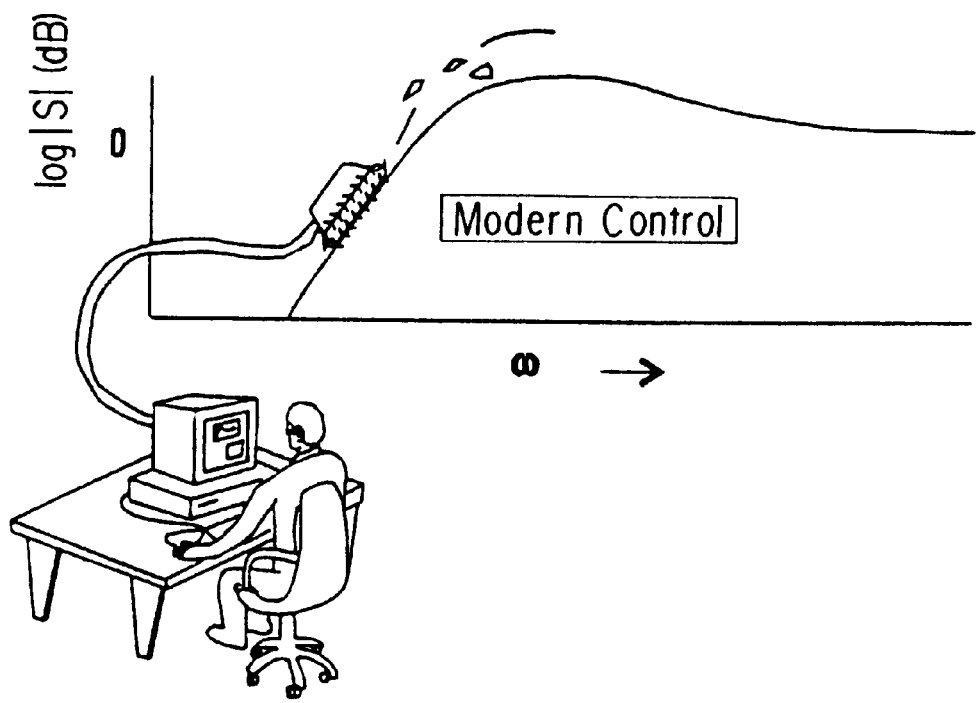
FIG. 7 illustrates Stein's depiction of modern control.
Figure 8:
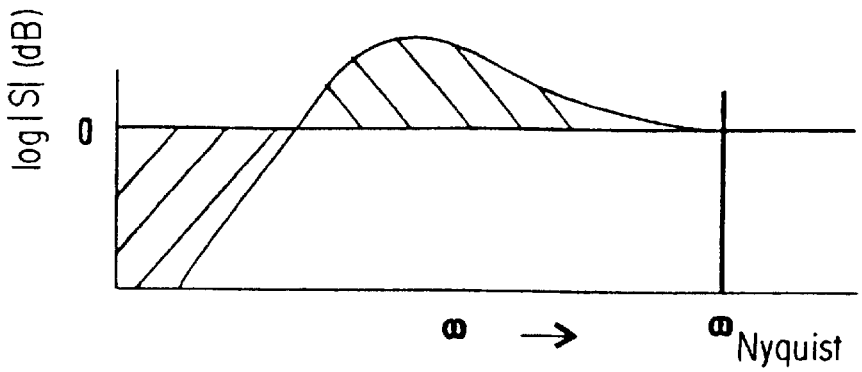
FIG. 8 illustrates Bode's Theorem in discrete time.
Figure 9:
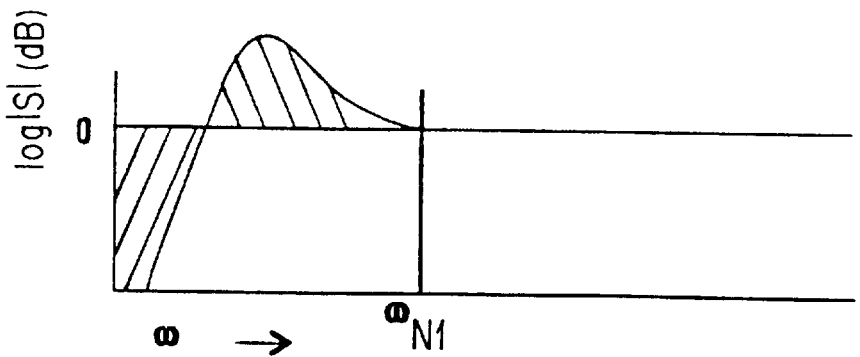
FIG. 9 illustrates a sensitivity function at nominal sample rate, $\omega_{N1}$.

Looking at FIG. 5, we see that for discrete time the main difference is that the Nyquist frequency limits the space we have to work with. In both cases, if we want to attenuate disturbances at one frequency, we must amplify them at another. There is no way to get around this.

Bode's Integral Theorem for Continuous Time, Open Loop Stable Systems

For a stable, rational P and C with $P(s)C(s)=O(s^2)$ (i.e. they fall off as $1/s^2$ or faster)

$$\int_0^\infty \log|S| d\omega = 0.$$

Consequences: "Sooner or later, you must pay for every good deed." (Eli Wallach in *The Magnificent Seven*). Translation: If you make the system less sensitive to noise at some frequencies, you then make the system more sensitive at other frequencies.

Typical control designs attempt to spread the increased sensitivity (noise amplification) over the high frequencies where noise or disturbances may be less of an issue.

A wonderful treatment of this theorem and the importance of it was given as the Bode Lecture at the 1989 IEEE Conference on Decision and Control (Tampa, Fla.) (G. Stein, "Respect the Unstable," Bode Lecture presented at the 1989 IEEE Conference on Decision and Control, Tampa Fla., December 1989). Stein used this theorem to show how tightly control engineers are dancing when we deal with unstable systems. Stein described the net effect of control systems design as trying to get a certain amount of disturbance rejection at some frequency span while trying to thinly spread the amplification over a large frequency span. Stein referred to this as shoveling dirt. An attempt to recreate his drawing is in FIG. 6. The guy shoveling dirt is moving around the disturbance amplification. He is doing classical control. He can move the dirt around, but the dirt does not go away. Even with our modern, sophisticated control tools, in FIG. 7, the dirt is still there.

Now, if the plant or compensator are not stable—i.e., if P or C (or both) have a finite number of unstable poles—then the result generalizes to $$\int_0^\infty \log|S| d\omega = 2\pi \sum_{k=1}^K Re(p_k)$$

(a positive number) where K is the number of unstable poles of C and P and $p_k$ are those poles. Thus, any unstable poles in the system only make life worse in that more of the noise would have to be amplified. Note that the integration is done on a linear scale even though these drawings may imply a logarithmic frequency scaling.

Theorem 2 (Bode's Integral Theorem for Discrete-Time Systems:) For all closed-loop stable, discrete-time feedback systems, the sensitivity function has to satisfy the following integral constraint:

$$\frac{1}{\pi}\int_0^\pi \ln|S(e^{j\theta})| d\phi = \sum_{l=1}^m \ln|\beta_l|$$

where $\beta_l$ are the open-loop unstable poles of the system, m is the total number of unstable poles, and $\phi=\omega h$ where h is the sample period and $\omega$ is the frequency in radians/sec.

There are some implications of this theorem dealing with discrete time systems. Basically, they say the following:

a) With h as the sample period, the ideal upper limit of the frequency spectrum is $\pi/h$, the Nyquist frequency. Mohtadi assumes for this discrete time theorem that there are no frequencies in the loop above the Nyquist frequency. This would imply that PC=0 for $\omega > \pi/h = \omega_N$ and $S=1/(1+PC)=1$, which is in general false for a physical system. However, typical digital control systems do assume that PC is small at or above the Nyquist frequency. Thus, even though the exact assumptions of the theorem will not hold for most physical systems, it is reasonable to assume that some insight can be gained from this theorem. Note: This interpretation does leave open the door for multirate control. With the actuator signal going out at a higher rate than the input sensor, it might be possible to do something (good or bad) at frequencies above the Nyquist$_{rate, \omega_N}$, of the sensor.

b) Because we can only manipulate frequencies up to $\omega_N=\pi/h$ and because $|S|\approx 1$ above that frequency, the theorem says that if for some frequency $|S|<1$ then at some other frequency $|S|>1$. Unlike the continuous time result, though, there is not infinite bandwidth to spread this over. Thus, the $|S|>1$ all happens below the Nyquist frequency (and therefore in a finite frequency range).

c) Loop Transfer Recovery, as shown in a famous paper by Doyle and Stein (J. C. Doyle and G. Stein, "Multivariable Feedback Design: Concepts for a Classical/ modern Synthesis," IEEE Trans. Aut. Control, vol. AC-26, pp. 4–16, February 1981), cannot be done. LTR attempts to asymptotically match the LQR result that says that LQR provides $|S|<1$ for all frequencies, in part because LQR uses full state feedback. LTR tries to do the same for frequencies up to some point. The $|S|>1$ part is dumped over the infinite frequency band above that point. The Nyquist limit eliminates the possibility of doing this.

What does it mean: Looking at FIG. 8, the discrete time version states that (analogous to the continuous time theorem):

$$\begin{array}{ccc} \text{the area of} & \text{the area of} & \text{a non-} \\ \text{disturbance} & = \text{disturbance} & + \text{negative} \\ \text{amplification} & \text{rejection} & \text{constant,} \end{array} \quad (7)$$

and this all this must happen before the Nyquist frequency. The reason why this becomes important is that by working to reject noise at one frequency, we will dump noise amplification at another frequency, but now that the Nyquist frequency establishes a limit, we may end up putting noise amplification at frequencies that we care about.

Effect of sample rate: If the control system is merely a process of shoveling the "disturbance amplification dirt" around, then what does the Nyquist rate signify? It can be thought of as a retaining wall which prevents the "dirt" from going out beyond the Nyquist frequency. Thus, the freedom to spread the dirt around is limited by the Nyquist "retaining wall."

Graphically one can see what the theorem implies with sample rate. Looking at FIG. 9, say we have a certain amount of rejection, $|S|<1$, for a compensator sampled at $\omega_{N1}$. This implies a certain area of $|S|>1$. This has to be done before the Nyquist rate retaining wall.

Figure 10:
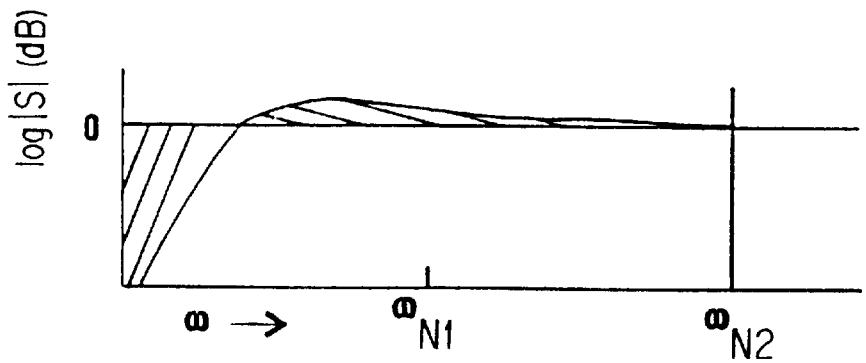
FIG. 10 illustrates the effects of doubling the sample rate ($\omega_{N2}=2\omega_{N1}$), the filtering option.
Figure 11:
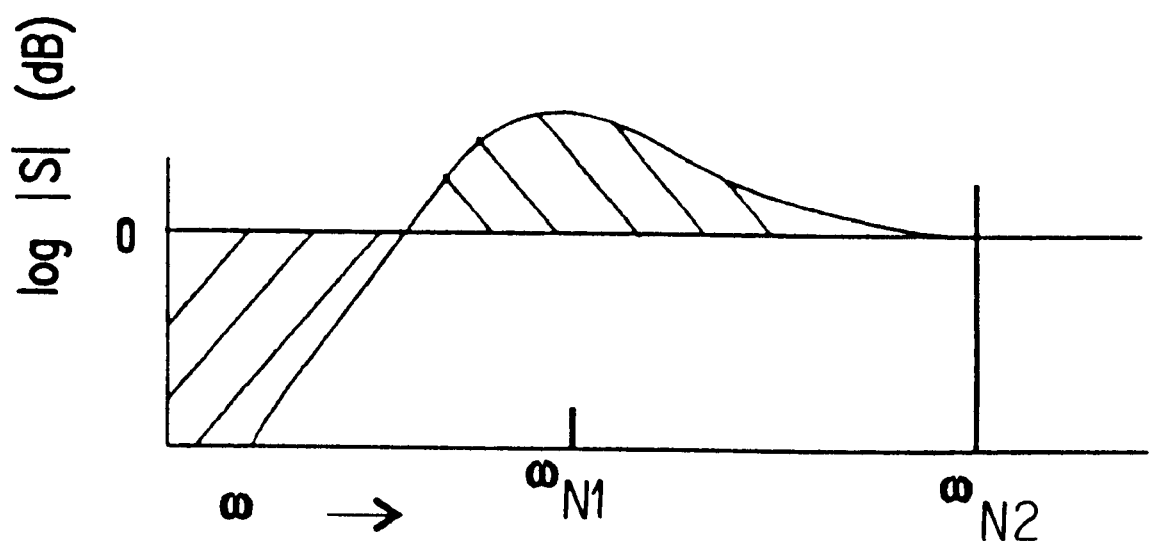
FIG. 11 illustrates the effects of doubling the sample rate ($\omega_{N2}=2\omega_{N1}$), the higher bandwidth option.

Now, we double the sample rate. With the extra "space," we can either perform some extra filtering but keep the bandwidth of the closed-loop system constant (FIG. 10) or demand more rejection at low frequency and higher bandwidth (FIG. 11). Note that the effect of using the extra bandwidth to filter is essentially to spread the amplification, $|S|>1$, over a broader frequency band. This shrinks the height of any amplification hills (FIG. 10). By pushing the closed-loop bandwidth (FIG. 11), better performance at low frequency may result in much worse performance at high frequency.

There are two reasons why Bode's Integral Theorem is important in a discussion of a disk drive's Position Error Signal. First of all, it gives us a very good gauge on what we can and cannot do with disturbance rejection and noise in a control system. This tells us that whenever we improve with the noise rejection at one frequency we pay for it at another. If we are smart and put the noise amplification at places where there is only a small amount of noise, then we do well. If not, we may inadvertently be boosting much of the noise that we are trying to eliminate.

The second reason will become apparent in the next section. It turns out that when we measure PES from a closed loop system, we should actually open the loop and look at PES. The exact same effects that are the point of the above theorem affect our measurement of PES. We will see that when we measure PES that is flat in closed-loop, opening the loop (mathematically in Matlab or on a spectrum analyzer) will give us a PES spectrum that looks considerably different from the ones we are accustomed to.

Measurements of PES and Loop Unwrapping: Typically in a disk drive the Position Error Signal (PES) is only measured in closed-loop. This is in general due to the difficulties of obtaining a linear measurement of head position across multiple tracks while the loop is not closed. What seems less common is "opening the loop" as is often done with closed-loop transfer function measurements. Although a PSD of closed-loop PES might be a reasonable measure of loop performance, it is not the useful quantity for determining what the noise inputs to the system are. In order to obtain this quantity, we want to open the loop, either physically or mathematically.

Figure 3:
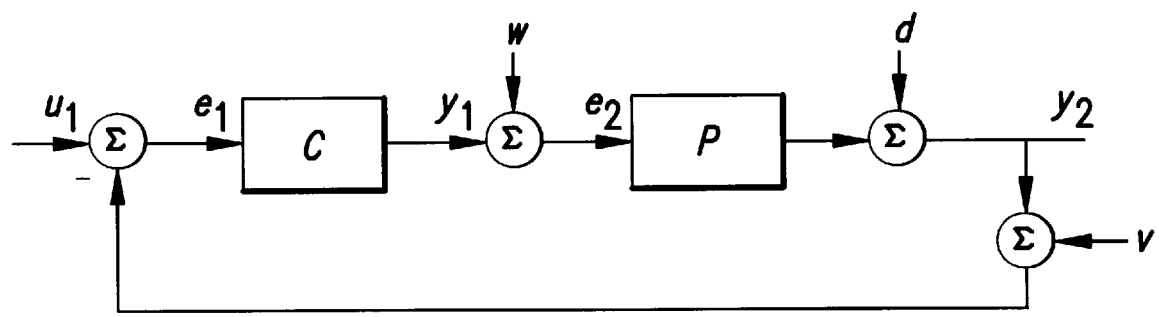
FIG. 3 is a block diagram of a closed-loop system.
Figure 4:
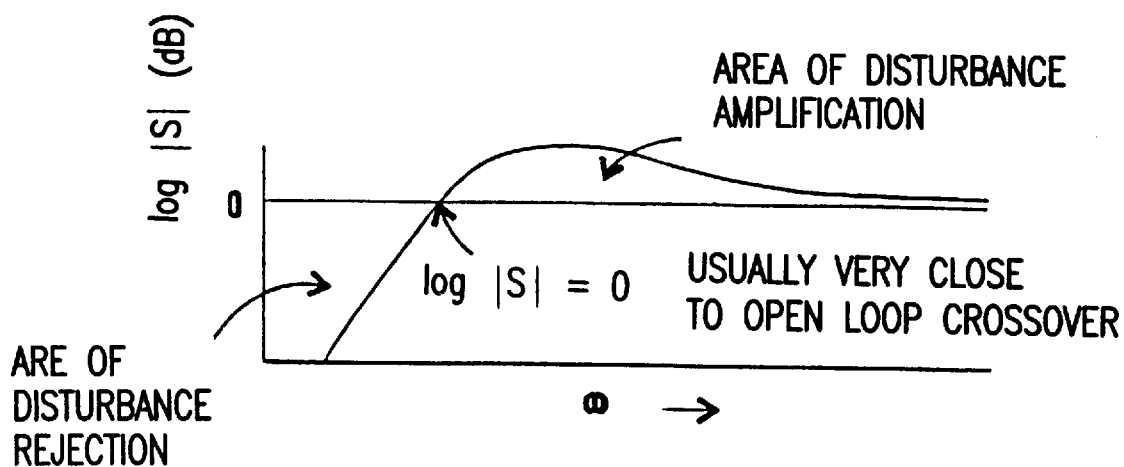
FIG. 4 illustrates a sensitivity function.

Referring back to the block diagram in FIG. 3, the closed loop transfer function from $u_1$ to $y_2$ is given in Equation 2 and the sensitivity function, which turns out to be the transfer function from $u_1$ to $e_1$=PES is given in Equation 3. Both of these transfer functions represent many responses. We typically think of the sensitivity function as the error response, $e_1$, from either the reference, $u_1$, or a disturbance, d.

Now, to unwrap the closed-loop transfer function, T, there is a convenient button on some spectrum analyzers—such as the HP 3562A/3563A—which generates the open loop response, PC via the waveform math operation T/(1−T) (=PC) conversion. However, there is no such key to generate S. It can still be done, though. The procedure is:

Measure closed-loop response from $X_{in}$ to $X_{out}$. Call this T. (Note that if the phase of the measurement does not start at 0 at low frequency, then there is an extra factor of −1 in the closed loop measurement which must be removed by negating the trace.)

Subtract T from 1, i.e., S=1−T=1/(1+PC).

It is also useful to calculate T/(1−T). This is PC, a quantity that is very useful to have.

Note that although the PSD of PES is typically measured as a closed loop quantity, we are now in a position to extract the input to the loop that would yield that PES PSD. Because the transfer function from $u_1$ to $e_1$ is given by S, a noise PSD input at $u_1$ would be filtered by $\|S\|^2$ by the time it showed up at $e_1$. Thus, if we start with a measurement of noise at $e_1$, we can filter backwards by $1/\|S\|^2=\|1+PC\|^2$ to get the input at $u_1$ that could have generated it. The procedure above shows how to measure the exact filters needed to "open" the loop.

Practical Considerations: It is useful to understand that closed loop frequency response functions are generated by injecting a signal at $X_{in}$ and reading the response at $X_{out}$ (See FIG. 1). A swept sine (also known as sine-dwell) scheme is used to get the cleanest possible measurement (Hewlett-Packard, Control System Development Using Dynamic Signal Analyzers: Application Note 243-2, 1984). Due to traditional design methods, the frequency response functions are often measured using a logarithmic frequency spacing although a linear spacing is also possible. On the other hand the measurement PSDs is almost always done with a linear frequency axis. Furthermore, there is no need to inject anything into the loop to get the nominal track following levels of PES PSD.

Note that in general the frequency spacing between swept sine and linear resolution mode does not match. However, by doing the swept sine in linear resolution and by carefully choosing matching frequency bands for both the swept sine and the PSD measurements, we are able to use the measured frequency response functions to filter the measured PSDs. The extra work to match frequency bands with the swept sine mode is justified by the improved signal to noise ratio of swept sine frequency response function measurements over broadband measurements.

This allows us to measure the frequency response function, with the cleaner mode (swept sine) and still use it on the linear resolution PES data.

Figure 12A:
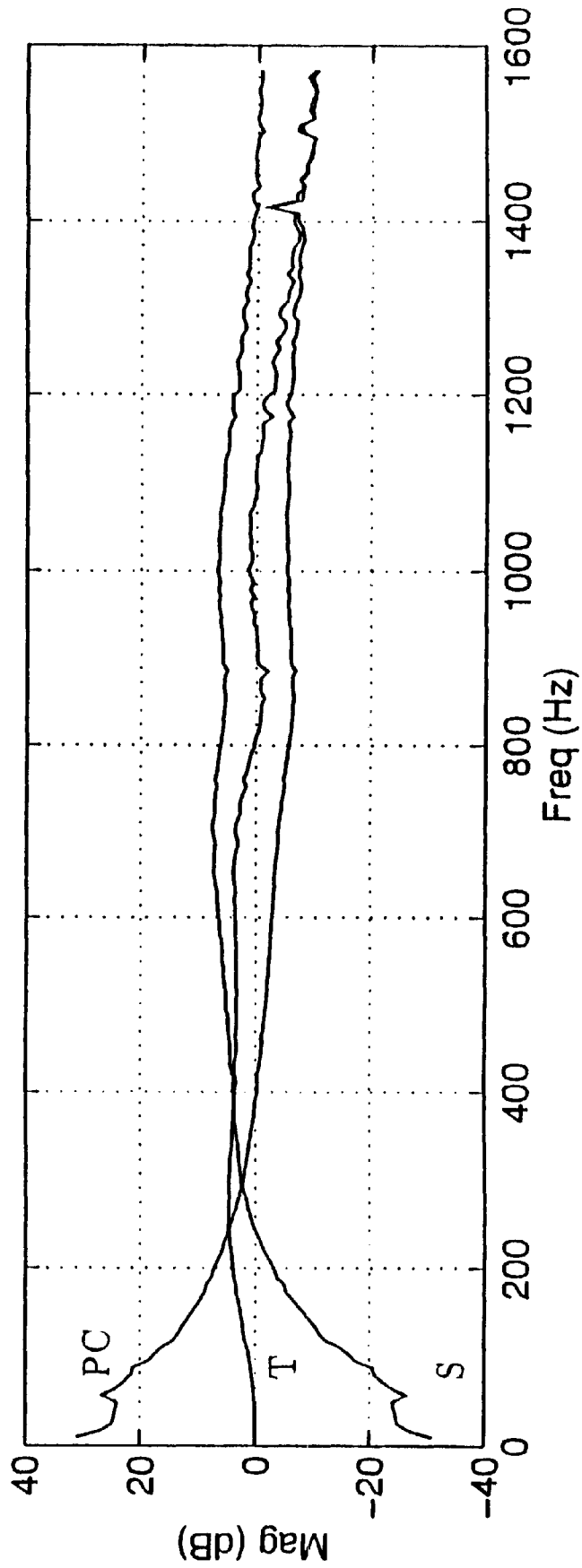
FIGS. 12A and 12B together show the frequency response of an example disk drive.
Figure 12B:
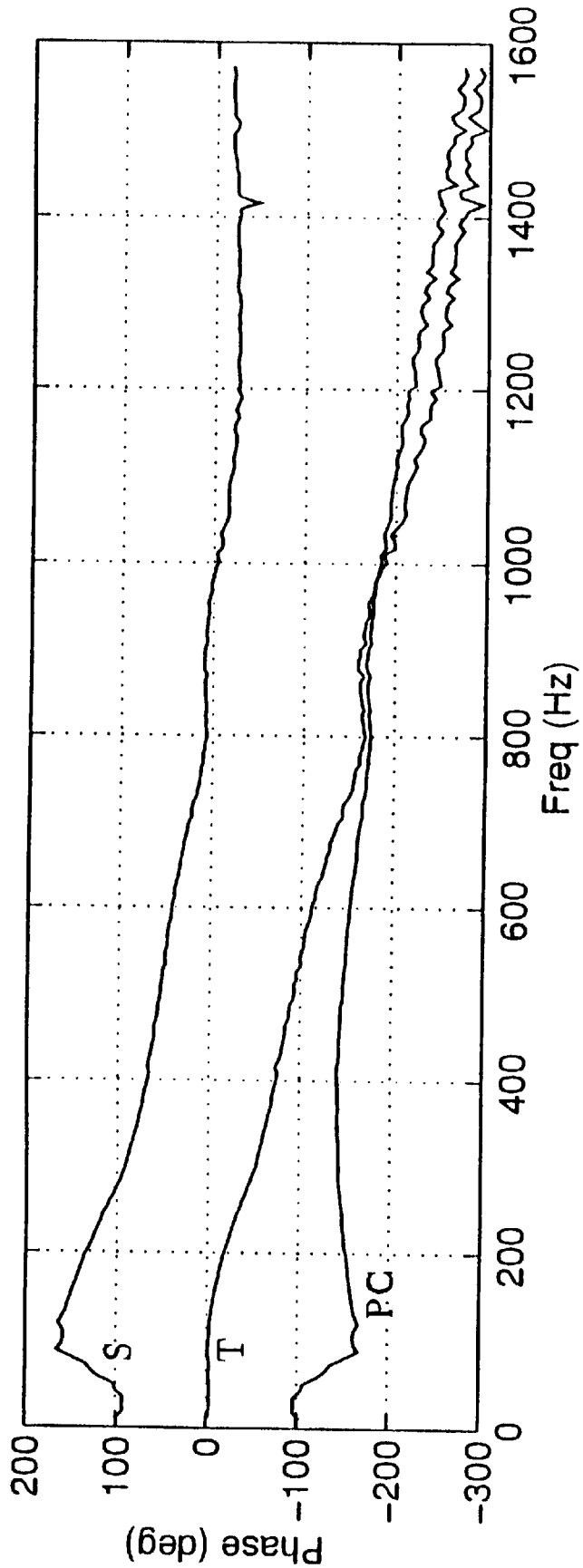
Figure 13:
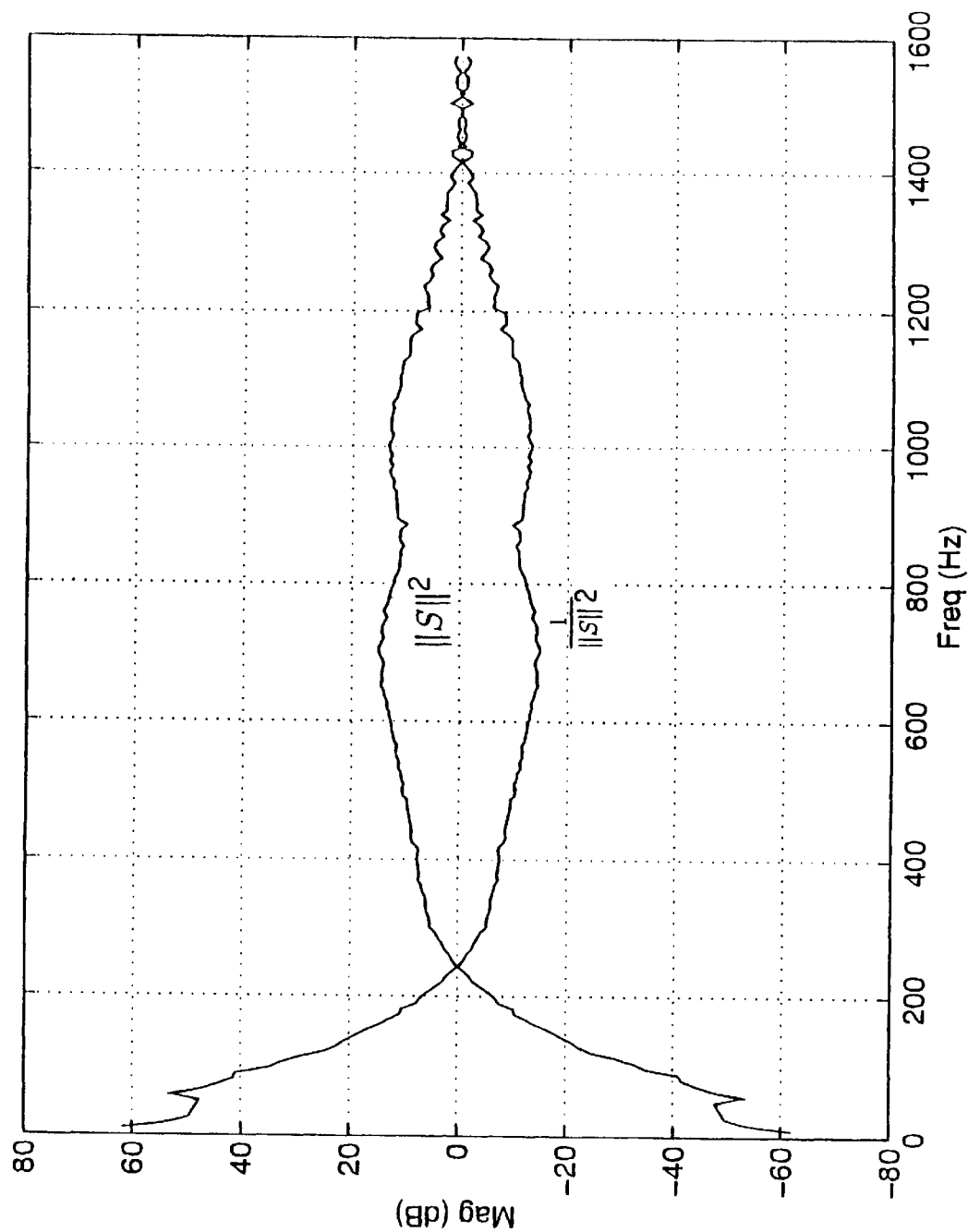
FIG. 13 shows $\|S\|^2$ and $1/\|S\|^2$ for the example drive.
Figure 14:
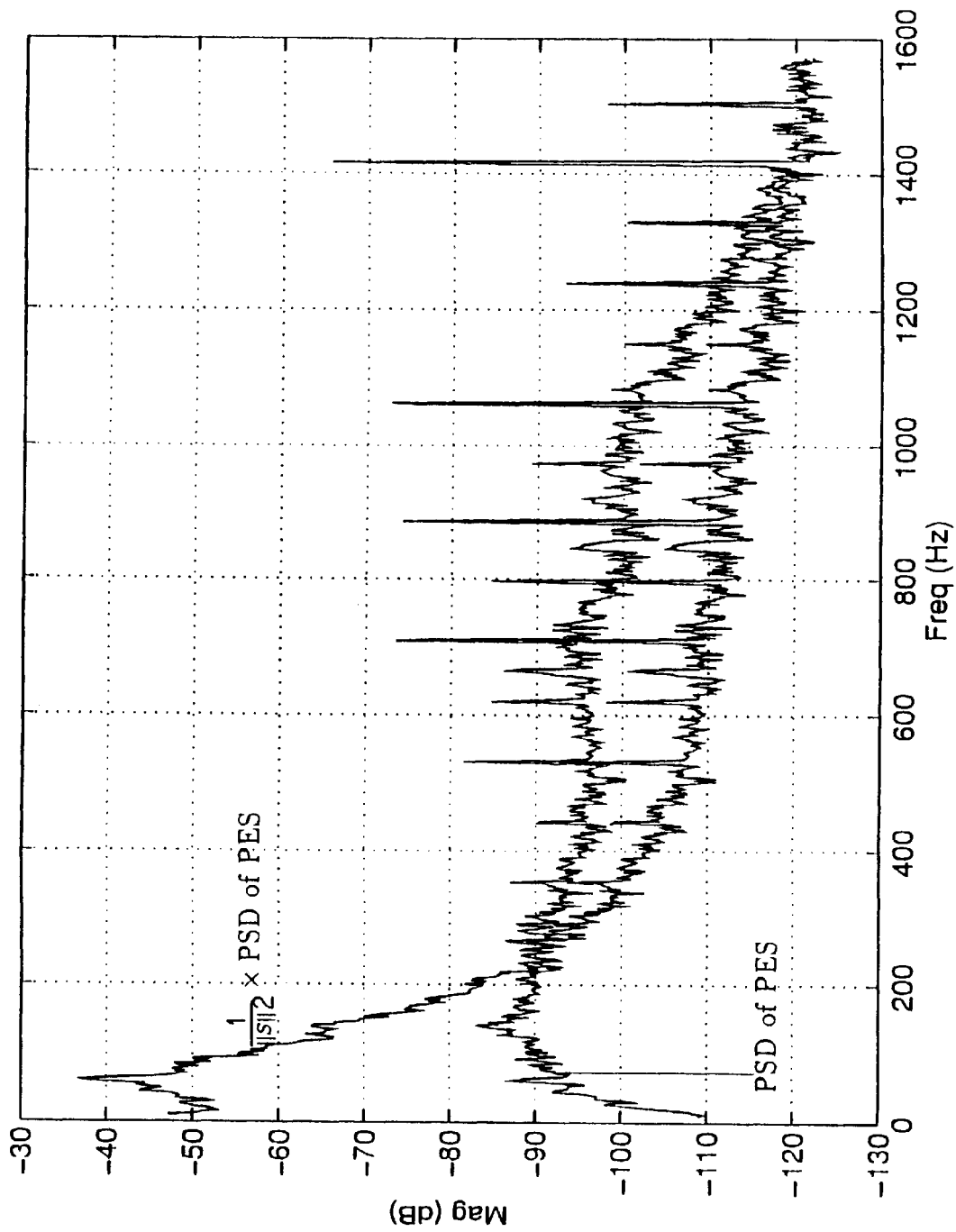
FIG. 14 shows PSD of PES, and PSD of PES filtered by $1/|S|^2$ for the example drive.

Measurements: FIGS. 12A and 12B together show the frequency response measurement of a KittyHawk II disk drive. Closed loop, open loop, and sensitivity functions are shown. FIG. 13, shows the squared the magnitude of S and 1/S. FIG. 14 shows the PSD of PES as measured and when filtered by $1/\|S\|^2$.

What does it mean, Part Deux: Looking at the two plots in FIG. 14 is a bit confusing at first. Most people are familiar with the closed-loop measurement of the PES PSD, but have never seen a PES PSD with the hump at low frequency.

However, when one understands the significance of Bode's Integral Theorem, the plot makes complete sense. The PES only looks flat because of the action of the feedback loop. In fact, the "open-loop" plot of the PES PSD can be approached by lowering the loop gain until the system is barely track following. At that point, the closed-loop PES PSD will look very much like the "opened-loop" PES PSD, because the effect of the feedback loop will have been minimized. The effect of the feedback loop is to push disturbances down at low frequency while amplifying them at high frequency. Note that as the frequency approaches the Nyquist frequency—1858.5 Hz for the KittyHawk II—the two curves come together.

The point of Bode's Integral Theorem is that the noise amplification will always be there. Servo engineers cannot eliminate it, they can only choose, through careful control design, where to put it. This is true in both continuous time control and discrete time control. There is the added nuisance of the Nyquist Rate "retaining wall" in discrete time. The "peaking" of PES at high frequency is not some anomaly of a poor control design. It is a natural consequence of doing control. Thus, if we are really going to be concerned with noise at high frequency, we should look at the sensitivity function, S, to see how our control design changes it. A control design methodology that takes this into account, such as QFT can be used.

The noise amplification in the primary servo loop is often increased when servo designers are trying to change the loop dynamics to reject external disturbances. On the other hand, feedforward control is not part of the primary servo loop. This means that there is no effect on |S| when feedforward once-around cancellation or feedforward disturbance cancellation is done. Thus, an understanding of this method leads one towards the use of extra sensors and feedforward compensation as a way of minimizing the noise amplification. Because feedforward loops using extra sensors (D. Abramovitch, "Rejecting Rotational Disturbances on Small Disk Drives Using Rotational Accelerometers," in Proceedings of the 1996 IFAC World Congress, San Francisco, Calif., pp. 483–488, Volume O, IFAC, IEEE, July 1996) do not affect noise amplification, then using them may allow servo designers to relax some of the gain requirements on our principle control loop and thereby cut down on the noise amplification at high frequency.

Conclusion—The Pareto Method: The previous sections have set the groundwork for the following statement: The method shown in the measurements section to extract the "open-loop" noise input to the system can be applied to every noise source for the system in FIG. 1. This will yield not only the noise inputs to the system as open loop quantities, but also their effect on PES.

In order to do the appropriate filtering, certain frequency response functions can either be generated from a model or measured in the laboratory. The following building blocks can either be obtained from laboratory measurements or models and used to construct any of the necessary filters. Because we are filtering PSDs, that the operation will involve the magnitude squared of the filter response.

Figure 15A:
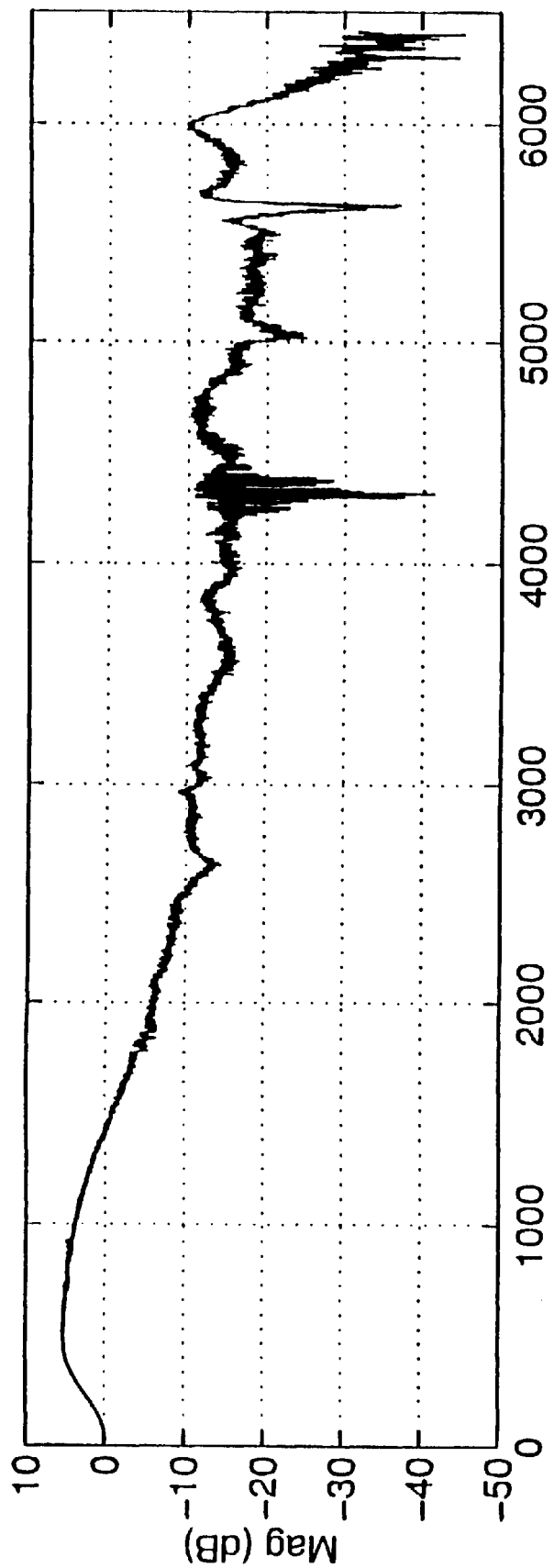
FIGS. 15A and 15B together illustrate a measured closed loop transfer function.
Figure 15B:
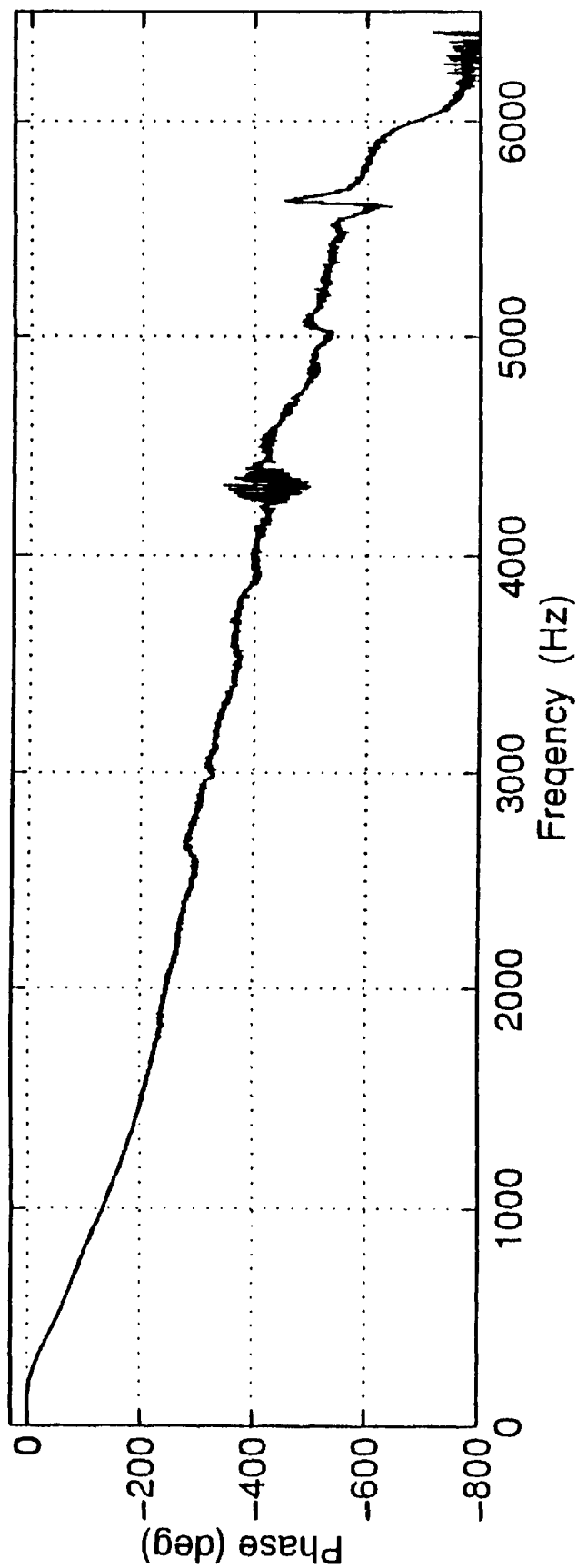

Note that obtaining open loop frequency response function measurements on a closed loop system can be done in one of two ways. The first, a 3-wire measurement involves injecting a signal at one point in the loop and reading the output at two other points in the loop. This allows for the direct measurement of open loop quantities from a closed loop system, but does a poor job of eliminating noise from the measured response. On the other hand, a closed loop measurement, as shown in FIGS. 15A and 15B, is made by allowing the first of the loop measurement points to be the injected signal. In order to obtain open loop quantities from such a measurement, the loop must be mathematically opened. This does a much better job of decorrelating noise in the loop from the desired frequency response function. However, because of the loop unwrapping, this method of obtaining open loop dynamics can be susceptible to quantization errors at frequencies where the closed loop response, T≈1. In this case the loop opening operation T/(1−T) can be dominated by the quantization error in the denominator. The point of the above discussion is to point out why neither method is perfect and often both types of measurements are done on the same system.

$$P(s) = \frac{1}{K_t}\left(\frac{LDV}{I_{sense}}\right)_{3-wire\,meas} = \frac{1}{K_t A(s)}\left(\frac{LDV}{X_{in}}\right)_{opened\,CL-meas}$$

A(s): from model $$C(s) = \left(\frac{X_{out}}{PES}\right)_{meas}$$

$$D(s) = \frac{\left(\frac{PES}{I_{sense}}\right)_{meas}}{\left(\frac{LDV\,Position}{I_{sense}}\right)_{meas}}$$

Given that we have the elements to construct the appropriate filters, there is a common theme for each noise source:

Isolate a measurement of a noise source ("common mode reject").

Filter backwards from the measurement point to the noise input to obtain the noise source input PSD.

Filter forwards from the noise source input to PES to obtain the effect of this noise on the PES PSD.

Compare the PSDs at PES and add to cumulative PES PSD.

Integrate across frequencies to obtain power spectra and total variances for each noise source.

As elegant as this methodology might seem, it can yield surprisingly profound results in the area. The net result is to identify which noise sources in a disk drive are truly limiting the servo performance. The following section will offer a practical example of this method in the specific case of a magnetic disk drive made by Hewlett-Packard.

PRACTICAL EXAMPLE

The previous sections have described the invention in general. The following section gives a practical example of the use of the method to analyze a Lynx II disk drive made by Hewlett-Packard.

Measurements for the Pareto Method: The Pareto Method constructs, from measurements or design models, component filters and output power spectra; these filters and spectra are then used to compute input noise spectra. The noise spectra are then fed individually through the closed loop model to determine their individual contribution to PES uncertainty.

Available Measurement Points: FIG. 1 illustrates the disk drive track-follow servo system, including the measurement points (shown in bold font) which are available for gathering the required data. These measurement points are (1) PES, the servo demodulator output; (2) $X_{in}$, a loop stimulus point; (3) $X_{out}$, the command current into the actuator power amplifier; (4) $I_{sense}$, a measurement of actuator coil current; and (5)

LDV velocity, measuring the head's radial movement (LDV position was also available, but is better suited in this case for low—frequency measurements—i.e., below 20 Hz). The LDV's velocity output was integrated to obtain displacement information.

All frequency response function (FRF) and power spectral density (PSD) data must be taken over the same bandwidth and with the same resolution (10–6410 Hz and 2 Hz, respectively, in this case).

Instrumentation and Data Processing: In addition to the device under test (3.5-inch disk drive) and associated control software and systems, the primary measurement toolset included a laser Doppler Vibrometer (LDV, from Polytec), a 5-channel digital signal analyzer (HP 3567A), a digital storage oscilloscope (HP 54720D), and Matlab software running on a workstation.

Figure 16A:
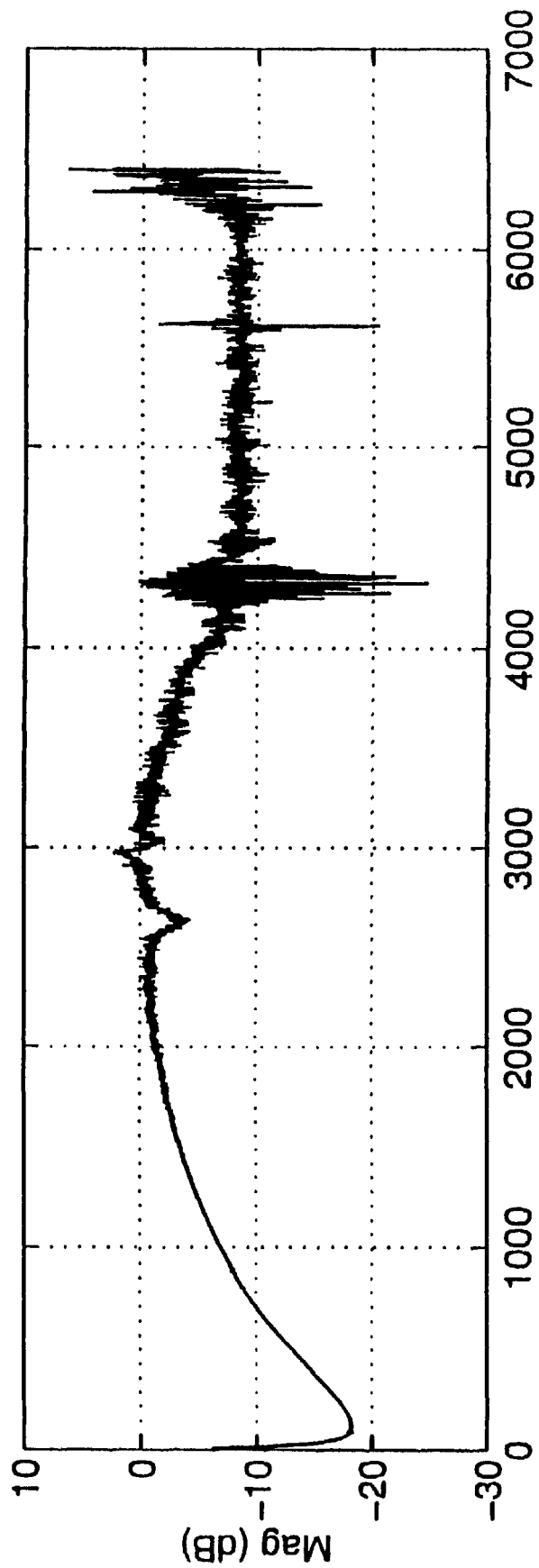
FIGS. 16A and 16B together illustrate a track-follow compensator transfer function.
Figure 16B:
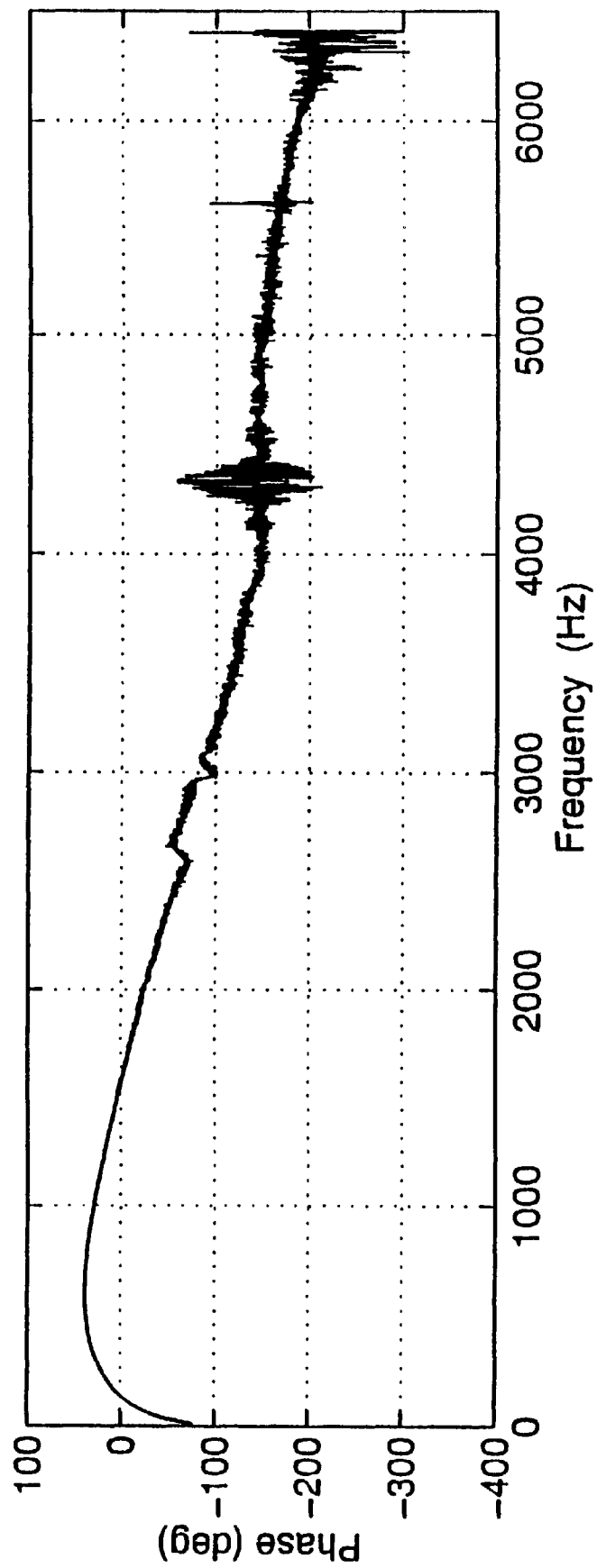
Figure 17A:
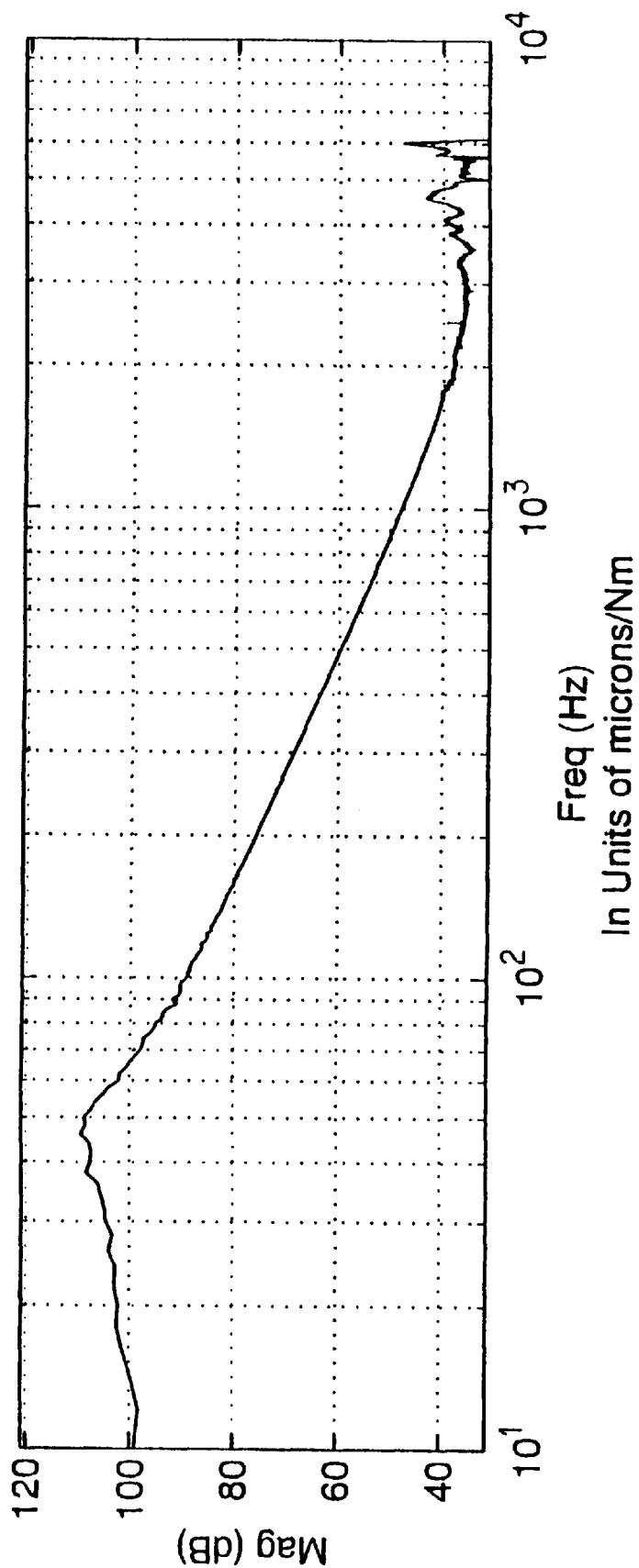
FIGS. 17A and 17B together illustrate an actuator/mechanics transfer function.
Figure 17B:
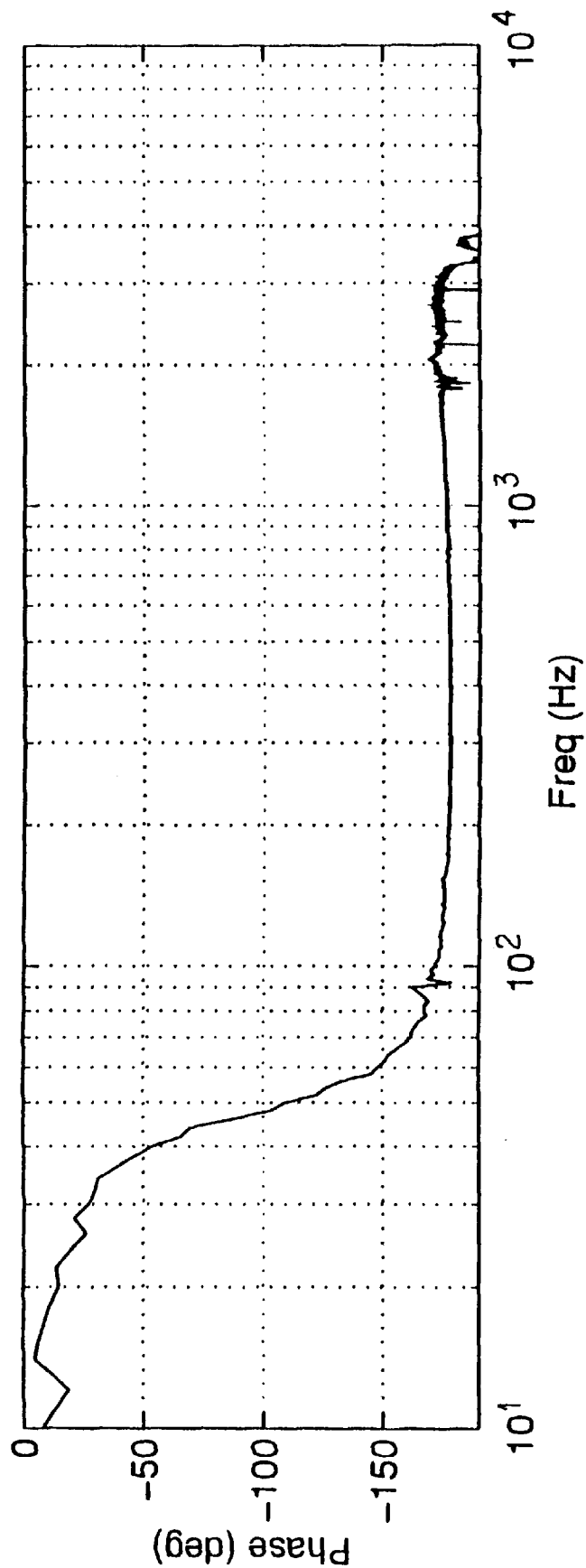

Frequency Response Functions: FIGS. 15A and 15B together illustrate the closed loop transfer function which was obtained by measuring the swept-sine response, $X_{out}/X_{in}$. (The spike near 4400 Hz indicates the Nyquist frequency.) The open loop transfer function can then be calculated from the closed loop measurement. The compensator transfer function, $X_{out}$/PES is shown in FIGS. 16A and 16B and the "mechanics" transfer function, LDV/Torque (where Torque has been calculated by multiplying $I_{sense}$ by $K_1$), is shown in FIGS. 17A and 17B.

Smoothed versions of all three transfer functions were created for more convenient computation throughout the Pareto method. Because the input and output of each block is a power spectrum, it is actually the squared magnitude of each transfer function block (or its inverse) that is used in all computations.

Power Spectra: The following power spectra were obtained from each of the measurement points illustrated in FIG. 1, with system parameters being varied in order to assess the system's sensitivity to each noise source. We present these power spectra in the order suggested by the system diagram, beginning with PES and ending with estimates of Position Sensing Noise (PSN). The analysis of PSN is presented last, because it relies on a different type of measurement and analysis than the other noises.

Detailed discussion of how this data is used in the Pareto method is given below. The data presented here has been filtered to remove synchronous spectral lines, because we were interested primarily in the PES broadband baseline effects.

Figure 18:
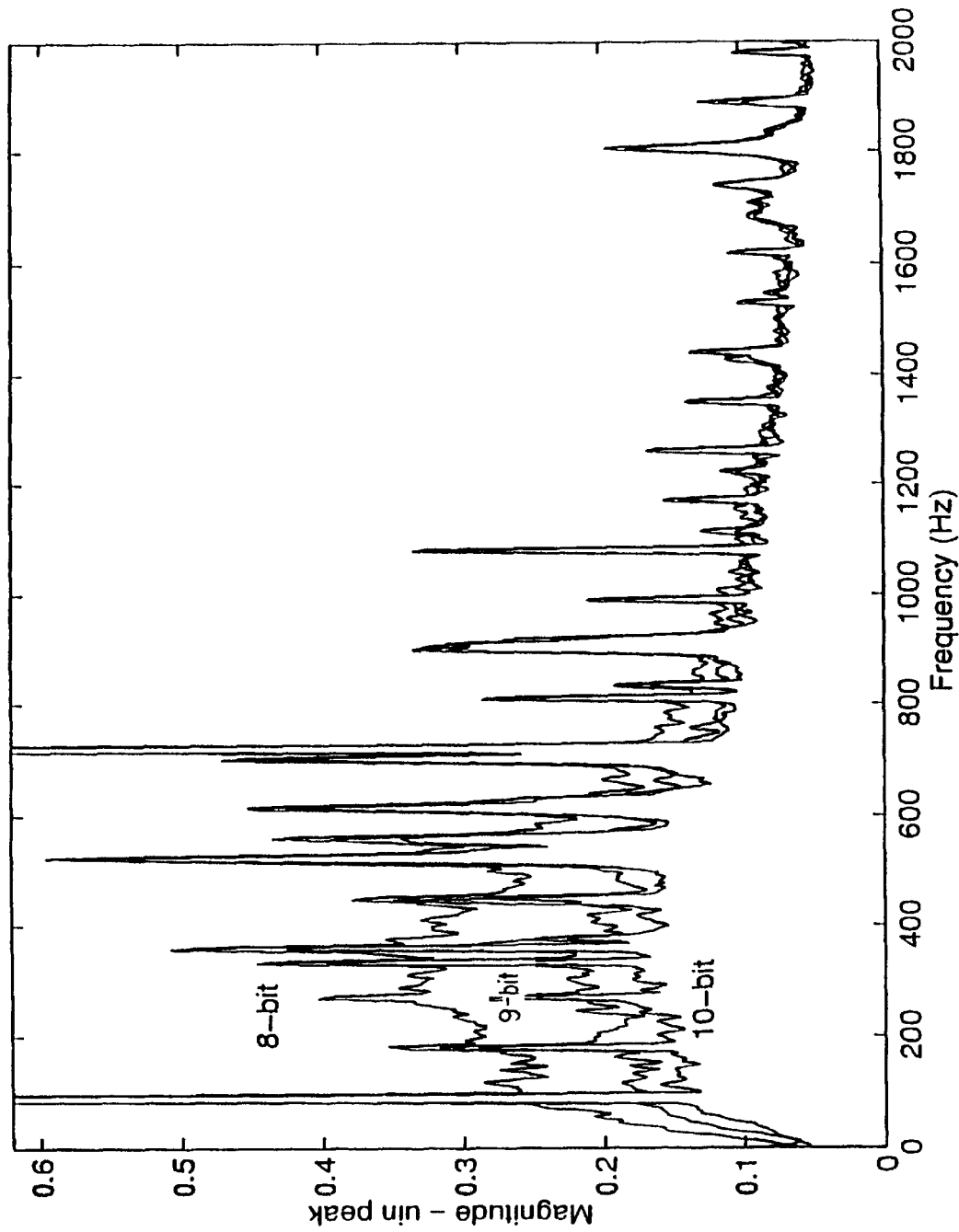
FIG. 18 illustrates the effect of DAC resolution on PES.
Figure 19:
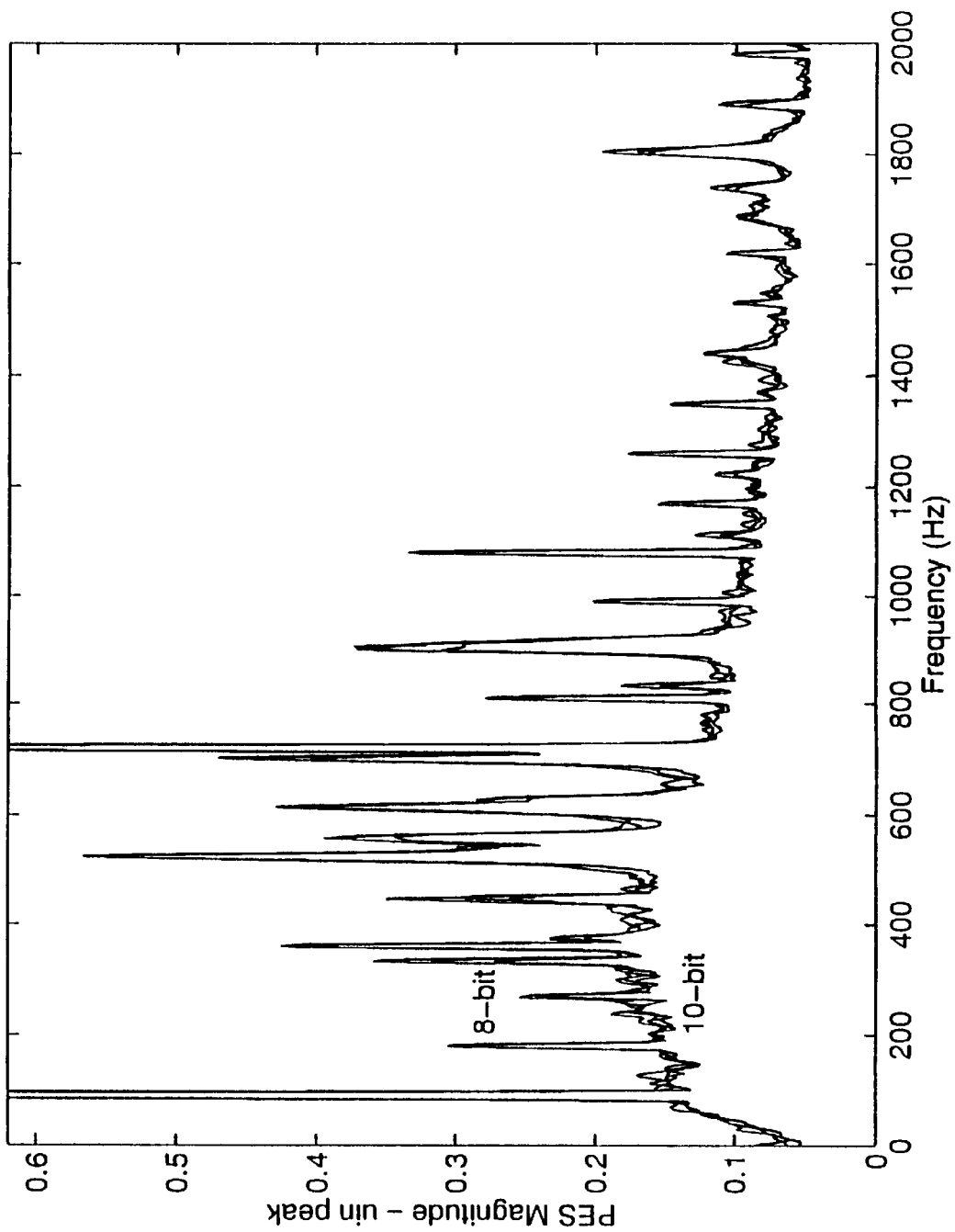
FIG. 19 illustrates the effect of ADC resolution on PES.

DAC and ADC Resolution: One suggested source of PES uncertainty is the finite resolution of the digital-to-analog (DAC) and analog-to-digital (ADC) converters on either side of the compensator. The starting point for determining this uncertainty was to successively mask off bits of each converter and observe changes in the PES power spectrum. This was accomplished by using a bandwidth of 2000 Hz rather than the 6400 Hz bandwidth (which we used in other measurements). FIG. 18 illustrates the sensitivity of PES to DAC resolution, and FIG. 19 shows the comparatively smaller effect of reducing ADC resolution. Note: As mentioned earlier, we concentrated on the PES baseline; hence, sharp spectral lines due to synchronous sources and bearing cage orders have been eliminated. These spectra were later subtracted from each other in order to isolate quantization noise.

Figure 20A:
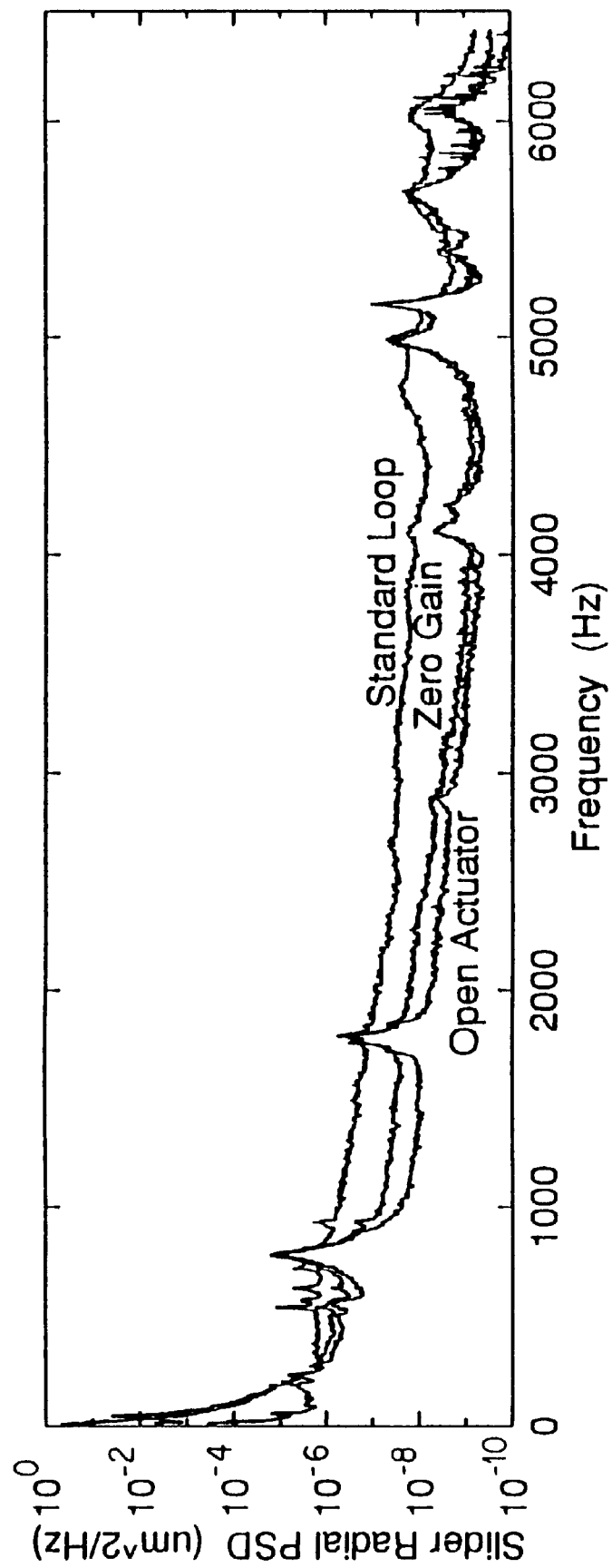
FIGS. 20A and 20B together illustrate radial slider and PES spectra vs. loop gain.
Figure 20B:
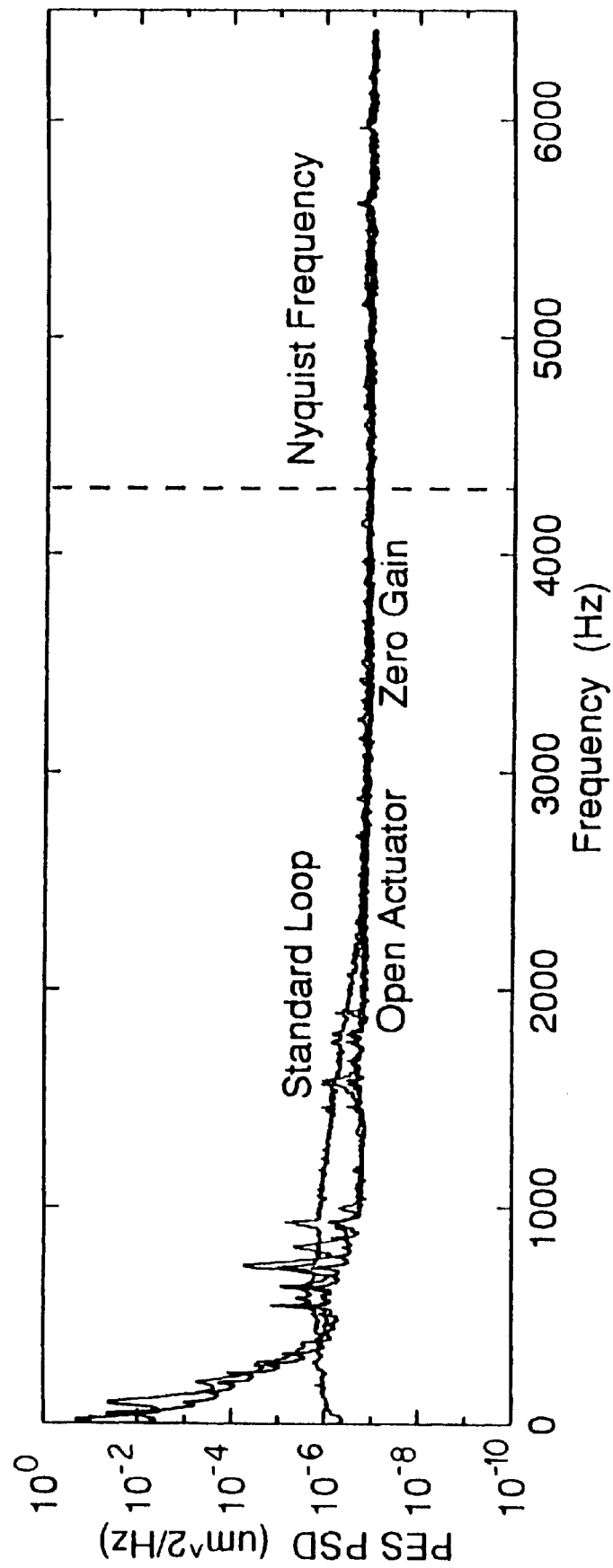

Slider and PES Spectra: FIGS. 20A and 20B illustrate the effect of loop gain on the spectra of PES and radial slider displacement. PES and LDV velocity were measured with (1) standard loop gain, (2) loop gain programmatically set to zero, and (3) the actuator physically disconnected from the servo system. In addition to the elimination of spectral lines mentioned previously, the presence of a LDV setup resonance (approximately 700 Hz) and the known disk resonances (500–1200 Hz (see, J. S. McAllister, "The Effect of Disk Platter Resonances on Track Misregistration in 3.5 Inch Disk Drives," IEEE Transactions on Magnetics, vol. 32, pp. 1762–1766, May 1996) required further smoothing of this data when performing the PES decomposition.

By measuring LDV and PES spectra under these loop conditions, we were able to estimate power amplifier noise (the difference between open-actuator and zero-gain measurements) and airflow or "Windage" (open-actuator response).

Figure 21:
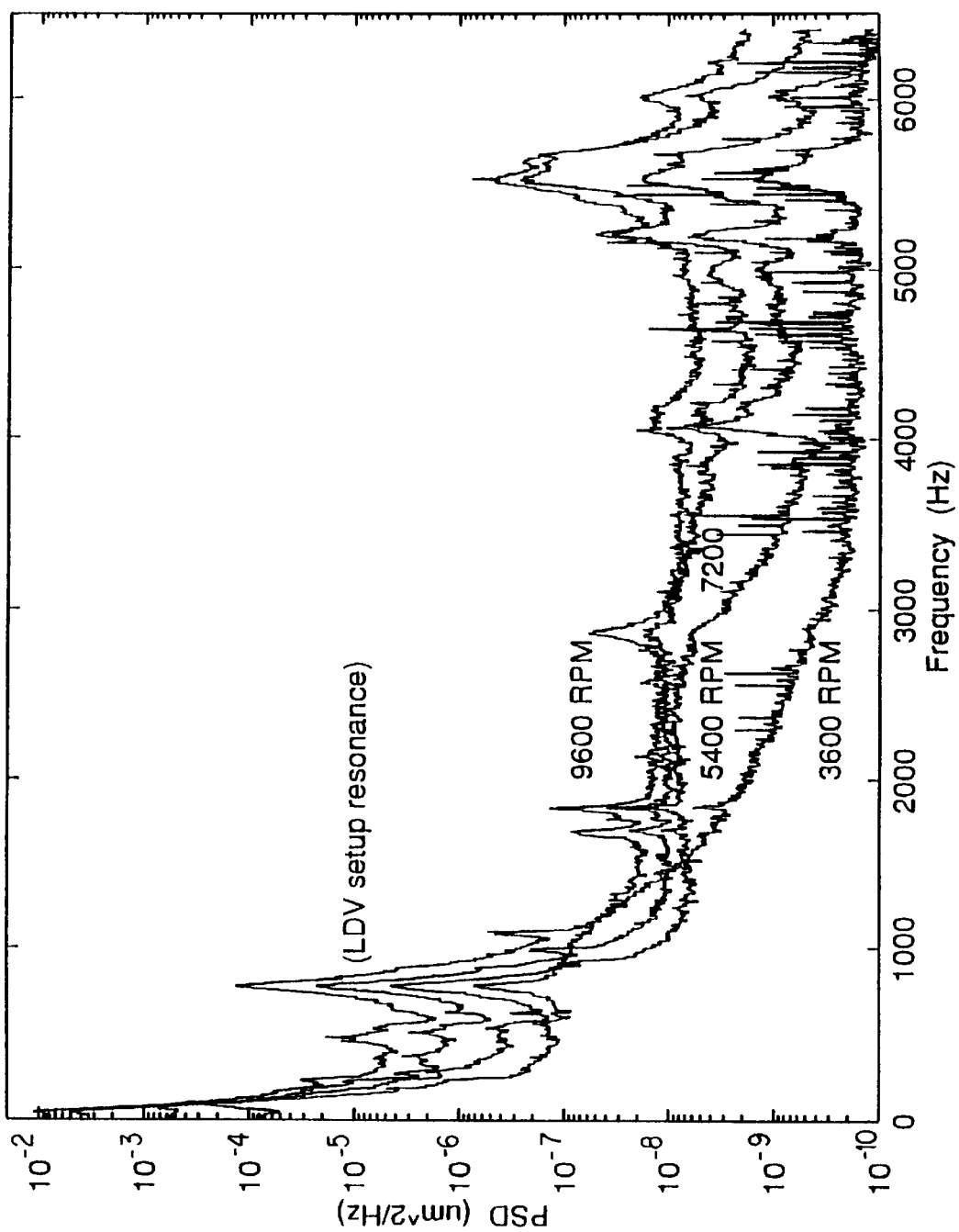
FIG. 21 illustrates radial slider movement vs. RPM.

FIG. 21 is a series of radial slider displacement power spectra which were obtained at different rotational speeds ranging from 3600 to 9600 RPM with the loop open. Again, the 700 Hz LDV setup resonance is shown (and eventually removed from the data). A series of flexure resonances are also shown between 5–6 kHz.

Position Sensing Noise: We now consider the final noise source: Position Sensing Noise (PSN). This represents the error resulting from the process of magnetically sensing and then demodulating position information as a function of the servowritten reference and the location of the head relative to this reference. The basic idea is to conduct a statistical two-way analysis of variance (ANOVA, see, R. E. Walpole and R. H. Myers, Probability and Statistics for Engineers and Scientists, New York, N.Y., Macmillan, second ed., 1972) on the demodulated servo signal in order to provide an estimate of PSN.

The ANOVA technique has been applied to both continuous- and sectored-servo systems; differences in how each is handled are included below. This section describes results for a continuous-servo case, but the method was originally developed for a sectored-servo disk drive (see, T. Hurst and D. Henze, "Estimating Position Sensing Uncertainty in a Disk Drive Track-Follow System," tech. rep., Hewlett-Packard Laboratories, Palo Alto, Calif., U.S.A., October 1994).

ANOVA Modeling Assumptions: The purpose of using the ANOVA method is to partition statistical variations in data between meaningful sources—in this case, between error due to actual displacement and error due to PSN. In order to perform this analysis, we assume zero displacement across a set of n servo bits during a single servo burst observation. This seems plausible, given the relatively low frequencies of mechanical motion (less than 10 kHz) and short servo data window (less than 20 microseconds). Thus, bit-to-bit variations within an observed servo burst will be assumed to be completely due to position sensing uncertainty.

The following description uses a combination of standard statistical terms and definitions, as well as assumptions which were applied to the position sensing process in both continuous- and sectored-servo cases. Subscripts A and B apply to the sectored-servo case, and subscripts C and D refer to the continuous-servo case, for which results are reported in below. Where the analysis proceeds similarly, these subscripts are replaced with the general subscript Y.

Samples of size n are selected from each of k populations (each sample is from the same servo burst, observed at k different times). In the sectored-servo case, the natural value of n is the number of servo bits within a given sector; for the continuous-servo case, the number chosen is somewhat arbitrary—short enough to insure the zero-displacement assumption described above but long enough to provide statistically significant variability. In the continuous-servo case reported here, n=18 and k=32, yielding (18*32)−1=575 statistical degrees of freedom. Values for each ensemble of n bits result from different treatments, which are not under our direct control, but rather, applied by the servo system as it attempts to follow track center. Treatments and measurement error are both assumed to be random and mutually independent.

The response for each servo bit can now be written as $$y_{ij} = \mu + \Delta_i + \epsilon_{ij} \quad (8)$$

$y_{ij}$ is a value of the random variable (for each A/B/C/D bit)

$$Y_{ij} = \mu + \Delta_i + E_{ij}; \ i=1, 2 \ldots k, j=1, 2 \ldots n \quad (9)$$

In our case, the right-side components of Equation 9 are $\mu$, the mean value of PES; $\Delta_i$, the effect due to random displacement error (the "treatment"); and $E_{ij}$, the effect due to measurement error. Both $\Delta_i$ and $E_{ij}$ are assumed to be normally distributed around a zero mean. The variance of $\Delta_i$ is $\sigma^2_\Delta$, and the variance of $E_{ij}$ is $\sigma^2_Y$.

The expected mean square value of treatments (displacement) and measurement error are given, respectively, by $$E(SSD)_Y = \sigma^2_Y + n\sigma^2_\Delta; \ E(SSE)_Y = \sigma^2_Y \quad (10)$$

where $$SSD = n \sum_{i=1}^{k} (\overline{Y}_{i.} - \overline{Y}_{..})^2; \ SSE = \sum_{i=1}^{k} \sum_{j=1}^{n} (Y_1 - \overline{Y}_{i..})^2 \quad (11)$$

and, averaging across either k rows or n columns, (or both, for $\overline{Y}_{..}$) is denoted by a dot in the subscript.

Estimates of $\sigma^2_\Delta$ and $\sigma^2_Y$ are computed by dividing SSD and SSE by the appropriate number of degrees of freedom:

Mathematically peak-detect the servo bit values.

Use the ANOVA procedure outlined above to estimate the per-bit variance in position sensing, $\sigma_Y$.

Mathematically generate a Gaussian noise time sequence X(t), using $\sigma_Y$ and a random number generator.

Low-pass filter X(t) by the servo demodulation filter:

$$-G(s) = \frac{10^{10}}{A_s^3 + B_s^2 + C_s^5 + D};$$

$$-Z(t) = lsim(G(s), X(t), t);$$

Isim is a Matlab linear system simulator routine; For the current servo system, A=8.61×10$^7$, B=3.95×10$^{-1}$, C=1.49×10$^5$, and D=10$^{10}$. The resultant $\sigma^2_S$ of Z(t) is an estimate of PSN.

Test Setup and Data Processing: The servo signals were accessed by connecting a HP 54720D digital oscilloscope to drive electronics via a Tektronix P6046 differential probe in order to improve common mode noise rejection. Data acquisition was triggered using the drive's once-around index pulse. The number of instantaneous runs taken was 32 (each having 3278 data points). An ASCII file was produced for each of the 32 runs and transferred to the Matlab environment to compute the peak-detect C- and D-bit values for each set of 18 servo frames. The result was an 18-by-32 array of values for ANOVA use.

TABLE 1

Analysis of Variance Estimate, Lynx-II Sensor Error.

| Source of Variation | C-Bits | | | | D-Bits | | | |
|---|---|---|---|---|---|---|---|---|
| | Sum of Squares | DOF | Mean Square | Sqrt (micron) | Sum of Squares | DOF | Mean Square | Sqrt (micron) |
| Displacement | 1.58 | 31 | 0.051 | 0.226 | 1.54 | 31 | 0.050 | 0.223 |
| Meas. Error | 38.05 | 544 | 0.070 | 0.264 | 41.25 | 544 | 0.076 | 0.275 |
| Total | 39.63 | 575 | | | 42.79 | 575 | | |

$$\sigma^2_\Delta = \frac{SSD}{(k-1)}; \ \sigma^2_Y = \frac{SSE}{k(n-1)} \quad (12)$$

Finally, the variance of PSN, $\sigma^2_S$, depends on how the individual servo bits are processed, which is different for sectored- and continuous-servo cases. Again, relying on the independence assumption, the sectored-servo PSN variance will be given based on a pair-wise subtraction, $Y_A - Y_B$, i.e., $$\sigma^2_s = \frac{\sigma^2_A}{n} + \frac{\sigma^2_B}{n} \ (sectored) \quad (13)$$

Figure 22:
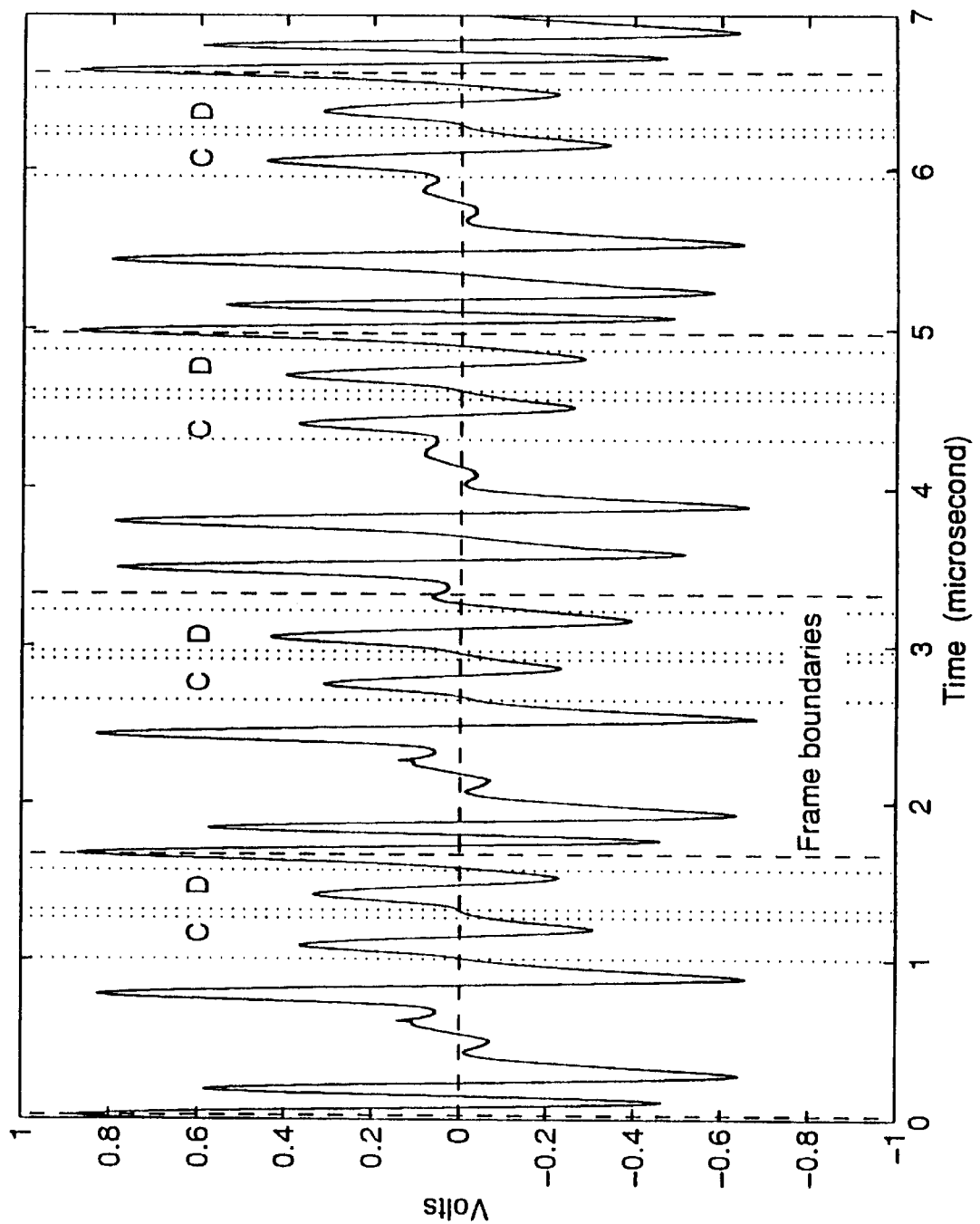
FIG. 22 shows a four-frame sample of servo signal (averaged)
Figure 23A:
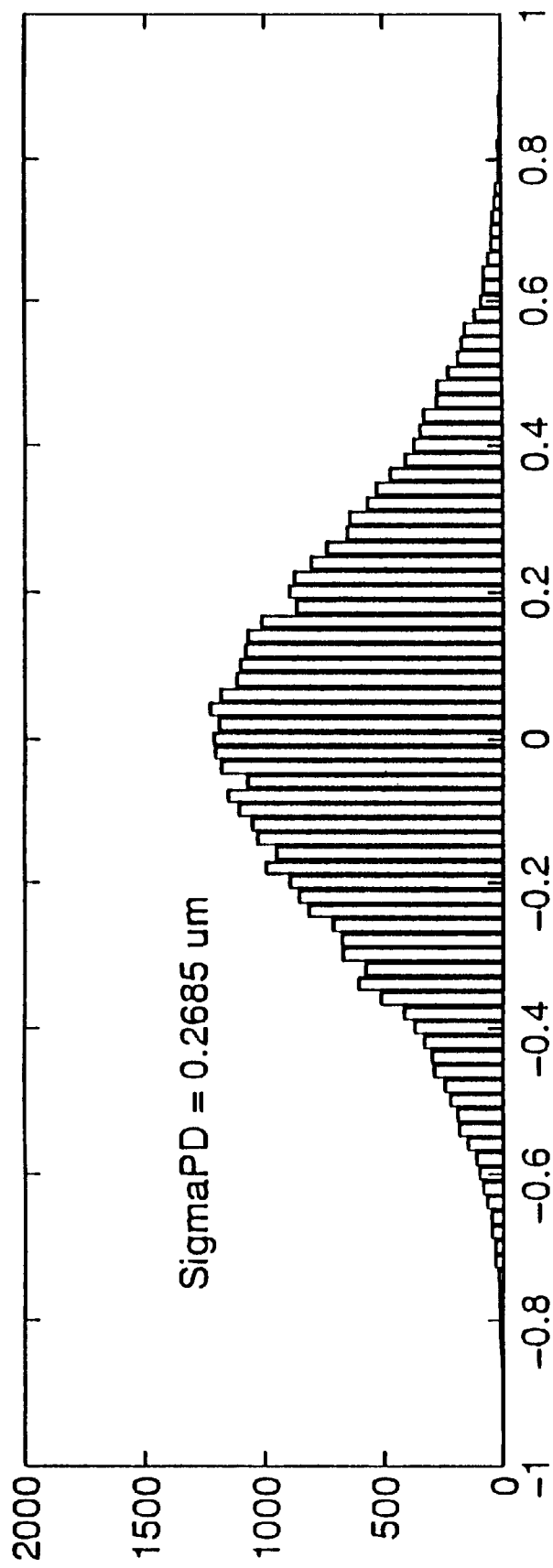
FIGS. 23A and 23B together illustrate measured and filtered position sensing noise.
Figure 23B:
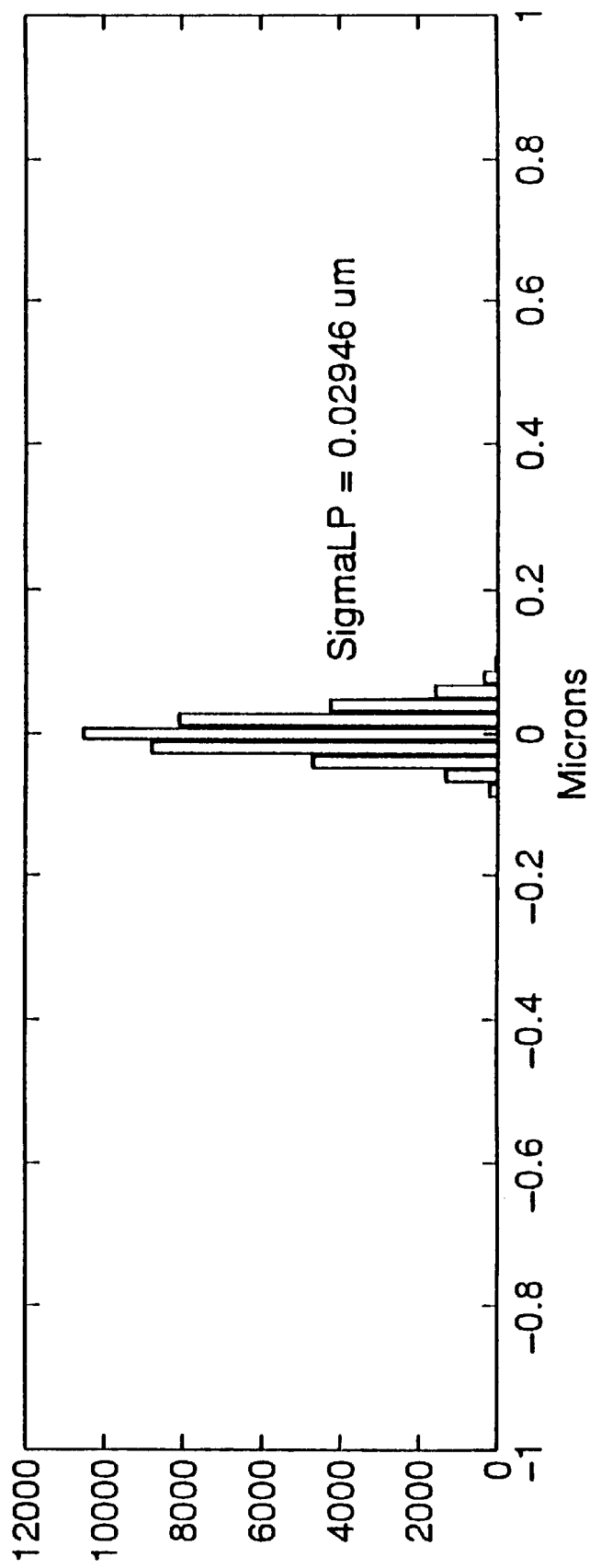

For the continuous-servo case, $\sigma^2_s$ is computed in the following manner:

Digitize several samples (at least 30) of the servo waveform (FIG. 22 shows 4 of the 18 frames observed).

Test Results: The ANOVA summary for our continuous-servo case is presented in Table 1. The bit variances are given by $\sigma^2_C = 0.264 \ \mu m^2$ and $\sigma^2_D = 0.275 \ \mu m^2$. So, a mid-range value of 0.269 $\mu m^2$ is used for $\sigma_Y$. This value was used to generate a random sequence X(t), which was then filtered using the Matlab Isim routine. Histograms of the sensed and demodulated distributions are given in FIG. 23A (peak-detected servo bit values) and FIG. 23B (low-passed distribution of servo bit values). Thus, $\sigma_S = 0.0295$ microns. This value was shown to closely match the predicted value obtained from the Pareto decomposition.

Measurement Summary: The measurements described above are accomplished by connecting to test points which are typically available for all disk drive products in the normal development process. The idea is to isolate each component of the servo system by making measurements on either side—where possible—or, as the case for Position Sensing Noise, collect data and analyze it under a set of reasonable assumptions (i.e., white noise). With this data in hand, it is possible to complete the third step in the Pareto method, namely, determining the effects of individual noise contributors on PES. Thus, the collection of required data is accomplished in a fairly straightforward manner, assuming care is taken to take sufficient, high-quality measurements.

The Strata of the PES as Composed of Noise Source PSDs: The preceding description has shown a method for separating the contributors of various sources of uncertainty "noises") in the position error signal (PES) of the track-follow servo in a disk drive and how specific measurements are made to isolate individual noise sources and to create appropriate filters from which the noises can be examined at their source and at PES. This section completes the process by using the method and the measurements to feed the appropriate spectra through the appropriate loop filters to yield both the input noise spectra and their effect—both individually and cumulatively—on PES. The PSDs are then integrated in frequency to yield the corresponding power spectra and variances.

A key philosophy of the Pareto Method is to eliminate all the impossible, observe what is left, and from there determine the true sources of noise in a disk drive's Position Error Signal (PES). To recap what was described above, the method involves three distinct steps:

isolate measurement of noise source ("common mode reject"), filter backwards to obtain the PSD of the noise source, and filter forwards to obtain the effect of this particular noise on the PES PSD.

One can then compare these PSDs at PES to each other and add them to cumulative PES PSD.

This section applies this method to a set of noise source isolation measurements described above to finally uncover the relative significance to PES of each noise source. This portion has the following organization. A first subsection goes through each individual measured noise source both at the source and at PES. A second subsection puts these together at PES. A third subsection then shows a small subset of what can be extrapolated from these results. Some conclusions are presented in a final subsection.

Individual Noise Sources: In this section, we briefly present the results obtained when the measurements to isolate a noise source are then filtered back to the noise source input and then forward to PES.

Power Amplifier: The power amplifier noise is measured directly at $I_{sense}$. This measurement is made with the loop open, so no loop unwrapping is necessary. Furthermore, the power amplifier noise is modeled to enter the system right in front of $I_{sense}$. Thus, the backwards filter to the source is simply unity (1) and the forward filter from the source noise PSD to PES PSD is $$\left\| \frac{K_t P(s) D(s)}{1 + K_t P(s) D(s) C(s) A(s)} \right\|^2.$$

Figure 24A:
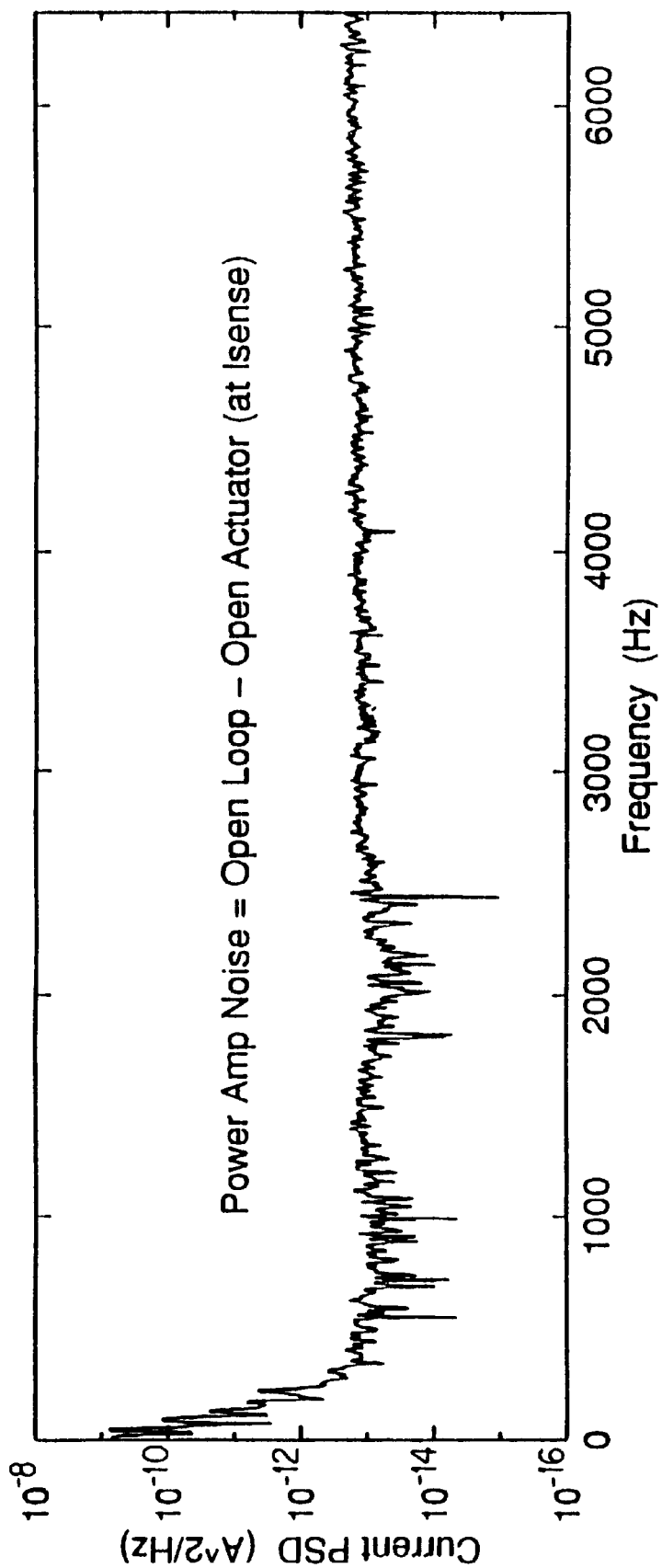
FIGS. 24A, 24B and 24C together illustrate a power amp noise PSD.
Figure 24B:
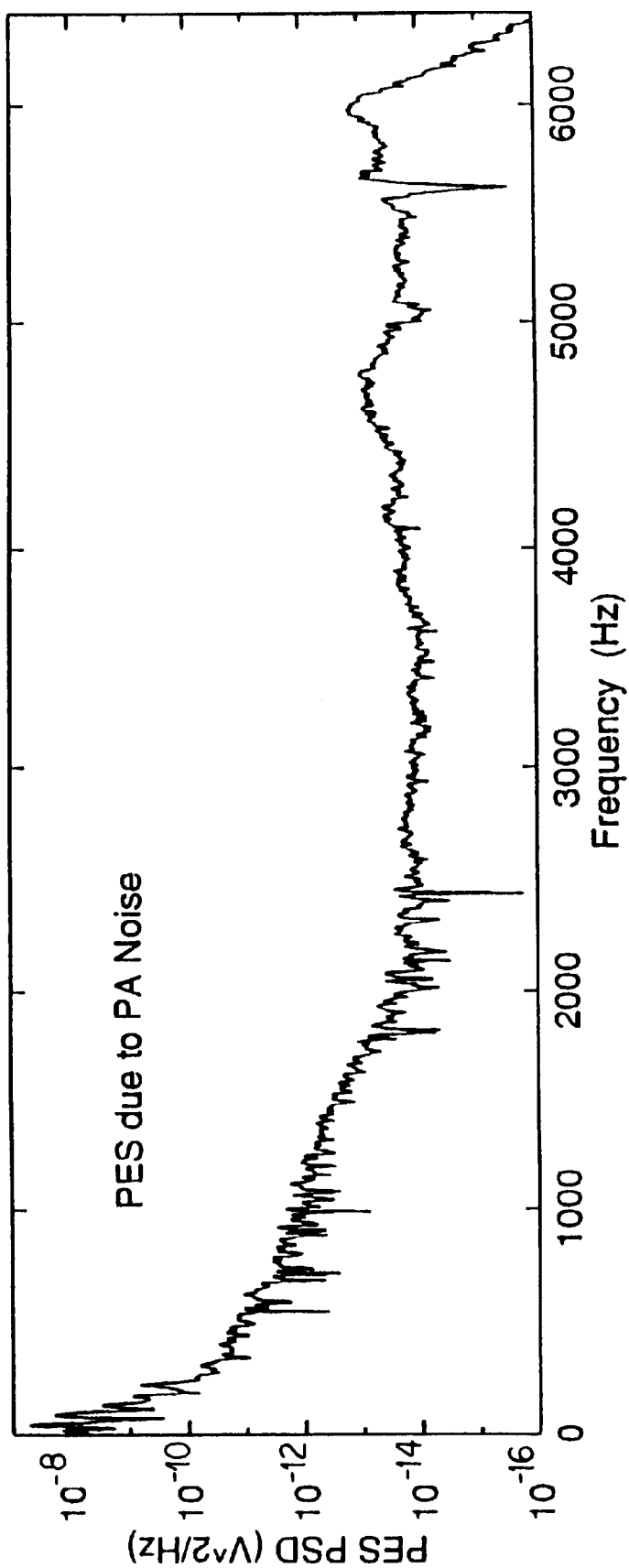
Figure 24C:
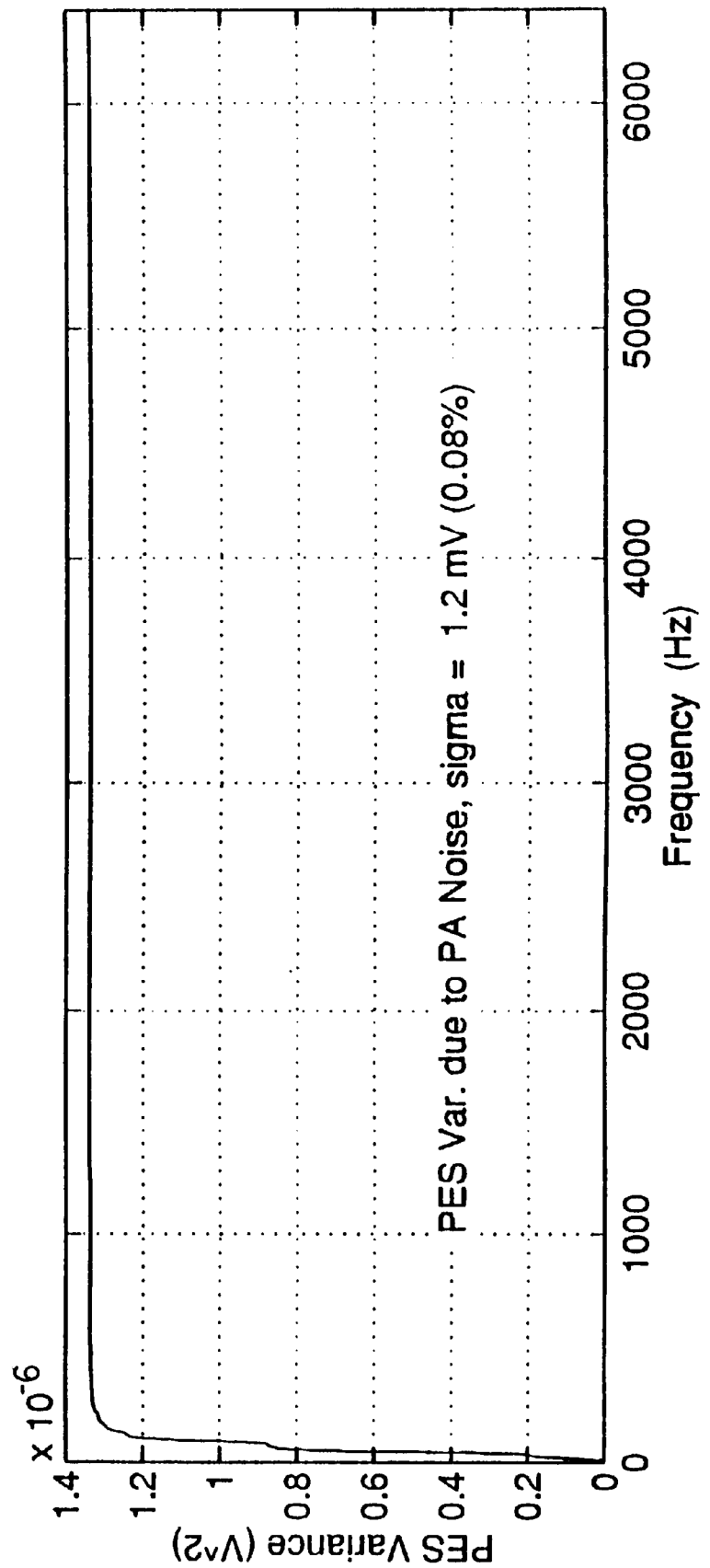

Note from FIGS. 24A, 24B and 24C that power amp noise is only significant at low frequency.

Windage: Windage is measured using the Laser Doppler Vibrometer (LDV) to measure the velocity of the readback head and then integrate it in time for the head position. (For frequencies above 10 Hz, this is considered more accurate than using a direct position measurement scheme.) The Windage is the difference between the head motion when the drive actuator is electrically disconnected from the power amp but the disk is spinning and the same measurement when the disk is stopped. In the former case, it can take several iterations to find a spot where the head will sit comfortably in order to make a reasonable measurement. Given that the measurement is made, the filter back to the source is given by $$\left\| \frac{1}{P(s)} \right\|^2,$$

and the filter forward from the source to PES is $$\left\| \frac{P(s) D(s)}{1 + K_t P(s) D(s) C(s) A(s)} \right\|^2.$$

Figure 25B:
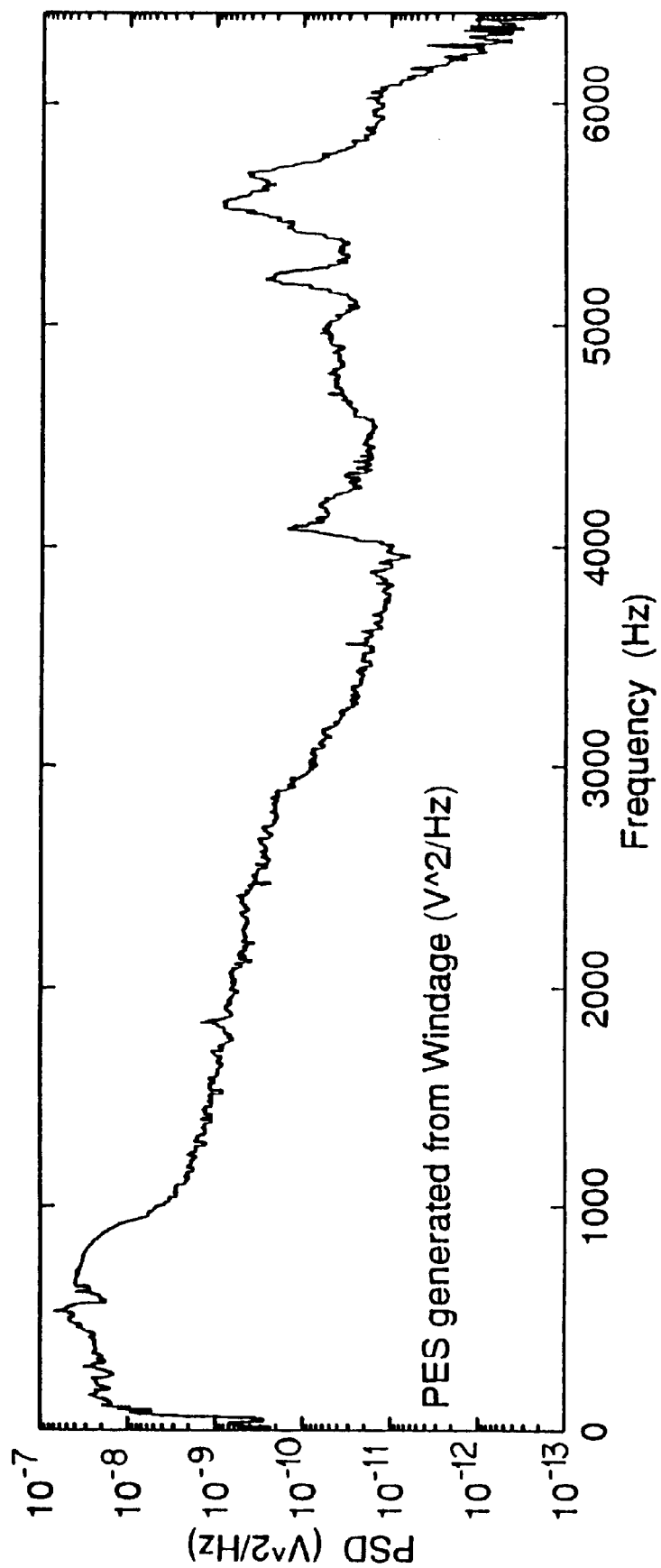
Figure 25C:
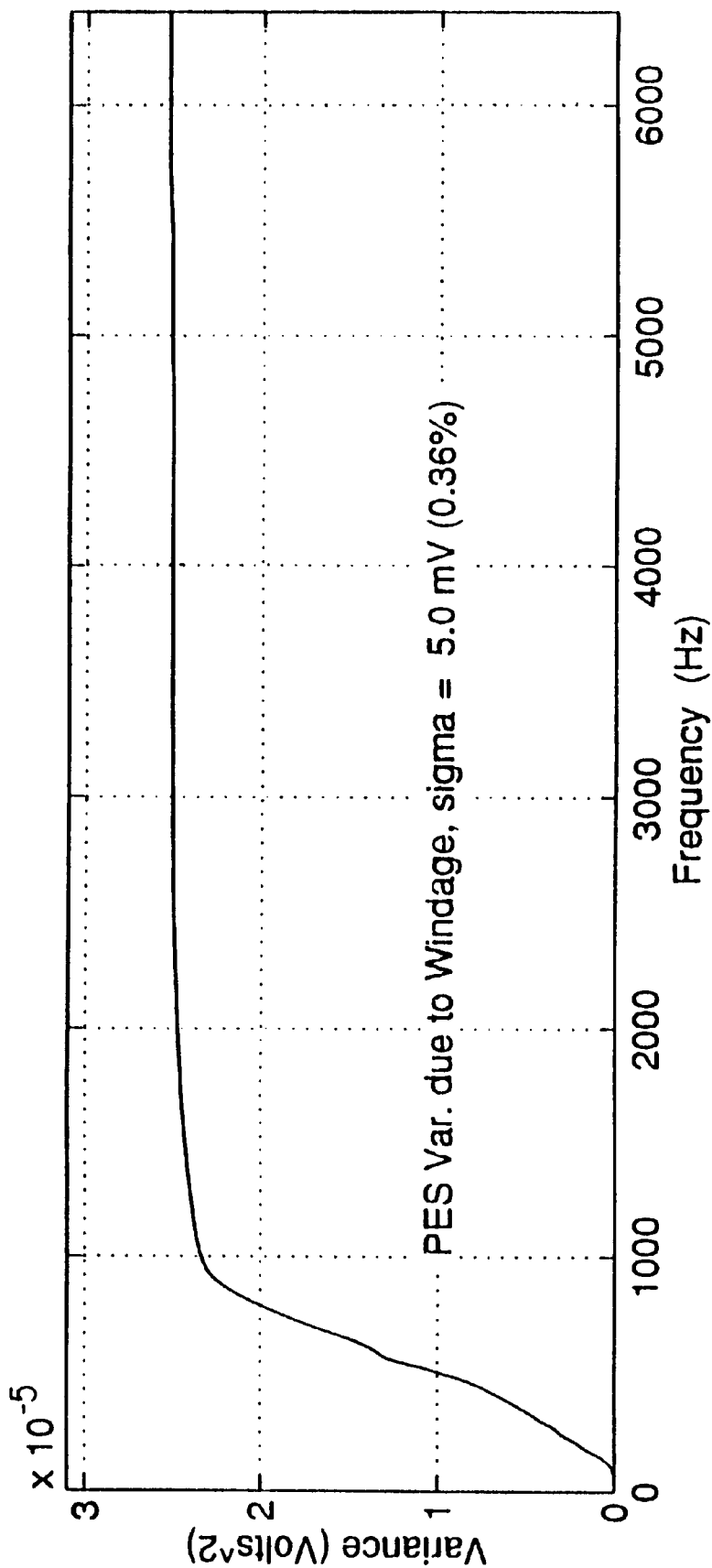

Note that the effect of Windage as shown in FIGS. 25A, 25B and 25C is most significant below 1 kHz.

DAC Noise: In order to measure the effects of quantization on the PES PSD, bits were artificially masked off in the drive DSP and then the PES PSD was recorded. In order to isolate out the noise due to the DAC quantization the measurements of PES PSD with a 10 bit DAC was subtracted from the PES PSD with a 9 bit DAC. This gave the effect of losing that one bit of quantization. The same operation was repeated with the 8 bit DAC PES PSD-9 bit DAC PES PSD and 8 bit DAC PES PSD-10 bit DAC PES PSD.

Figure 26A:
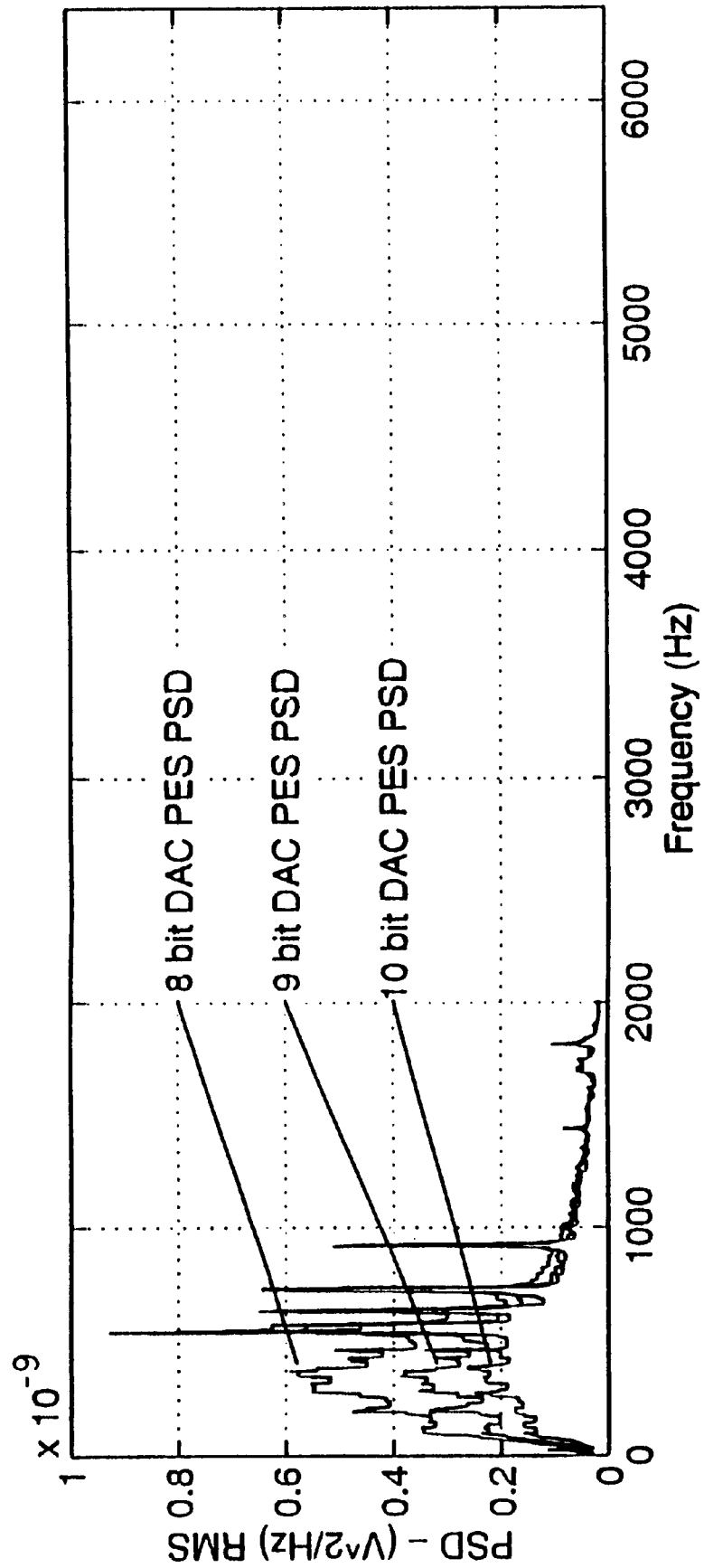
FIGS. 26A, 26B and 26C together illustrate a DAC noise PSD.
Figure 26B:
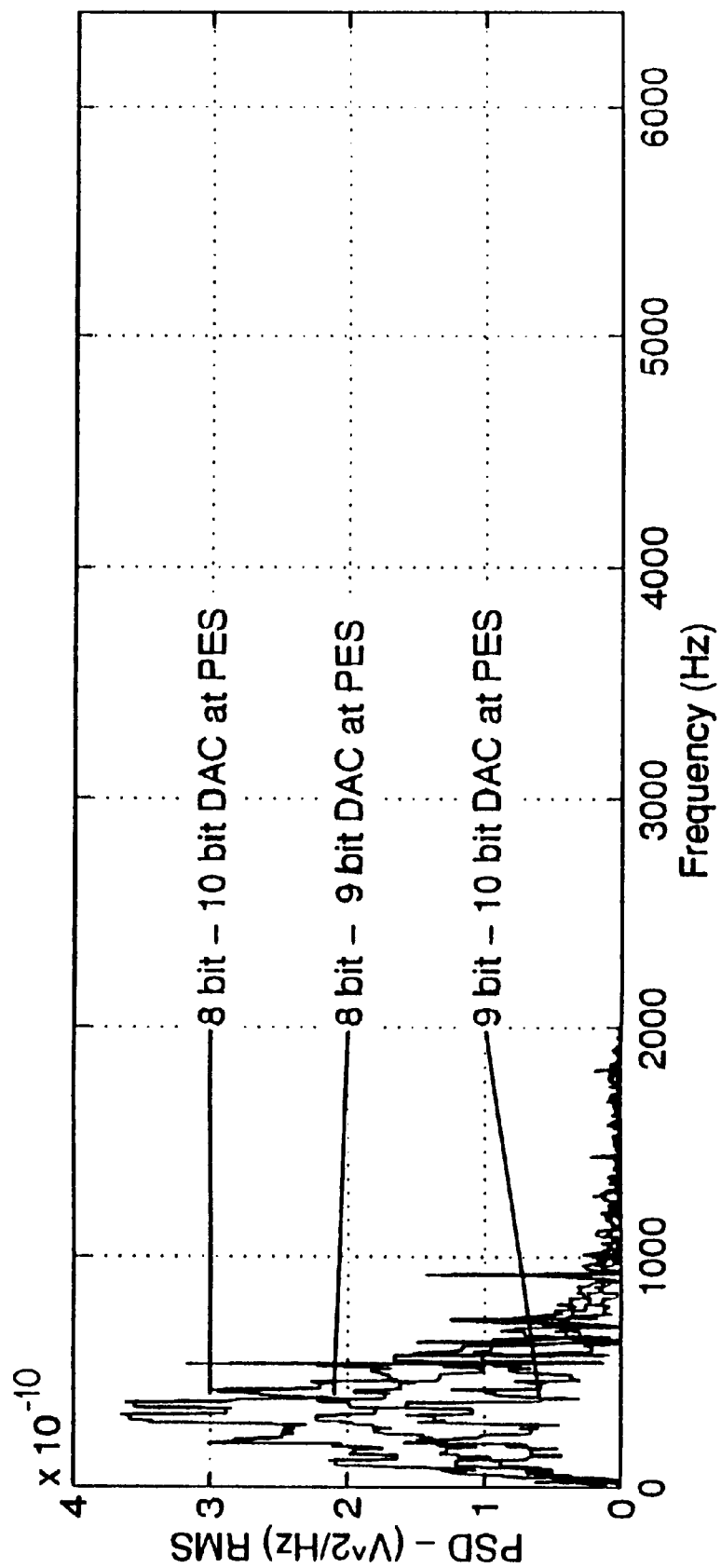
Figure 26C:
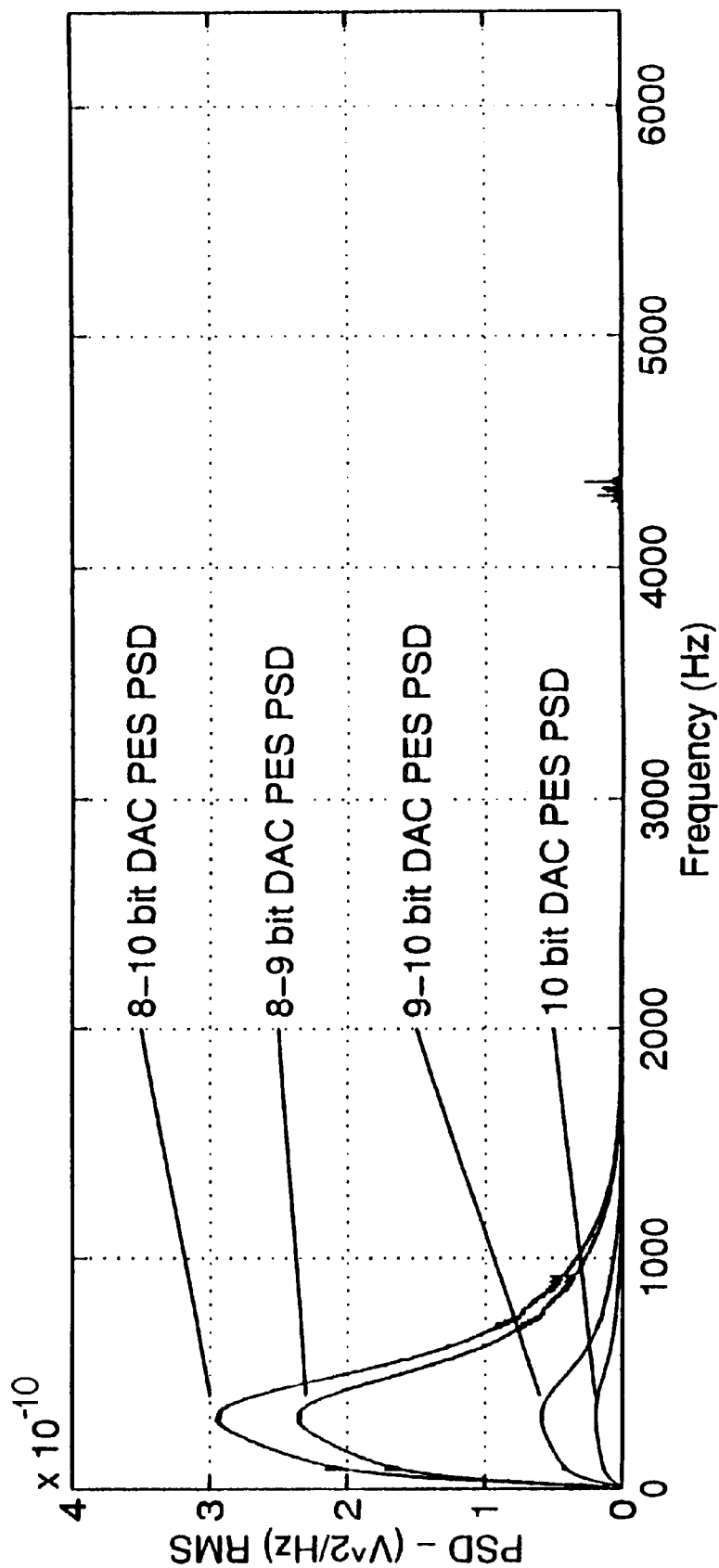

However, due to the extremely small levels of these signals, these differences themselves were quite noisy. Filtering them backwards from PES to the DAC only amplified the noise. Thus, in this instance, the previous method was ineffective. Instead, the standard uniform white noise model was used as an input PSD to the DAC. The difference between different quantizer levels could then be filtered forward to PES using the filter $$\left\| \frac{K_t P(s) D(s) A(s)}{1 + K_t P(s) D(s) C(s) A(s)} \right\|^2 = \left\| \frac{C(s)}{T_{cl}} \right\|^2,$$

which essentially matched the shape of measured differences. The level of the input DAC noise was then scaled to get an effective level of $$q = \frac{0.3125 \text{ V}}{512 \text{ counts}} * \frac{1}{9}$$

which was ⅑ the level one would calculate from the system model. The PES noise generated by the Lynx II's 10 bit DAC is derived in this way and shown in the plot of FIG. 26C (DAC noise PSDs from uniform input). Note that FIG. 26A shows PES PSD vrs. DAC resolution and FIG. 26B shows PES PSD of differences between resolutions.

Figure 27A:
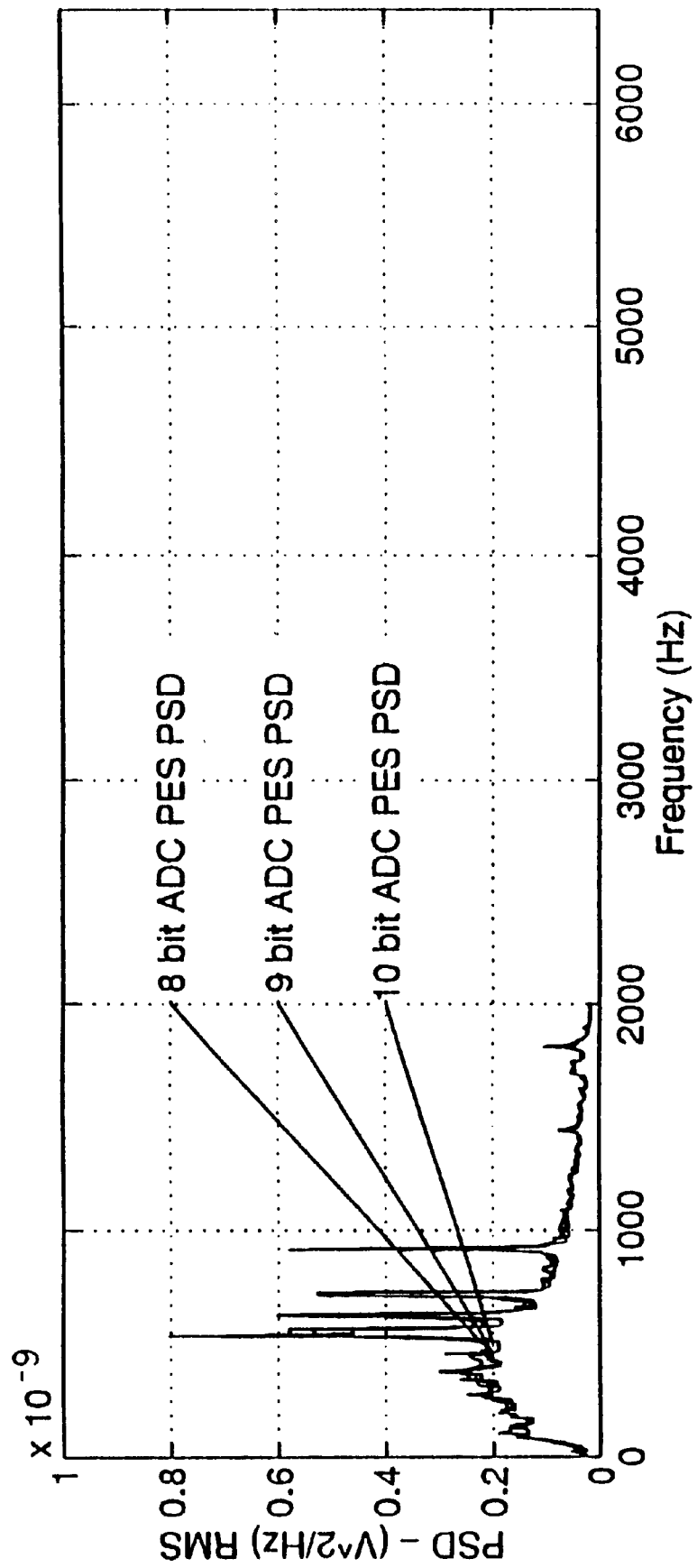
FIGS. 27A, 27B and 27C together illustrate an ADC Noise PSD.
Figure 27B:
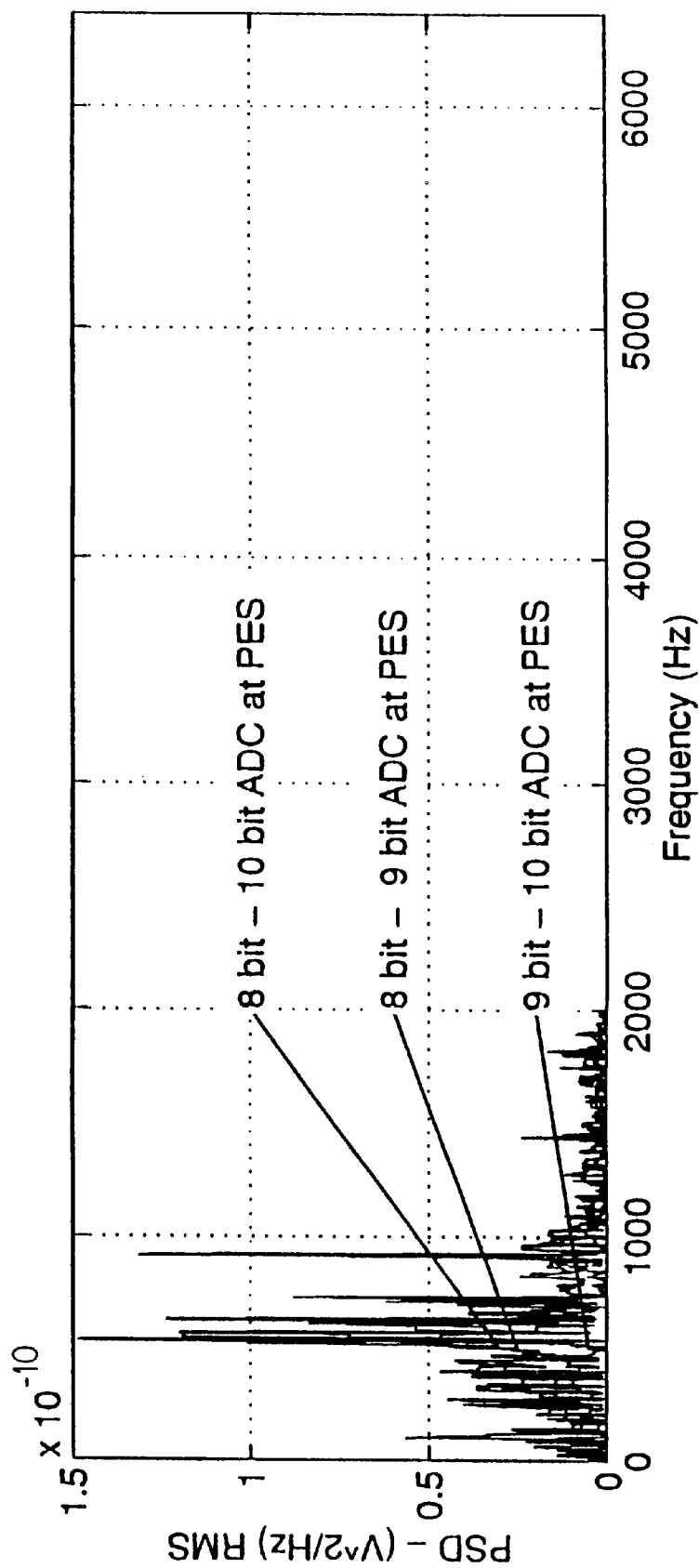
Figure 27C:
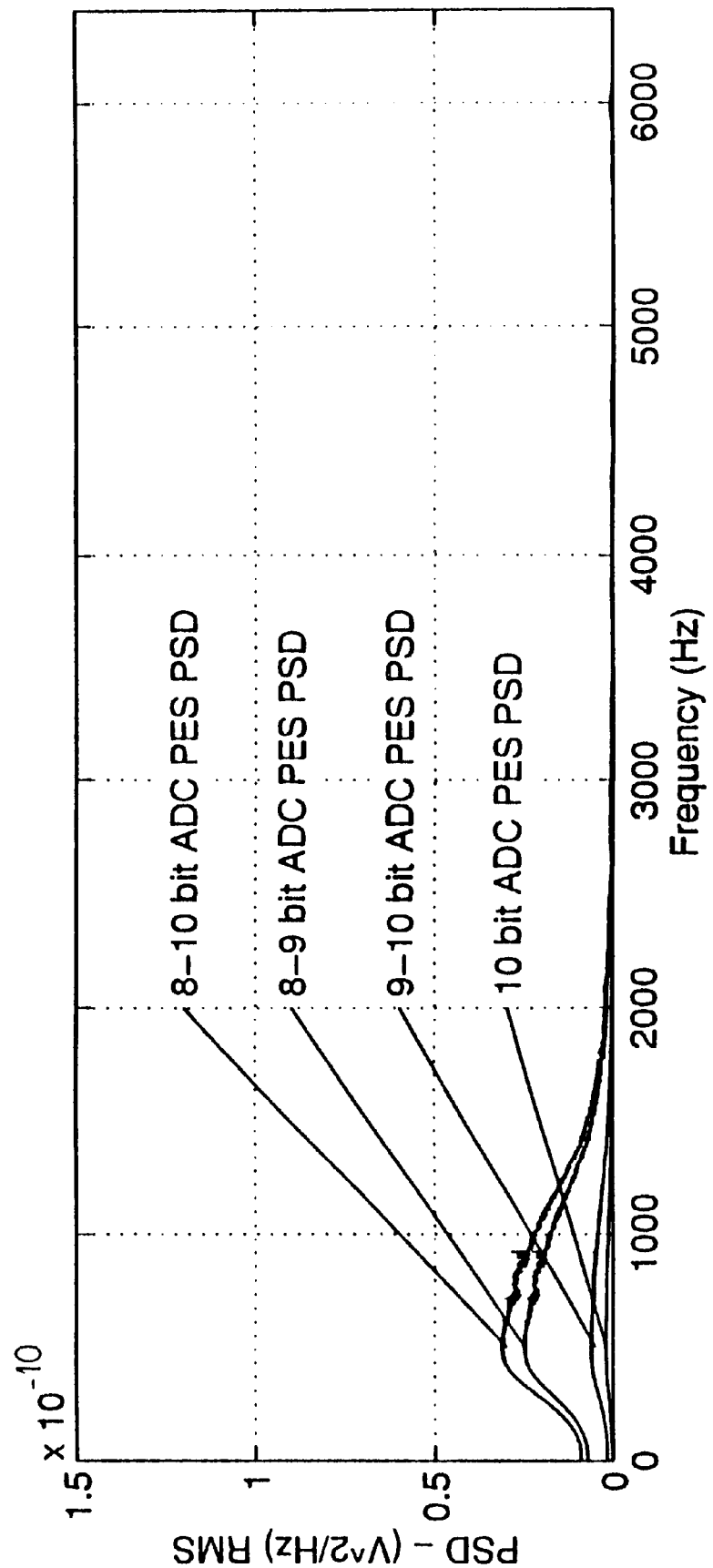

ADC Noise: The problems encountered with backwards filtering DAC noise measurements were even worse with ADC noise measurements. However, using the same method as was done for the DAC noise measurements, yielded a uniform white noise input PSD forward filtered from the ADC to PES using $$\left\| \frac{K_t P(s) D(s) C(s) A(s)}{1 + K_t P(s) D(s) C(s) A(s)} \right\|^2 = \left\| \frac{1}{T_{cl}} \right\|^2,$$

which was then adjusted in amplitude to obtain an input quantization of $$q = \frac{1.25 \text{ V}}{512 \text{ counts}} * \frac{1}{20}$$

or 1/20 of the ADC noise one would obtain from the nominal system model. The PES noise generated by the Lynx II's 10 bit ADC is derived in this way and shown in the plot of FIG. 27C (DAC noise PSDs from uniform input). Note that its effect on PES is even lower than that of the DAC. Also note that FIG. 27A shows PES PSD vrs. DAC resolution and FIG. 27B shows PES PSD of differences between resolutions.

Figure 28A:
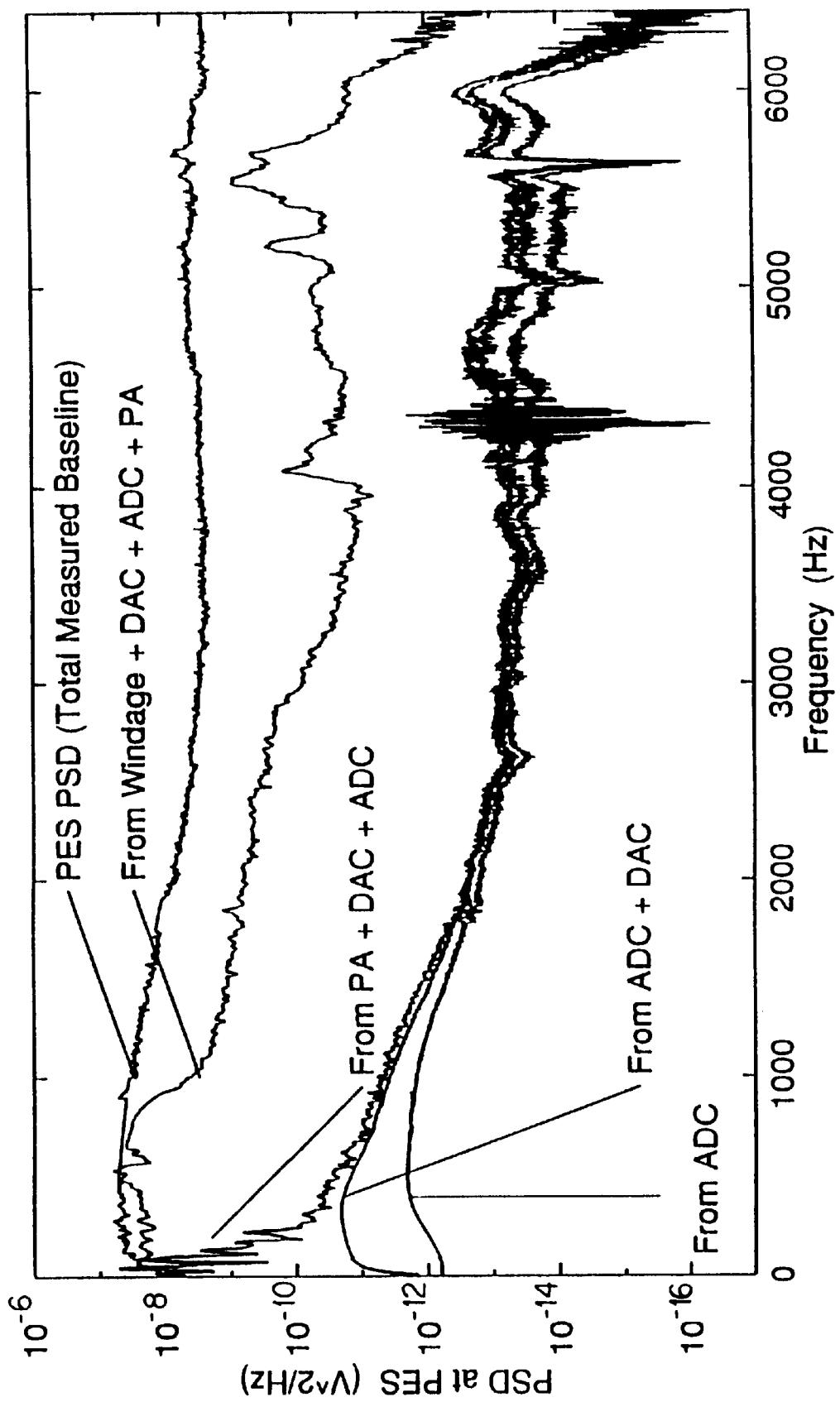
FIGS. 28A and 28B together illustrate cumulative noise source PSDs at PES.
Figure 28B:
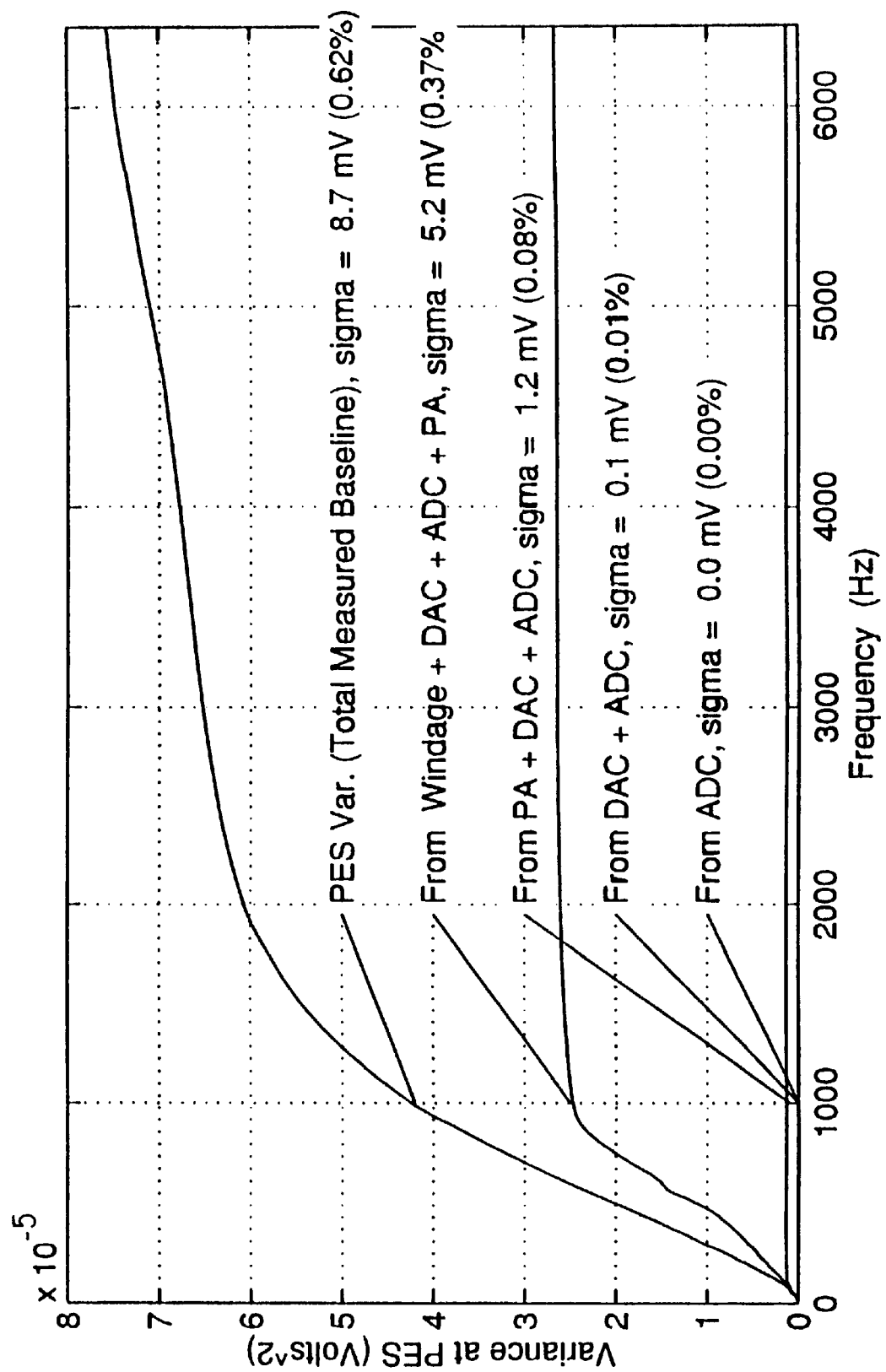

Putting It All Together at PES: Given that several of the individual noise sources and their effects on PES have been identified, they can now compared individually or stacked up cumulatively as shown in FIGS. 28A and 28B. (The latter is shown because the stacking of the PSDs and variances is more readable than lines which criss-cross.)

Figure 29:
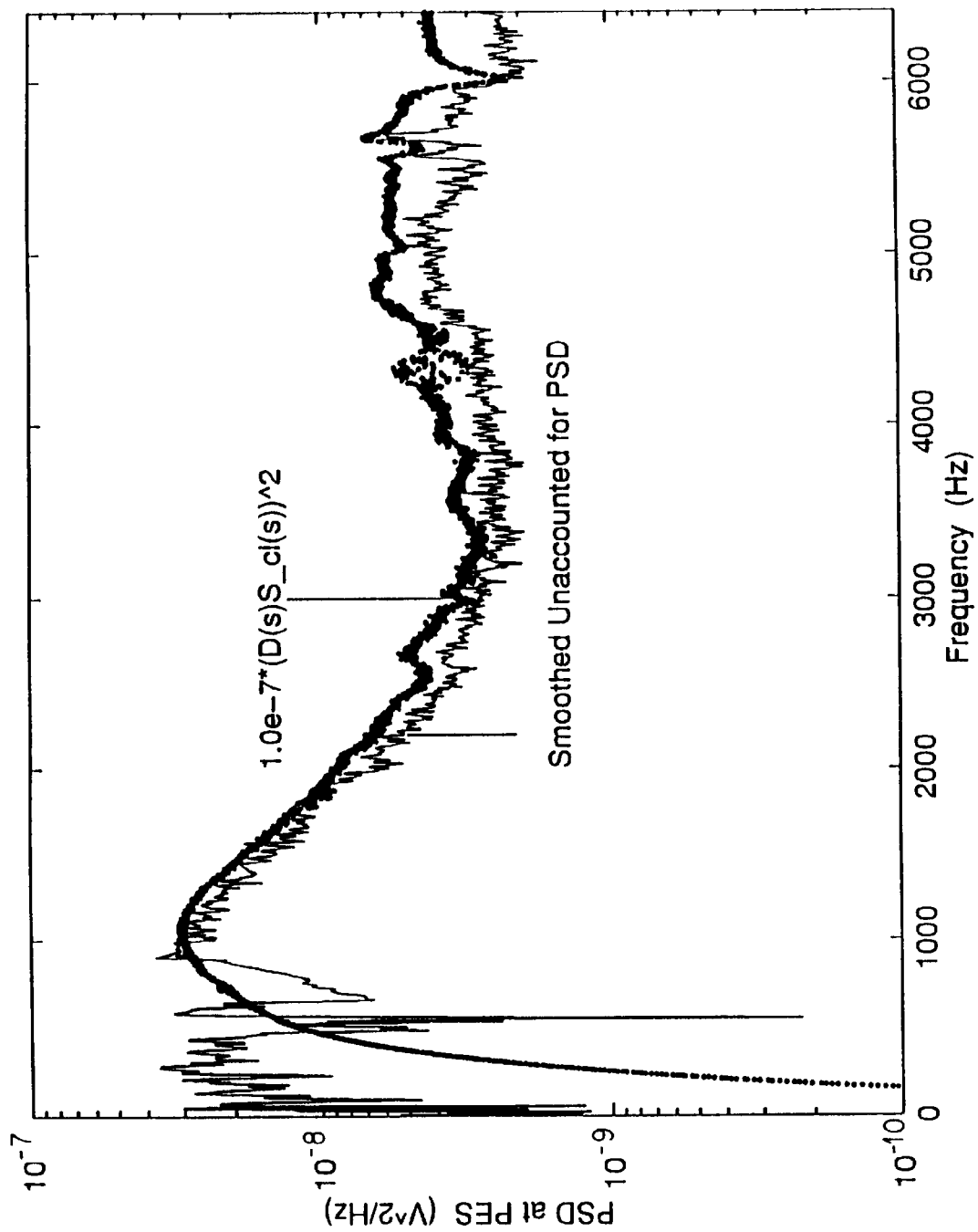
FIG. 29 shows unaccounted for noise at PES.
Figure 30:
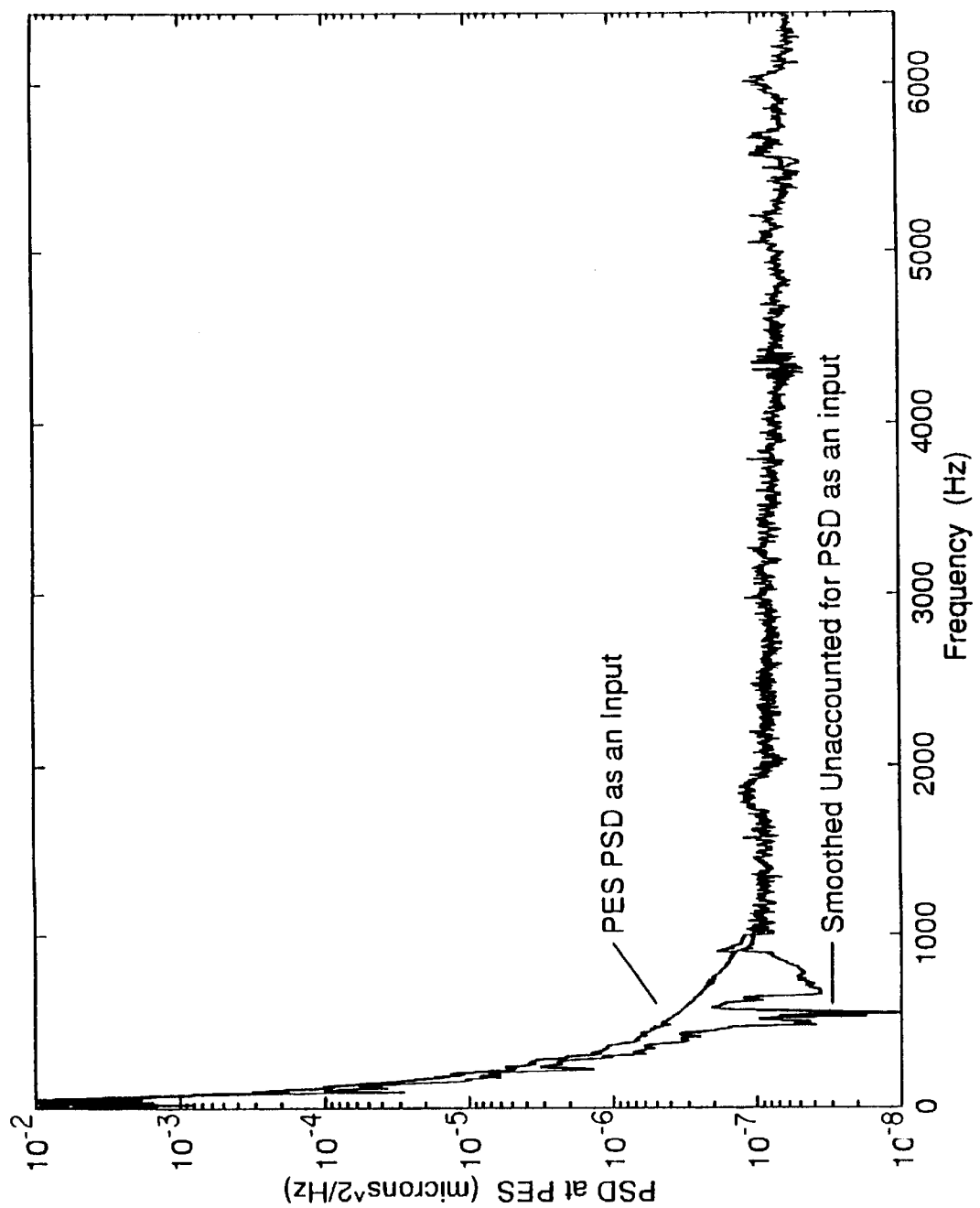
FIG. 30 shows unaccounted PES noise as an input.

Note that even though most of the potential sources shown in the small block diagram of FIG. 1, and described in detail previously, have been accounted for, there is still a significant portion of the baseline PES PSD that is unaccounted for, especially at high frequencies. This is especially obvious in the cumulative variance plot in FIGS. 28A and 28B. If one zooms in on the total baseline PES PSD and subtracts off what has been accounted for one gets a curve which very much looks like a scaled version of $$\|D(s)S_{cl}(s)\|^2 = \left\|\frac{D(s)}{1 + K_t P(s)D(s)C(s)A(s)}\right\|^2$$

as shown in FIG. 29. This suggests a noise which is injected at the reference input, and the two possibilities here for non-repeatable baseline noise are Real Time Non-Repeatable Run Out (RT NRRO) and Position Sensing Noise (PSN). By filtering the "what's left" curve back to the input by $$\left\|\frac{1}{D(s)S_{cl}(s)}\right\|^2$$

a very interesting result drops out as shown in FIG. 30. Note that there is a broadband, essentially white noise component to "what's left". There is also a large hump at low frequency. As Windage is accounted for already, the most likely source of this large hump is the actual non-repeatable motion of the disk on the rotating spindle (RT-NRRO). Likewise the broadband flat noise cannot be from the power amplifier, ADC, or DAC (because these have been eliminated) and therefore it follows that this is Position Sensing Noise. If this PSD is fed forward to PES and then integrated in frequency to yield the PES baseline variance due to PSN, this number, $\sigma_{PSN}=0.03$ μm, closely matches the prediction of the ANOVA analysis.

Extrapolations: At this point, we have made use of all of our measurements and must now do some deduction from what is left. If in fact, the PSN is white, then we can extrapolate back from the flat portion of the curve in FIG. 30. Calling this PSN, we can then subtract this value from the "what's left" input PSD to obtain the PSD of the Real Time NRRO.

Figure 31A:
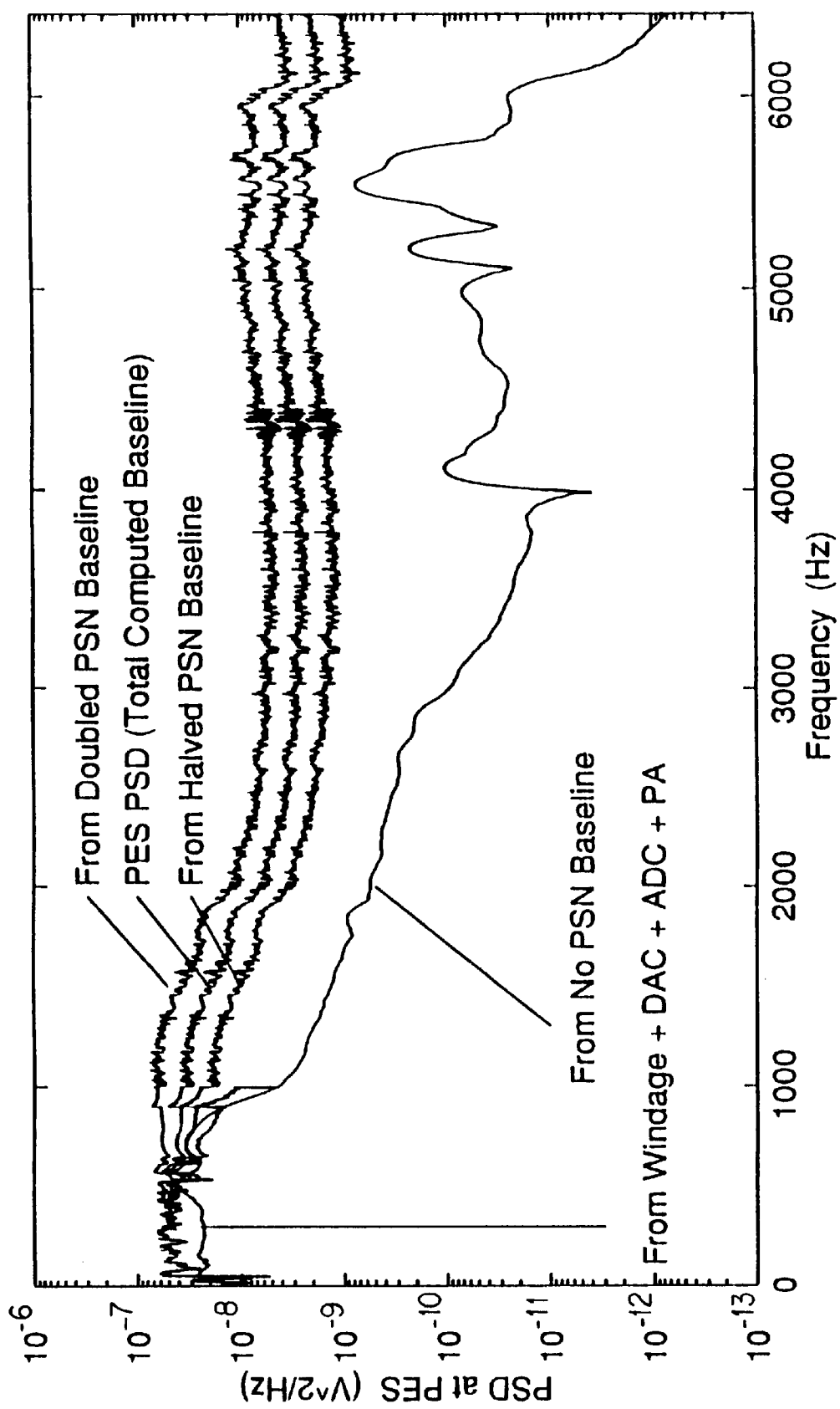
FIGS. 31A and 31B together illustrate the effect of changing baseline PSN (5400 rpm)
Figure 31B:
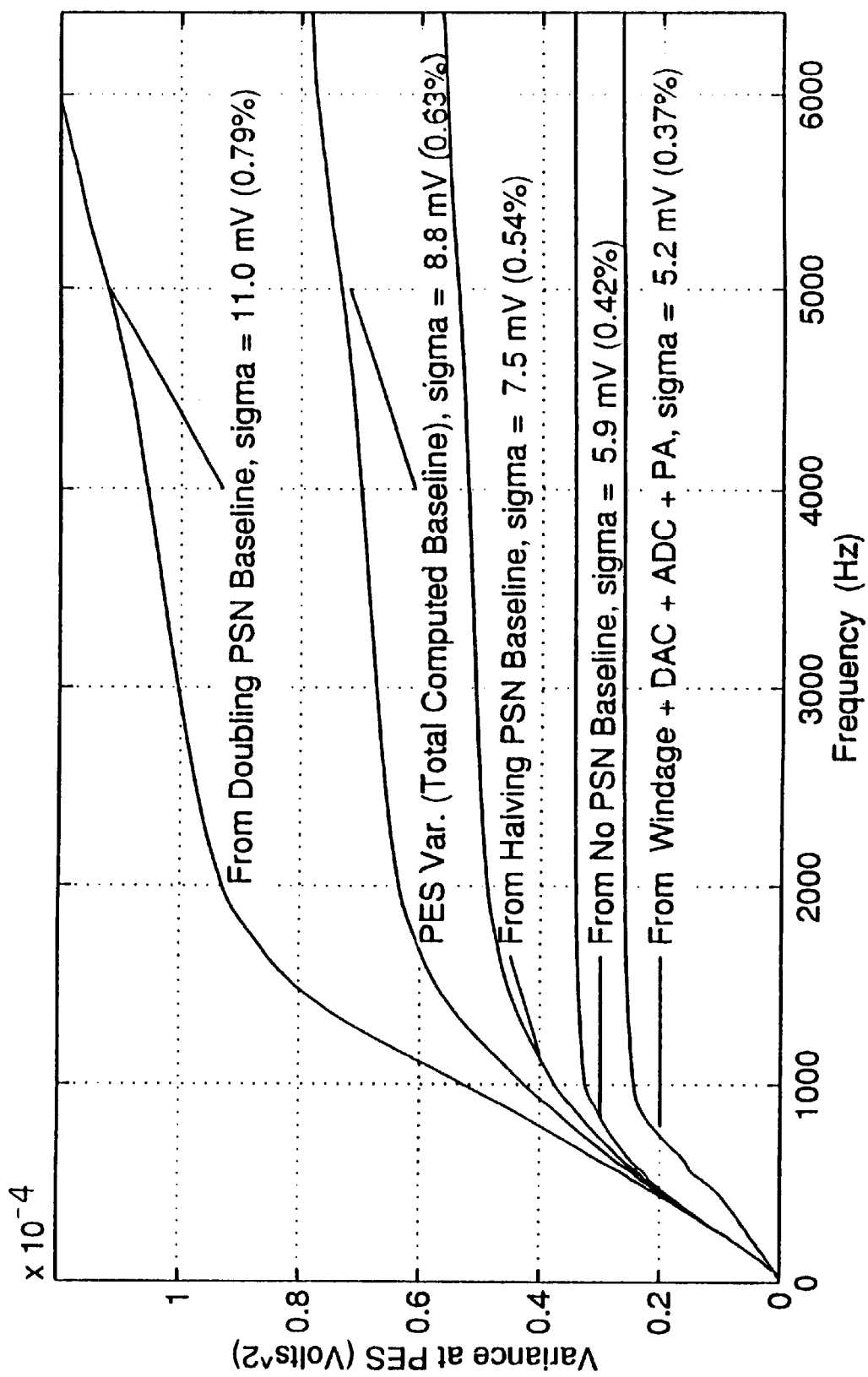

Given that we have isolated the "white" PSN input, we can now do some modeling experiments where we alter the level of the PSN to observe the effect on the overall level of baseline PES. With the spindle rotating at the nominal speed of 5400 rpm, the results are shown in FIGS. 31A and 31B.

Figure 32:
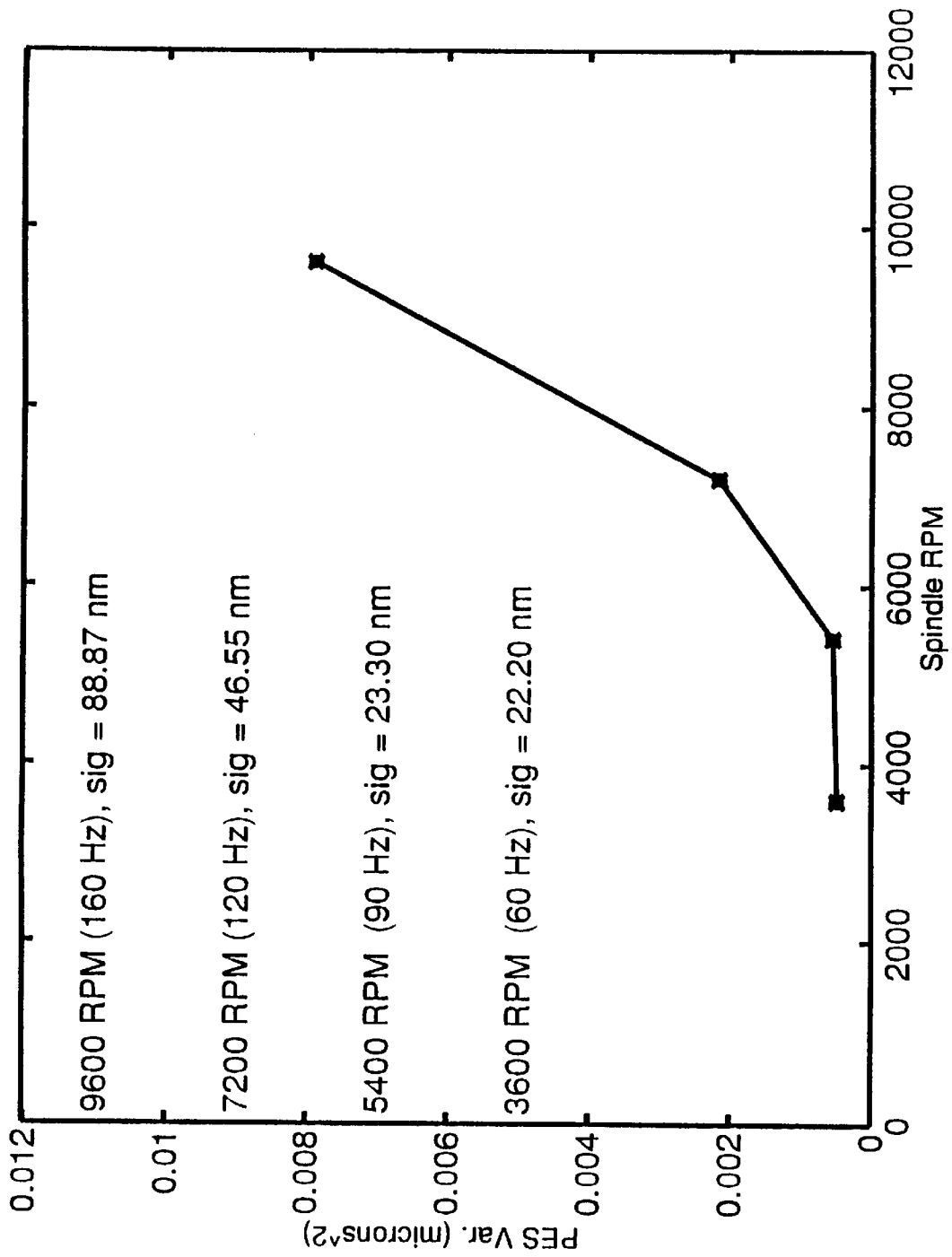
FIG. 32 illustrates PES variance due to windage vs. RPM.

Likewise, having isolated Windage's contribution allows us to examine the effect of increased windage on the overall PES baseline. As Windage was something we could actually measure, the spindle speed was adjusted using a special spindle controller board to allow measurement of Windage for spindle speeds of 3600, 5400, 7200, and 9600 RPM. The measurement results are shown in FIG. 21. The procedure for feeding these Windage PSDs back to the source and forward to PES is identical to what has been done at the nominal spindle speed of 5400 RPM. It is useful to look at the overall PES variance due to Windage with changing RPM, and this is shown in FIG. 32. Note that the increase in baseline PES variance is not linear with spindle speed, but in fact grows dramatically at the higher RPMs. This is significant as newer high performance drives spin at 7200 RPM and beyond.

Conclusions: What should be apparent now is that in this particular disk drive, there are two main sources of baseline noise in PES. The first is Windage, which is responsible for approximately one third of the total measured baseline PES variance. Windage has an effect primarily at low frequency (below 1 KHz). The second major contributor is Position Sensing Noise (PSN). PSN is flat at the input, but is shaped by the loop so that it has a rapid ramp up at low frequency and then tapers to a constant level at high frequency. However, because of the broadband nature of this noise, its effect dominates the higher frequencies (above 1 kHz).

Furthermore, these noises are tied together through the loop behavior in a way described by Bode's Integral Theorem. Any attempt to drive down the PES variance caused by Windage through increased loop bandwidth results in an amplification of PSN by the loop. Minimizing the bandwidth so as not to amplify PSN probably means that the Windage is not adequately attenuated. The situation only gets worse as the spindle RPM goes up, driving up the level of Windage and therefore requiring more loop bandwidth. This greater bandwidth must increase the amplification of PSN.

In this context, it becomes clear that two distinct efforts will yield a lower baseline PSD for PES. The first effort is to carefully study the wind flow within a disk drive to find ways to minimize the level of Windage noise. This is a nontrivial task involving the study of turbulent air flows (see, H. Suzuki and J. A. C. Humphrey, "Flow past Large Obstructions Between Corotating Disks in Fixed Cylindrical Enclosures," in Proceedings of the ASME IMECE Conference, Atlanta, Ga., ASME, August 1996). The second effort is to find ways to minimize PSN. This can be accomplished via improving the readback process or the demodulation process (or both). Research is currently being done on the latter (see, A. H. Sacks, "Position Signal Generation in Magnetic Disk Drives," ph.d. thesis, Carnegie Mellon University, DSSC, Department of Electrical and Computer Engineering, Carnegie Mellon University, Pittsburg, Pa. 15213-3890, Sep. 5, 1995; P. Mathur, "Position Signal Generation on Magnetic Disc Drives," Ph.D. Thesis Proposal at CMU, May 1996). It is possible that the best answer might require an entirely new position sensing method. Recognizing the significant effect that PSN has on overall baseline PES allows us to justify such an effort.

Extensions

The invention is not limited to the analysis of magnetic disk drives. It can be readily applied to the analysis of position error signals in optical disk drives and tape drives, as well as any other moving storage medium or servo loop.

In the case of optical disk drives, there are several servo loops. However, the principle high bandwidth ones are the focus and fine tracking loops. The coarse tracking loop is often simply following the average behavior of the fine tracking loop and its behavior is typically fairly simple in track following mode.

Figure 33A:
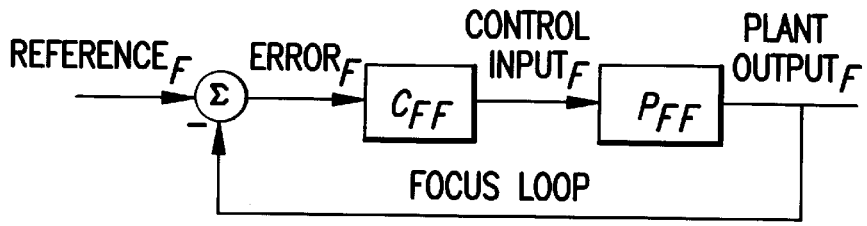
FIGS. 33A and 33B together illustrate focus and tracking as separate 2 Single-Input, Single-Output (SISO) systems.
Figure 33B:
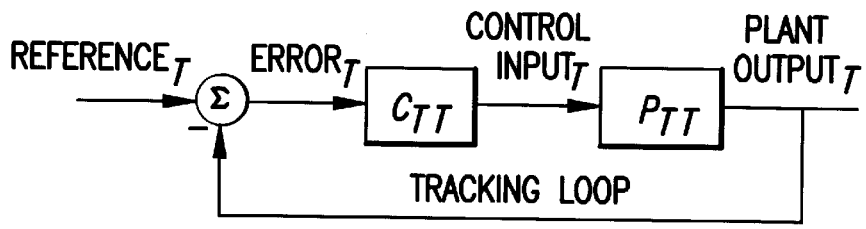
Figure 34:
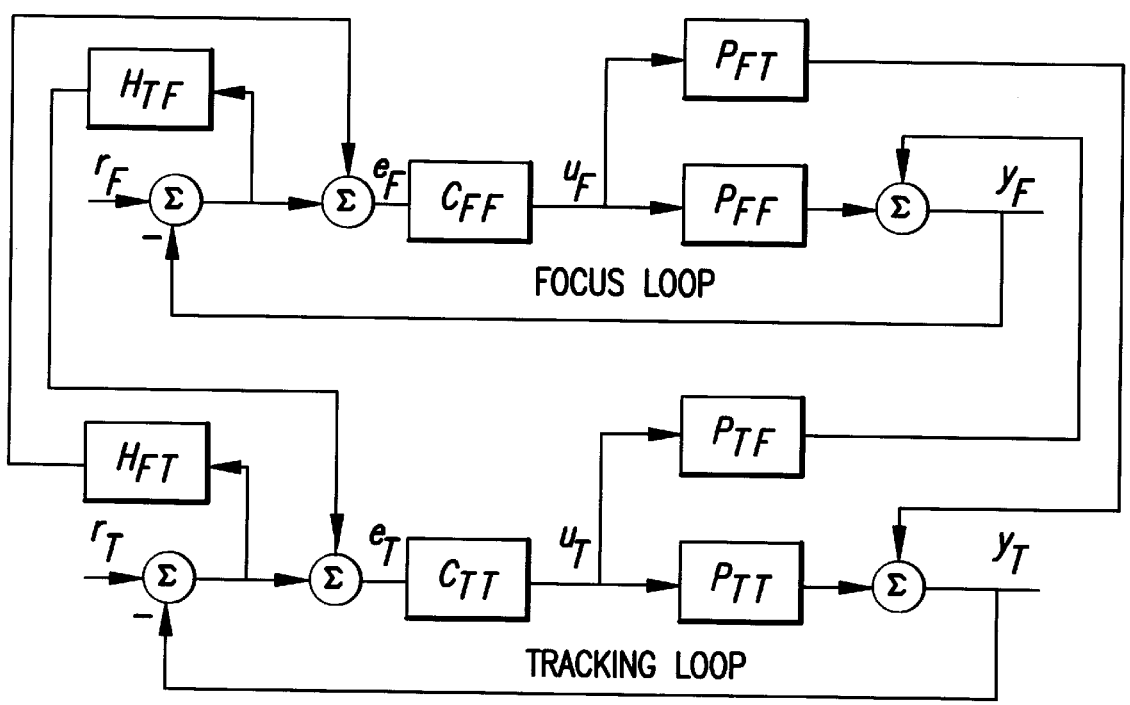
FIG. 34 illustrates SISO control loops with cross coupling added.
Figure 35:
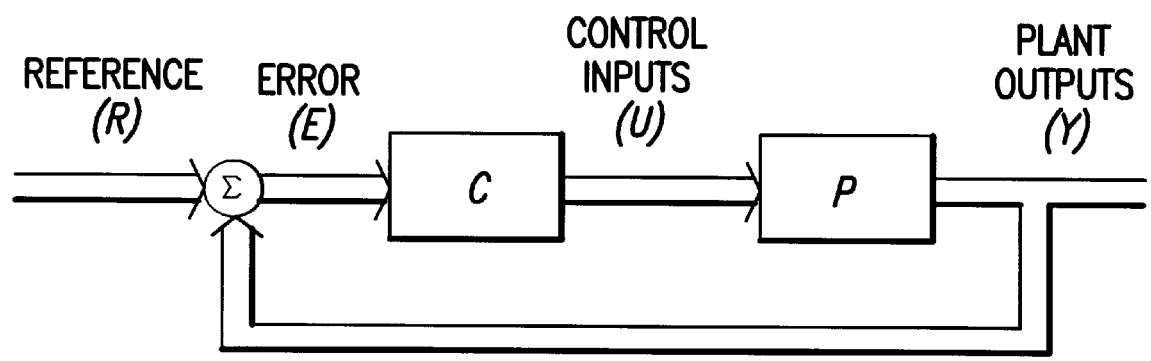
FIG. 35 shows how MIMO analysis is simplified by using vector signals and matrix transfer functions.

A simplified view of focus and tracking loops as they are typically analyzed in the current art is shown in FIGS. 33A and 33B. In this view, the focus and fine tracking systems are seen as decoupled. In general; however, the focus and fine tracking loops are coupled as shown in FIG. 34. If this coupling were strong, then it would be necessary to use a multivariable approach as shown in FIG. 35, where the thick lines depict a vector of signals and the system model is a multi-input, multi-output object.

However, in typical applications the coupling is weak and can be considered parasitic. Thus, it is common to consider the focus and tracking systems as single-input, single-output systems, with the coupling entering as a disturbance to the nominal behavior. Thus, the isolated focus control loop is shown diagrammatically with more detail in FIG. 36 while the isolated fine tracking control loop is shown diagrammatically in FIG. 37.

As done with the servo loop for the magnetic disk drive (FIG. 1), we make use of the above system maps to guide our analysis of FES and TES.

Figure 36:
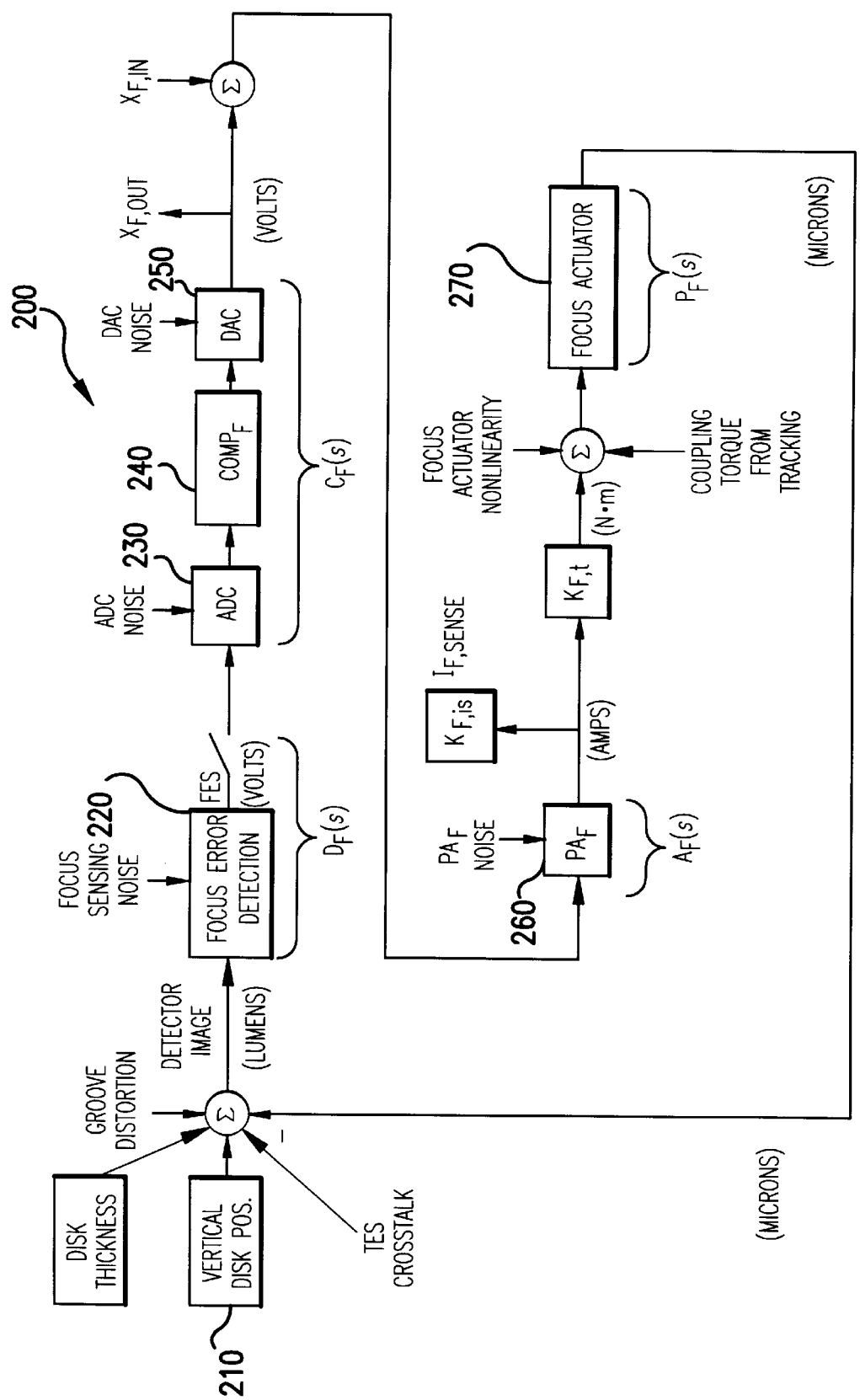
FIG. 36 illustrates a focus error signal model block diagram for an optical disk drive.

For FES, the block diagram in FIG. 36 will serve as the map for our tour of noises in the system 200. Starting at the left of this diagram, the reference position that the focus actuator must follow is the vertical position 210 of the optical surface of the disk, turning on a spindle. Only the focus error—the difference between the nominal focus point and the measured focus point are available. This is detected using one of several available Focus Error Detection 220 methods, each of which has its own level of Focus Sensing Noise and susceptibility to crosstalk from TES, groove distortion, and disk thickness. The detected FES signal is then sampled and converted to a digital format via an analog to digital converter 230 (ADC), filtered by the compensator 240 and then sent back out to the power amplifier 260 via a digital to analog converter 250 (DAC). The power amp 260 converts the desired voltage into a current to drive the voice coil actuator for the focus motor (with torque constant $K_{F,t}$). The actuator itself is subject to coupling from the torque applied to maintain track position and to nonlinear behaviors. The nominal dynamics of the actuator are encompassed in the Focus Actuator block 270 and the position of this actuator relative to the disk position is what determines the true focus error. The reading of this error is subject to distortions caused by disk thickness variations, groove distortions, and Focus Sensing Noise.

Figure 37:
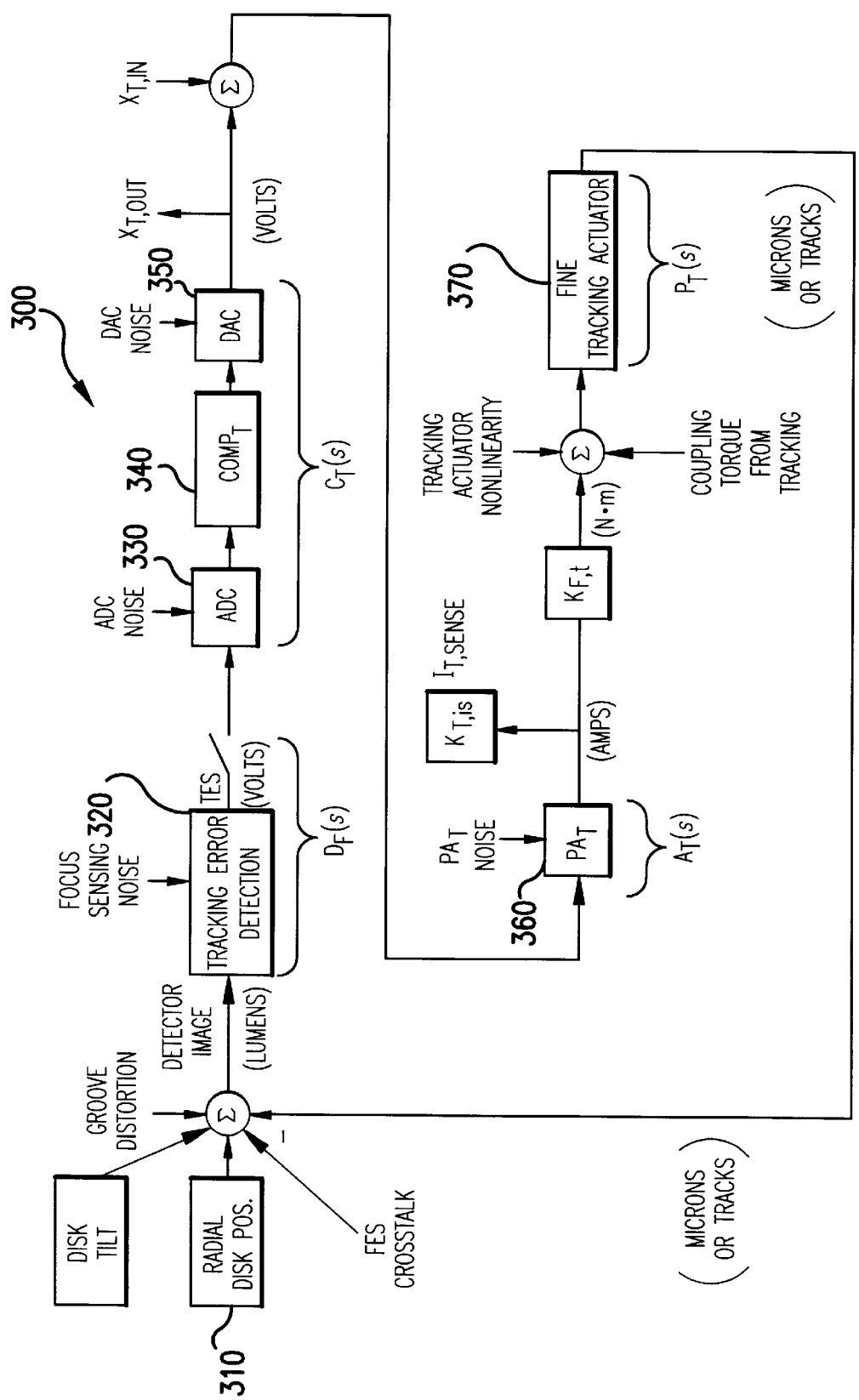
FIG. 37 illustrates a tracking error signal model block diagram for an optical disk drive.

For TES, the block diagram in FIG. 37 will serve as the map for our tour of noises in the system 300. Starting at the left of this diagram, the reference position that the tracking actuator must follow is the radial position 310 of the data track at the recording surface of the disk, turning on a spindle. Only the tracking error—the difference between the nominal track center point and the measured tracking point is available. This is detected using one of several available Tracking Error Detection 320 methods, each of which has its own level of Track Sensing Noise and susceptibility to crosstalk from FES, groove distortion, and disk tilt. The detected TES signal is then sampled and converted to a digital format via an analog to digital converter 330 (ADC), filtered by the compensator 340 and then sent back out to the power amplifier 360 via a digital to analog converter 350 (DAC). The power amp 360 converts the desired voltage into a current to drive the voice coil actuator for the focus motor (with torque constant $K_{T,t}$). The actuator itself is subject to coupling from the torque applied to maintain track position and to nonlinear behaviors. The nominal dynamics of the actuator are encompassed in the Fine Tracking Actuator block 370 and the position of this actuator relative to the track center on the disk is what determines the true tracking error. The reading of this error is subject to distortions caused by disk tilt variations, groove distortions, and Track Sensing Noise.

It should be clear from these two figures that the invention can be readily applied to the optical disk drive control problem. This would allow for focus error signal and tracking error signal measurements across a variety of laser, lens, media, or groove designs. As this area is currently in considerable flux, such a systematic method would allow companies, consortia, and standards committees to find improved solutions. This means that this invention can be a critical piece of optical drive design.

In the overall sense, the method allows for the building of better storage devices by systematically categorizing the sources and effects of broadband noise. To recap, this method does so by allowing for several possibilities:

a) By forward filtering the individual noise sources to the position error signal(s) (PES, FES, or TES) a strata of noise sources is generated which clearly indicates the most relevant sources.

b) By having backwards filtered the isolated measurements to the point where the noise source enters the loop, we have the ability to extrapolate the effects of individual optimizations. Thus, the effects of a higher resolution ADC or a cleaner power amplifier can be modeled.

c) Other modeling methods can be used which show the projected size of an individual noise component. This new projected size (modeled as a PSD) can then be fed from the noise injection point around the loop to give a projected measure of the position error signal.

d) This allows intelligent choices to be made between different designs. In the case of magnetic drives, an awareness that windage and position sensing noise were the key components to PES would (and did) prompt efforts to clean up the air flow in the drive and to improve the servo demodulation. In the optical world such a method would allow for focus error signal and tracking error signal measurements across a variety of laser, lens, media, or groove designs. As this area is currently in considerable flux, such a systematic method would allow companies, consortia, and standards committees to find improved solutions.

The method allows the user to identify and rank the most critical noise sources in the positioning mechanism of a drive. This allows for optimization of the drive positioning control loop(s) by suitable design choices. Such choices may include—but are not limited to—optimization of the position encoding on the data storage surface (such as groove dimensions in an optical drive), optimization of the position signal detection method (such as the demodulation method on a magnetic disk or tape drive), and optimization of the actuator design. Such optimization is far more difficult without this invention as it is more difficult to identify which optimizations are most helpful.

The method has been described as looking at the cumulative sums of PSDs at the PES signal (for magnetic drives) or FES and TES signals (for optical drives). However, it is not limited to such. In fact any signal point in the loop can be used for such purposes.

The method has been described using Power Spectral Densities (PSDs). However, it is not limited to such. The same information could be obtained by measuring the power spectrums of the signals. (A power spectrum is equivalent to the integral along the frequency axis of the PSD.)

The many features and advantages of the invention are apparent from the written description and thus it is intended by the appended claims to cover all such features and advantages of the invention. Further, because numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An apparatus for measuring noise of a data storage device, the apparatus comprising:

means for isolating a measurement of an individual noise source;

means for filtering the measurement backwards to obtain a measure of the noise source at its input; and means for filtering a selected one of the measurement and a source measure forwards to obtain the effect of this particular noise on the measure at some identified point in a loop.

2. The apparatus as set forth in claim 1, comprising means for comparing the measures to each other at the identified point in the loop.

3. The apparatus as set forth in claim 1, comprising means for obtaining a cumulative measure based on the individual measures at the identified point in the loop.

4. The apparatus as set forth in claim 1, wherein the measures are computed as Power Spectral Densities (PSDs) of the signals.

5. The apparatus as set forth in claim 1, wherein the measures are computed as power spectrums of the signals.

6. The apparatus as set forth in claim 1, wherein the identified point in the loop is the Position Error Signal.

7. The apparatus as set forth in claim 1, wherein the identified point in the loop is the Focus Error Signal (FES) of an optical disk drive.

8. The apparatus as set forth in claim 1, wherein the identified point in the loop is the Tracking Error Signal (TES) of an optical disk drive.

9. A process for measuring noise of a data storage device, the process comprising the steps of:

isolating a measurement of an individual noise source;

filtering the measurement backwards to obtain a measure of the noise source at its input; and filtering a selected one of the measurement and a source measure forwards to obtain the effect of this particular noise on the measure at some identified point in a loop.

10. The process as set forth in claim 9, comprising the step of comparing the measures to each other at the identified point in the loop.

11. The process as set forth in claim 9, comprising the step of obtaining a cumulative measure based on the individual measures at the identified point in the loop.

12. The process as set forth in claim 9, wherein the measures are computed as Power Spectral Densities (PSDs) of the signals.

13. The process as set forth in claim 9, wherein the measures are computed as power spectrums of the signals.

14. The process as set forth in claim 9, wherein the identified point in the loop is the Position Error Signal.

15. The process as set forth in claim 9, wherein the identified point in the loop is the Focus Error Signal (FES) of an optical disk drive.

16. The process as set forth in claim 9, wherein the identified point in the loop is the Tracking Error Signal (TES) of an optical disk drive.

* * * * *